United States Patent
Domino

(10) Patent No.: US 11,424,771 B2
(45) Date of Patent: *Aug. 23, 2022

(54) RADIO-FREQUENCY IMPEDANCE TUNER

(71) Applicant: SKYWORKS SOLUTIONS, INC., Irvine, CA (US)

(72) Inventor: William J. Domino, Yorba Linda, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/013,517

(22) Filed: Sep. 4, 2020

(65) Prior Publication Data

US 2021/0175913 A1 Jun. 10, 2021

Related U.S. Application Data

(63) Continuation of application No. 16/273,333, filed on Feb. 12, 2019, now Pat. No. 10,771,096.

(60) Provisional application No. 62/629,570, filed on Feb. 12, 2018.

(51) Int. Cl.
*H04B 1/04* (2006.01)
*H03H 7/40* (2006.01)
*H04B 1/18* (2006.01)
*H03H 7/38* (2006.01)

(52) U.S. Cl.
CPC ............. *H04B 1/0458* (2013.01); *H03H 7/40* (2013.01); *H04B 1/18* (2013.01); *H03H 2007/386* (2013.01)

(58) Field of Classification Search
CPC ........ H04B 1/0458; H04B 1/40; H04B 1/006; H04B 1/18; H04B 1/04; H03H 7/38; H03H 7/40; H03H 7/1758; H03H 2007/386

See application file for complete search history.

(56) References Cited

U.S. PATENT DOCUMENTS

| | | | |
|---|---|---|---|
| 2003/0100333 A1* | 5/2003 | Standke | H01Q 9/14 455/552.1 |
| 2013/0069737 A1* | 3/2013 | See | H04B 1/0458 333/32 |

* cited by examiner

*Primary Examiner* — Tuan H Nguyen
(74) *Attorney, Agent, or Firm* — Chang & Hale LLP

(57) ABSTRACT

A radio-frequency impedance tuner can include first and second nodes, a bypass path, first and second series capacitance paths, and an inductance path, with each path being implemented between the first and second nodes and including a switch configured to allow the path to couple or uncouple the first and second nodes. The tuner can further include first and second shunt paths, with each shunt path being implemented between the second node and ground and including a switch configured to allow the shunt path to couple or uncouple the second node and the ground. The tuner can further include a switchable grounding path implemented along the inductance path and configured to allow the inductance path to function as a series inductance path between the first and second nodes, or as a shunt inductance path between the ground and a node along the inductance path.

20 Claims, 51 Drawing Sheets

IMPEDANCE Z = R + jX

——— CONSTANT RESISTANCE (R) CIRCLE
- - - - - CONSTANT REACTANCE (X) ARC
·········· CONSTANT CONDUCTANCE (G) CIRCLE
—·—·— CONSTANT VSWR CIRCLE

ZONE 0 TO ZONE 0
(BYPASS)

RADIO-FREQUENCY IMPEDANCE TUNER

CROSS-REFERENCE TO RELATED APPLICATION(S)

This application is a continuation of U.S. application Ser. No. 16/273,333 filed Feb. 12, 2019, entitled ANTENNA IMPEDANCE TUNER, which claims priority to and the benefit of the filing date of U.S. Provisional Application No. 62/629,570 filed Feb. 12, 2018, entitled ANTENNA IMPEDANCE TUNER, the benefits of the filing dates of which are hereby claimed and the disclosures of which are hereby expressly incorporated by reference herein in their entirety.

BACKGROUND

Field

The present disclosure relates to antenna impedance tuning circuits and related devices and methods.

Description of the Related Art

In radio-frequency (RF) applications, power transfer is improved for a signal when impedance is matched between two components encountered by the signal. For example, when a signal is generated by a radio circuit and sent to an antenna for transmission, it is desirable to have as much of the signal's power be delivered to the antenna.

In the foregoing antenna-transmission example, the radio circuit is typically designed to maximize power transfer when the antenna provides a desired impedance. However, the antenna and/or the related antenna feedline may present an actual impedance that is significantly different than the desired impedance. In such a situation, power transmission efficiency becomes degraded.

SUMMARY

In accordance with a number of implementations, the present disclosure relates to an impedance tuner that includes a first node and a second node, a bypass path, a first series capacitance path, a second series capacitance path, and an inductance path, with each path being implemented between the first node and the second node, and including a switch configured to allow the path to couple or uncouple the first and second nodes. The impedance tuner further includes a first shunt path and a second shunt path, with each shunt path being implemented between the second node and ground, and including a switch configured to allow the shunt path to couple or uncouple the second node and the ground. The impedance tuner further includes a switchable grounding path implemented along the inductance path and configured to allow the inductance path to function as a series inductance path between the first and second nodes, or as a shunt inductance path between the ground and a node along the inductance path.

In some embodiments, each of the first and second shunt paths can be a capacitance path. Each of the first series capacitance path, the second series capacitance path, the first shunt capacitance path, and the second shunt capacitance path can include a respective capacitance element, and the inductance path can include an inductance element. Each capacitance element can be implemented as a capacitor, and the inductance element can include an inductor.

In some embodiments, the switch in each of the first series capacitance path, the second series capacitance path, and the inductance path can be implemented between the respective element and the first node, and the switch in each of the first shunt capacitance path and the second shunt capacitance path can be implemented between the respective element and the second node. The first node can be the node along the inductance path for the switchable grounding path. The switchable grounding path can include a switch and a shunt inductance element arranged in series between the first node and the ground.

In some embodiments, the switch in each of the first series capacitance path, the second series capacitance path, the first shunt capacitance path, the second shunt capacitance path, and the inductance path can be implemented between the respective element and the second node. The node along the inductance path for the switchable grounding path can be between the inductance element and the respective switch. The switchable grounding path can include a switch. In some embodiments, the switchable grounding path can be free of a shunt inductance element.

In some embodiments, the switches of the bypass path, the first series capacitance path, the second series capacitance path, the inductance path, the first shunt capacitance path, and the second shunt capacitance path can be implemented to provide a single-pole-6-throw functionality with the single pole being coupled to the second node.

In some embodiments, the capacitance element of each of the first shunt capacitance path and the second shunt capacitance path can be implemented between the respective switch and the ground.

In some embodiments, the series inductance path between the first node and the second node can be provided when the switch of the inductance path is closed and the switch of the switchable grounding path is open. In some embodiments, the shunt inductance path between the first node and the ground can be provided when the switch of the inductance path is open and the switch of the switchable grounding path is open. In some embodiments, the switch of the inductance path and the switch of the grounding path can be configured to be capable of being operated as complementary switches.

In some embodiments, the switch of the bypass path can be S1, the switch of the first series capacitance path can be S2, the switch of the second series capacitance path can be S3, the switch of the inductance path can be S4, the switch of the grounding path can be S5, the switch of the first shunt capacitance path can be S6, and the switch of the second shunt capacitance path can be S7. The switches S1 to S7 can be configured to be capable of introducing zero, one or two elements between the first and second nodes to provide a bypass functionality or an impedance transformation functionality, with each element being a capacitance element or an inductance element.

In some embodiments, the impedance transformation state can be one of a plurality of impedance transformations, with each being from an initial impedance to a desired impedance. Each of the initial impedances can be within a respective impedance zone having a center impedance value on a constant voltage standing wave ratio circle on a Smith chart, and the desired impedance can include a matched impedance at the center of the Smith chart. The constant voltage standing wave ratio can have a normalized value that is greater than or equal to 3.

In some embodiments, the plurality of impedance transformations can include six impedance transformations distributed along the constant voltage standing wave ratio circle on the Smith chart. The center of the first zone can be on a point on the Smith chart where a constant resistance circle having the same normalized value as the constant voltage standing wave ratio circle crosses a horizontal line passing through the center of the Smith chart and representative of a zero reactance line. The centers of the second to sixth zones can be on points along the constant voltage standing wave ratio circle and at successive increments of 60 degrees about the center of the Smith chart and from the horizontal line. The first impedance transformation functionality can include each of S4 and S6 being ON, and the other switches being OFF, such that the inductance element and the first shunt capacitance element provide a two-element impedance transformation. The second impedance transformation can include S2 being ON, and the other switches being OFF, such that the first series capacitance element provides a one-element impedance transformation. The third impedance transformation can include each of S1, S6 and S7 being ON, and the other switches being OFF, such that the first shunt capacitance element the second shunt capacitance element provide a two-element impedance transformation. The fourth impedance transformation can include each of S2, S3 and S5 being ON, and the other switches being OFF, such that the inductance element and a parallel combination of the first and second series capacitance elements provide a two-element impedance transformation. The fifth impedance transformation can include each of S1 and S5 being ON, and the other switches being OFF, such that the inductance element provides a one-element impedance transformation. The sixth impedance transformation can include S4 being ON, and the other switches being OFF, such that the inductance element provides a one-element impedance transformation.

In some embodiments, the bypass functionality can include S1 being ON and all of the other switches being OFF, such that the bypass path connects the first and second nodes. In some embodiments, the bypass functionality can include each of S1 and S4 being ON and all of the other switches being OFF, such that a parallel combination of the bypass path and the inductance path connects the first and second nodes.

In some embodiments, the impedance tuner can further include an electrostatic discharge inductance element implemented between the second node and the ground. The electrostatic discharge inductance element can have an inductance value selected to tune out an off-capacitance effect resulting from OFF switches associated with the bypass functionality.

In some embodiments, the first node can be a signal node for a radio circuit, and the second node can be an antenna node. The signal node can have a matched impedance, and the antenna node can be susceptible to a mismatched impedance.

In some embodiments, the first shunt path can be a capacitance path and the second shunt path can be an inductance path.

In some implementations, the present disclosure relates to a semiconductor die that includes a substrate and an impedance tuner circuit implemented on the substrate. The impedance tuner circuit includes a first node and a second node, a bypass path, a first series capacitance path, a second series capacitance path, and an inductance path, with each path being implemented between the first node and the second node, and including a switch configured to allow the path to couple or uncouple the first and second nodes. The impedance tuner circuit further includes a first shunt path and a second shunt path, with each shunt path being implemented between the second node and ground, and including a switch configured to allow the shunt path to couple or uncouple the second node and the ground. The impedance tuner circuit further includes a switchable grounding path implemented along the inductance path and configured to allow the inductance path to function as a series inductance path between the first and second nodes, or as a shunt inductance path between the ground and a node along the inductance path.

In some embodiments, the substrate can include a silicon-on-insulator substrate.

In a number of teachings, the present disclosure relates to a packaged module that includes a packaging substrate configured to receive and support a plurality of components, and an impedance tuner circuit implemented on the packaging substrate. The impedance tuner circuit includes a first node and a second node, a bypass path, a first series capacitance path, a second series capacitance path, and an inductance path, with each path being implemented between the first node and the second node, and including a switch configured to allow the path to couple or uncouple the first and second nodes. The impedance tuner circuit further includes a first shunt path and a second shunt path, with each shunt path being implemented between the second node and ground, and including a switch configured to allow the shunt path to couple or uncouple the second node and the ground. The impedance tuner circuit further includes a switchable grounding path implemented along the inductance path and configured to allow the inductance path to function as a series inductance path between the first and second nodes, or as a shunt inductance path between the ground and a node along the inductance path.

In some embodiments, all of the impedance tuner circuit can be implemented on a single semiconductor die.

In some embodiments, each of the first series capacitance path, the second series capacitance path, the first shunt capacitance path, and the second shunt capacitance path can include a respective capacitance element, and the inductance path can include an inductance element. Each capacitance element can be implemented as a capacitor, and the inductance element can include an inductor.

In some embodiments, all of the switches associated with the impedance tuner circuit can be implemented on a semiconductor die such as a silicon-on-insulator die. In some embodiments, the semiconductor die can further include all of the capacitors associated with the impedance tuner circuit. In some embodiments, each of the capacitors associated with the impedance tuner circuit can be implemented as a metal-insulator-metal capacitor. In some embodiments, each of one or more inductors associated with the impedance tuner circuit can be implemented off of the semiconductor die.

In some embodiments, each of the capacitors and each of one or more inductors associated with the impedance tuner circuit can be implemented off of the semiconductor die.

In some implementations, the present disclosure relates to a wireless device that includes a radio circuit, an antenna, and an impedance tuner implemented between the radio circuit and the antenna. The impedance tuner includes a first node and a second node, a bypass path, a first series capacitance path, a second series capacitance path, and an inductance path, with each path being implemented between the first node and the second node, and including a switch configured to allow the path to couple or uncouple the first and second nodes. The impedance tuner further includes a first shunt path and a second shunt path, with each shunt path being implemented between the second node and ground, and including a switch configured to allow the shunt path to couple or uncouple the second node and the ground. The impedance tuner further includes a switchable grounding path implemented along the inductance path and configured to allow the inductance path to function as a series inductance path between the first and second nodes, or as a shunt inductance path between the ground and a node along the inductance path.

In some embodiments, the impedance tuner can be configured to adjust an impedance state of the antenna to a tuned impedance state associated with the radio circuit. In some embodiments, the antenna can be configured to support a transmit operation, and the radio circuit can include a transmitter circuit. In some embodiments, the antenna can be configured to support a receive operation, and the radio circuit can include a receiver circuit.

In some embodiments, the antenna and the radio circuit can be configured to support operations involving one or more cellular frequency bands. In some embodiments, the antenna and the radio circuit can be configured to support operations involving one or more wireless local area network frequency bands.

In some implementations, the present disclosure relates to an impedance tuner that includes a first node and a second node, and an inductance circuit having an inductor and a first switch connected in series such that the inductor is connected to the first node and the first switch is connected to the second node. The inductance circuit further includes a second switch implemented between ground and a third node between the inductor and the first switch, such that the inductance circuit is capable of providing a series inductance path between the first and second nodes or a shunt inductance path between the third node and the ground.

In some embodiments, the impedance tuner can further include a switchable bypass circuit implemented between the first and second nodes. In some embodiments, the inductance circuit and the switchable bypass circuit can be configured to provide a bypass path by enabling the bypass circuit. In some embodiments, the inductance circuit and the switchable bypass circuit can be configured to provide the bypass path by further enabling the series inductance path.

In some embodiments, the impedance tuner can further include a first switchable capacitance circuit implemented between the first and second nodes and configured to be capable of providing a plurality of capacitance values between the first and second nodes. In some embodiments, the impedance tuner can further include a second switchable capacitance circuit implemented between the second node and the ground and configured to be capable of providing one or more capacitance values between the second node and the ground.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In wireless devices such as mobile units, an impedance presented by an antenna to a radio circuit can vary with, for example, environmental changes. To maintain the best or acceptable impedance match between the radio circuit and the antenna, an impedance tuner can be implemented. Such an impedance tuner, typically inserted between the radio circuit and the antenna, can include a tunable inductor-capacitor (LC) network and be adjusted as needed when a mismatch in impedance is detected.

In many applications, such impedance circuits can be costly and/or be limited in tuning range capability. For example, in some embodiments, a tuner can include a single switchable element, either in series or in shunt relative to a signal path, resulting in two impedance tuning states.

In another example, a complex PI-network can be implemented using multiple inductors and multiple tunable capacitors (e.g., each tunable capacitor can include four binary-weighted capacitors switched to provide 16 possible capacitance values). Such a tuner can cover most of impedance regions in a Smith chart. However, such a tuner is typically overly complex and/or costly.

Figure 1:
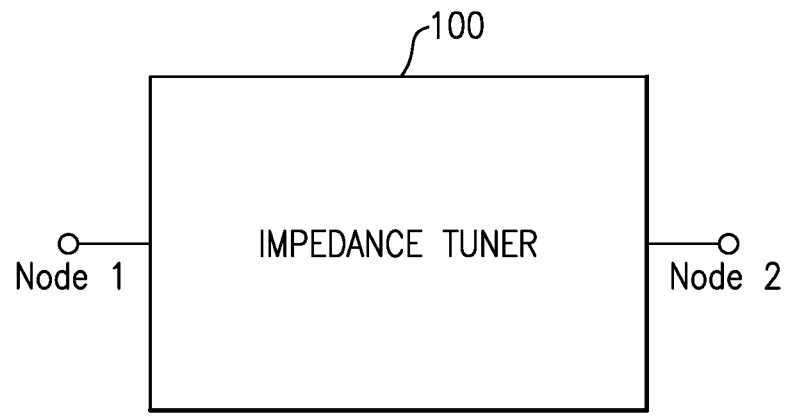
FIG. 1 depicts an impedance tuner having one or more features as described herein.

FIG. 1 depicts an impedance tuner 100 having one or more features as described herein. Such an impedance tuner can be implemented between a first node (Node 1) and a second node (Node 2), and be configured to provide tunable matching of impedance between the first and second nodes. For example, suppose that an impedance presented at the second node (e.g., by a load connected to the second node) is different from a desired impedance for which a signal is provided to the first node (e.g., from a circuit). If the impedance tuner 100 is absent, the first and second nodes are essentially the same, and the signal will be presented with the mismatched impedance of the load at the first node. With the impedance tuner 100 implemented between the first and second nodes, the impedance tuner 100 can change the mismatched impedance of the load, so that an impedance presented to the signal at the first node is at the desired impedance, approximately at the desired impedance, or closer to the desired impedance.

For the purpose of description, an impedance tuner such as the impedance tuner 100 of FIG. 1 may also be referred to herein as, for example, an impedance tuner circuit, an impedance tuning circuit, a tuner circuit, a tuning circuit, a tuner, etc.

Figure 2:
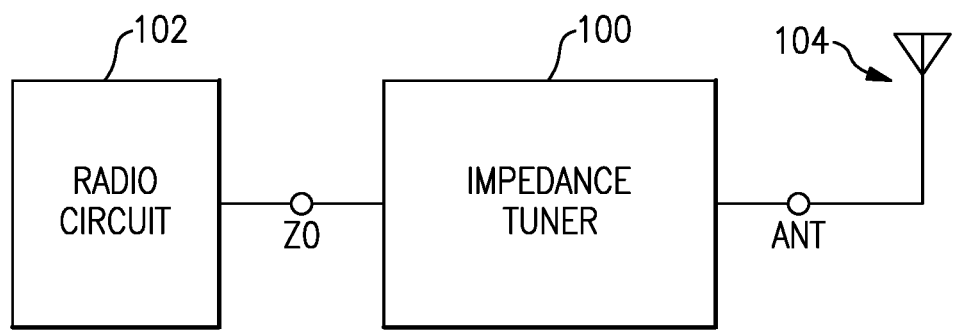
FIG. 2 shows that in some embodiments, the impedance tuner of FIG. 1 can be utilized as an impedance tuner implemented between a radio circuit and an antenna.

FIG. 2 shows that in some embodiments, the impedance tuner 100 of FIG. 1 can be utilized as an impedance tuner 100 implemented between a radio circuit 102 and an antenna 104. For the purpose of description, it is assumed that the radio circuit 102 operates with a source impedance (e.g. Z0=50 ohms), and the antenna 104 presents a load impedance at an antenna node (ANT); and such a load impedance of the antenna 104 can vary (e.g., due to environmental factor(s)). For the purpose of description, it will be assumed that the load impedance presented at the antenna node (ANT) may or may not include a contribution from, for example, an antenna feedline.

Referring to FIG. 2, the impedance tuner 100 can be implemented to match the load impedance of the antenna 104 to the source impedance Z0 or move the load impedance closer to the source impedance, so as to maximize or improve the power transfer between the radio circuit 102 and the antenna 104. For example, a power amplified radio-frequency (RF) signal can be generated by the radio circuit 102 for transmission through the antenna 104, and power transferred from the radio circuit 102 to the antenna 104 can be desirably maximized or increased when the load impedance of the antenna (ANT) is matched with or is closer to the source impedance Z0 of the radio circuit 102. In another example, a signal received through the antenna (ANT) can be efficiently transferred to the radio circuit 102 for processing, when the impedance of the antenna (ANT) is matched with or is closer to the impedance Z0 of the radio circuit 102.

Figure 3:
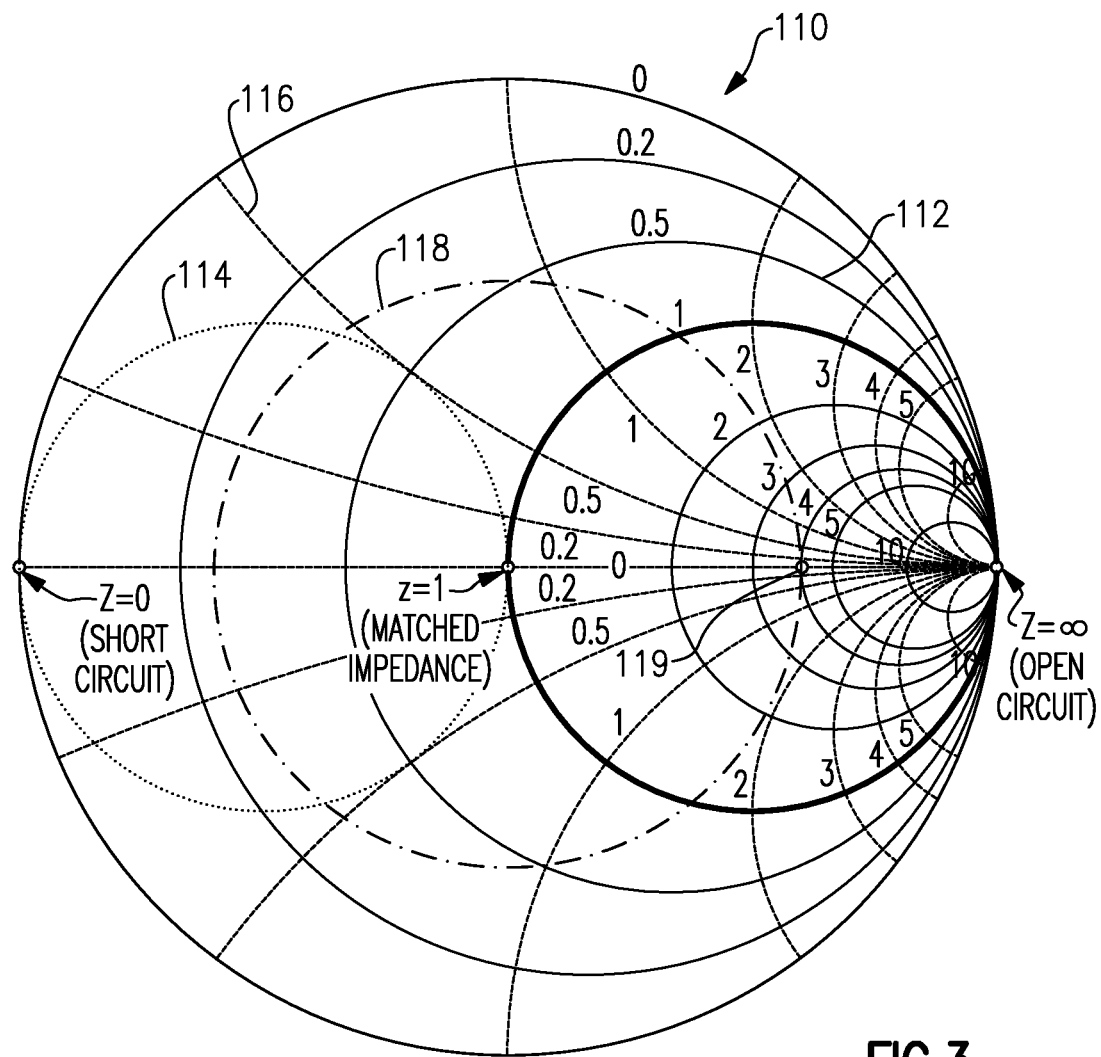
FIG. 3 shows a normalized Smith chart that provides a visual representation of an impedance Z=R+jX, where R is resistance and X is reactance.

FIG. 3 shows a normalized Smith chart 110 that provides a visual representation of an impedance Z=R+jX, where R is resistance and X is reactance. A horizontal line segment is shown to bisect the outermost circle, with the left end of the horizontal line segment representing a short circuit (Z=0) state, and the right end of the horizontal line segment representing an open circuit (Z=∞) state. The mid-point of the horizontal line segment (and thus the center of the outermost circle) represents a matched impedance state. Such a matched impedance state has a value of Z=1 in the normalized representation. In an un-normalized representation, such a matched impedance state can have a value of, for example, Z=50 ohms.

The solid-line circles are constant-resistance circles 112 at example normalized values. For example, the outermost circle referenced above has a constant-resistance value of 0, and the successively smaller circles have constant-resistance values of 0.2, 0.5, 1, 2, 3, 4, 5 and 10. All of such constant-resistance circles share their right-most points at the right end of the above-referenced horizontal line segment (open circuit state).

In the normalized Smith chart 100 of FIG. 3, dash-line arcs are constant-reactance arcs 116 at example normalized values. For example, the above-referenced horizontal line segment (an arc of an infinite-radius circle) has a constant-reactance value of 0, and the successively smaller-radius-circle arcs have constant-reactance values of 0.2, 0.5, 1, 2, 3, 4, 5 and 10. Such constant-reactance arcs can be provided above and below the horizontal line segment. For the arcs above the horizontal line segment, the arcs share their lower-most points at the right end of the horizontal line segment (open circuit state). For the arcs below the horizontal line segment, the arcs share their upper-most points at the right end of the horizontal line segment (open circuit state).

In the normalized Smith chart 100 of FIG. 3, constant-conductance (G=1/R) circles (e.g., dotted circle 114) can also be provided similar to the constant-resistance circles, except that such constant-conductance circles share their left-most points at the left end of the above-referenced horizontal line segment (short circuit state). In FIG. 3, an example conductance circle is shown to have a normalized conductance value of 1.

In the normalized Smith chart 100 of FIG. 3, a constant-VSWR (voltage standing wave ratio) circle can be provided with a circle having its center at the matched-impedance point (Z=1). The right-most point of such a circle is on the above-referenced horizontal line segment, and the value of the constant-resistance circle intersecting such a point represents the constant VSWR value. For example, a dash-dot circle 118 intersects the horizontal line segment at a point together with the constant-resistance circle having a normalized value of 4. Thus, the constant-VSWR circle 118 has a normalized VSWR value of 4.

Figure 4:
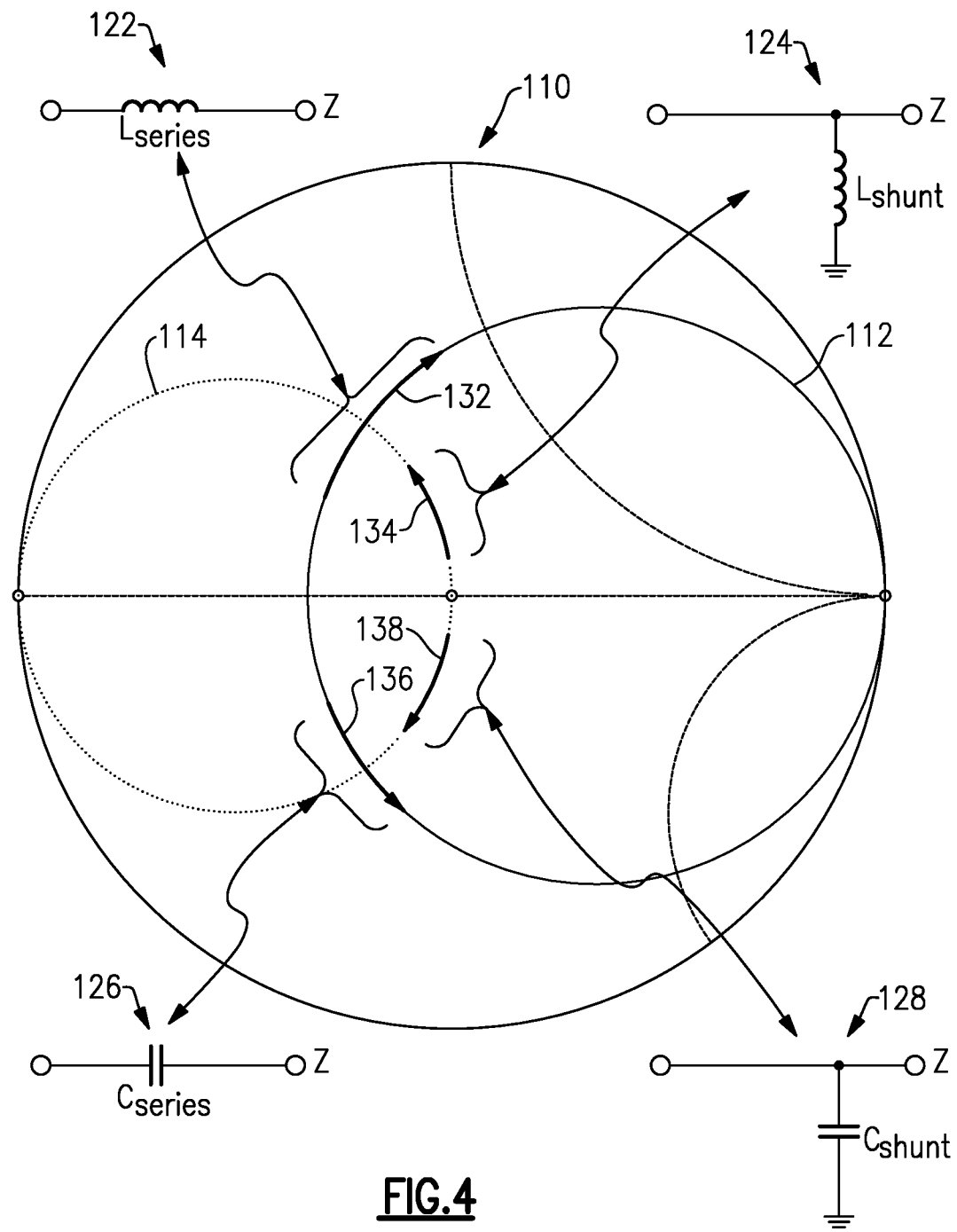
FIG. 4 shows a Smith chart that is similar to the example of FIG. 3, but with many of the constant-resistance circles and constant-reactance arcs removed for clarity.

FIG. 4 shows a Smith chart 110 that is similar to the example of FIG. 3, but with many of the constant-resistance circles and constant-reactance arcs removed for clarity. Referring to FIG. 4, suppose that at a given node of a signal path, a particular impedance (Z=R+jX) is presented. When an inductance (e.g., an inductor) or a capacitance (e.g., a capacitor) is introduced relative to the node, such an element results in the impedance to change along a constant-resistance circle or a constant-conductance circle.

For example, an introduction of a series inductance ($L_{series}$) 122 along the signal path has a tendency to change the impedance at the node from the original state (e.g., at the tail of an arc-arrow 132 on a constant-resistance circle 112) to another state at the tip of the arc-arrow 132 on the constant-resistance circle 112. Thus, $Z_{initial}=R_{constant}+jX_{initial}$, and $Z_{final}=R_{constant}+jX_{final}$, such that the change of Z along the constant-resistance circle is in the clockwise direction in the example Smith chart 110 of FIG. 4.

In another example, an introduction of a series capacitance ($C_{series}$) 126 along the signal path has a tendency to change the impedance at the node from the original state (e.g., at the tail of an arc-arrow 136 on a constant-resistance circle 112) to another state at the tip of the arc-arrow 136 on the constant-resistance circle 112. Thus, $Z_{initial}=R_{constant}+jX_{initial}$, and $Z_{final}=R_{constant}+jX_{final}$, such that the change of Z along the constant-resistance circle is in the counter-clockwise direction in the example Smith chart 110 of FIG. 4. It is noted that the series capacitance example is depicted on the same constant-resistance circle as the series inductance example for illustration purpose; however, it will be understood that initial impedances of the two examples may or may not be the same.

In yet another example, an introduction of a shunt inductance ($L_{shunt}$) 124 along the signal path has a tendency to change the impedance at the node from the original state (e.g., at the tail of an arc-arrow 134 on a constant-conductance circle 114) to another state at the tip of the arc-arrow 134 on the constant-conductance circle 114. Thus, in terms of admittance Y=G+jB (G=conductance and B=susceptance), with Y being the inverse of impedance (Y=1/Z), $Y_{initial}=G_{constant}+jB_{initial}$, and $Y_{final}=G_{constant}+jB_{final}$, such that the change of Y along the constant-conductance circle is in the counter-clockwise direction in the example Smith chart 110 of FIG. 4.

In yet another example, an introduction of a shunt capacitance ($C_{shunt}$) 128 along the signal path has a tendency to change the impedance at the node from the original state (e.g., at the tail of an arc-arrow 138 on a constant-conductance circle 114) to another state at the tip of the arc-arrow 138 on the constant-conductance circle 114. Thus, in terms of admittance Y=G+jB (G=conductance and B=susceptance), with Y being the inverse of impedance (Y=1/Z), $Y_{initial}=G_{constant}+jB_{initial}$, and $Y_{final}=G_{constant}+jB_{final}$, such that the change of Y along the constant-conductance circle is in the clockwise direction in the example Smith chart 110 of FIG. 4. It is noted that the shunt capacitance example is depicted on the same constant-conductance circle as the shunt inductance example for illustration purpose; however, it will be understood that initial impedances of the two examples may or may not be the same.

Although not shown in the example of FIG. 4, it is noted that an introduction of a resistance along the signal path has a tendency to change the impedance at the node from the original state to another state along a corresponding constant-reactance arc or a corresponding constant-susceptance arc. For example, a series resistance along the signal path has a tendency to change the impedance along the corresponding constant-reactance arc, towards the open circuit state. In another example, a shunt resistance along the signal path has a tendency to change the impedance along the corresponding constant-susceptance arc, towards the short circuit state. It is noted that constant-susceptance arcs can be provided relative to the constant-conductance circles, similar to the constant-reactance arcs/constant-resistance circles arrangement.

In some embodiments, an impedance tuner can be implemented along a signal path and be configured to provide matching of different load impedance states to a desired impedance state. Such a solution can be implemented utilizing a minimum or reduced number of LC components, while covering most, if not substantially all, of likely states of mismatched load impedance.

For example, and as described herein in greater detail, regions of a Smith chart can be divided into seven zones, with a central zone centered on the matched impedance point (e.g., Z=1 in the normalized representation, or 50 ohms), and six zones surrounding the central zone and having centers distributed around a constant-VSWR circle. Such seven zones can be, for example, circles dimensioned appropriately so that they cover most or substantially all of likely impedance states of a mismatched load such as an antenna.

With such a 7-state example, the corresponding impedance tuner can be configured to tune its circuit so that a detected mismatched impedance at one of the six surrounding zones is changed to a matched impedance that is within the central zone. Such changing of the mismatched impedance to the matched impedance can be achieved by one or two of the example LC components described in reference to FIG. 4. For example, four of the six surrounding zones can have their impedances changed to the matched impedance of the central zone using a single component. The remaining two of the six surrounding zones can have their impedances changed to the matched impedance of the central zone using two components.

In the foregoing 7-state example, if the detected impedance is within the central zone, it can be assumed to be in an impedance matched state. Thus, the impedance tuner can be configured to provide, for example, a bypass functionality without any change in impedance.

Figure 5:
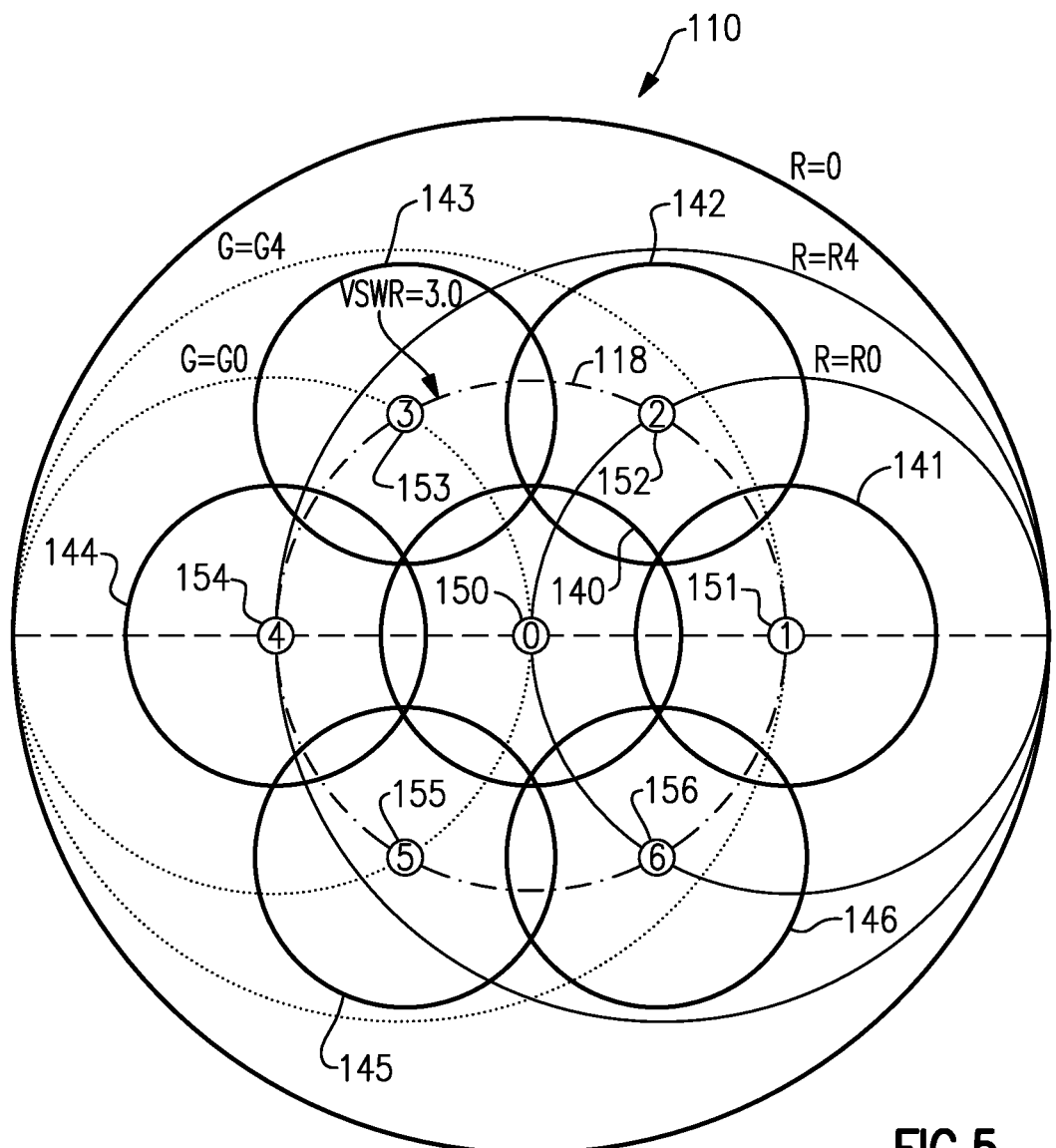
FIG. 5 shows an example of a 7-state impedance regions that can be depicted on a Smith chart.

FIG. 5 shows an example of the foregoing 7-state solution depicted on a Smith chart 110. In the example of FIG. 5, the central zone is depicted as a circle 140 having a center 150 that coincides with the matched impedance point (e.g., Z=1 in FIG. 3, corresponding to, for example, 50 ohms). For the purpose of description, and as indicated by the center 150, such an impedance matched state can be referred to as State 0.

In the example of FIG. 5, the six surrounding zones are depicted as six circles 141, 142, 143, 144, 145, 146 having respective centers 151, 152, 153, 154, 155, 156 that are distributed along the constant-VSWR circle 118. For the purpose of description, and as indicated by the centers 151, 152, 153, 154, 155, 156, such surrounding impedance mismatched states can be referred to as States 1, 2, 3, 4, 5, 6, respectively.

In the example of FIG. 5, the constant-VSWR circle 118 can have a normalized value of, for example, 3.0. However, it will be understood that one or more features of the present disclosure can also be implemented utilizing other valued VSWR circles.

In the example of FIG. 5, the first center 151 can be on the constant-VSWR circle 118 and also on the horizontal line segment (reactance X=0 line). Thus, for the purpose of description, the first center 151 can be considered to be at 0 degree from the horizontal line segment and about the matched center 150. Then, the second to sixth centers (152, 153, 154, 155, 156) can be on the constant-VSWR circle 118 and at 60 degrees, 120 degrees, 180 degrees, 240 degrees, 300 degrees from the first center 151.

In the example of FIG. 5, the circles 140, 141, 142, 143, 144, 145, 146 are depicted as having approximately same size. However, it will be understood that such circles may or may not have same size. For example, the central zone circle (140) can have a first radius, and the six surrounding zone circles (141, 142, 143, 144, 145, 146) can have a second radius that is different than the first radius. In another example, the six surrounding zone circles (141, 142, 143, 144, 145, 146) can have two or more different radii.

In the example of FIG. 5, the six centers (151, 152, 153, 154, 155, 156) are arranged to be positioned every 60 degrees from the horizontal line segment. However, it will be understood that one or more features of the present disclosure can also be implemented with other angular orientations of the six centers. For example, the first center 151 may be positioned at a non-zero degree position (e.g., at 30 degrees), and the remaining centers (151, 152, 153, 154, 155, 156) can be positioned at 60-degree increments from the first center position.

In the example of FIG. 5, there are six surrounding zones and the central zone, and such zones are defined by circles. However, it will be understood that one or more features of the present disclosure can also be implemented utilizing more or less number of surrounding zones. Further, it will be understood that some or all of such central and/or surrounding zones can be defined by shapes other than circles.

As shown in the example of FIG. 5, the circles of the seven zones are dimensioned to provide overlapping regions. Such overlapping of the regions can eliminate or reduce any gaps between impedance regions. However, when a detected impedance is in one of such overlapping regions, such an impedance can belong to two or more zones.

Figure 6:
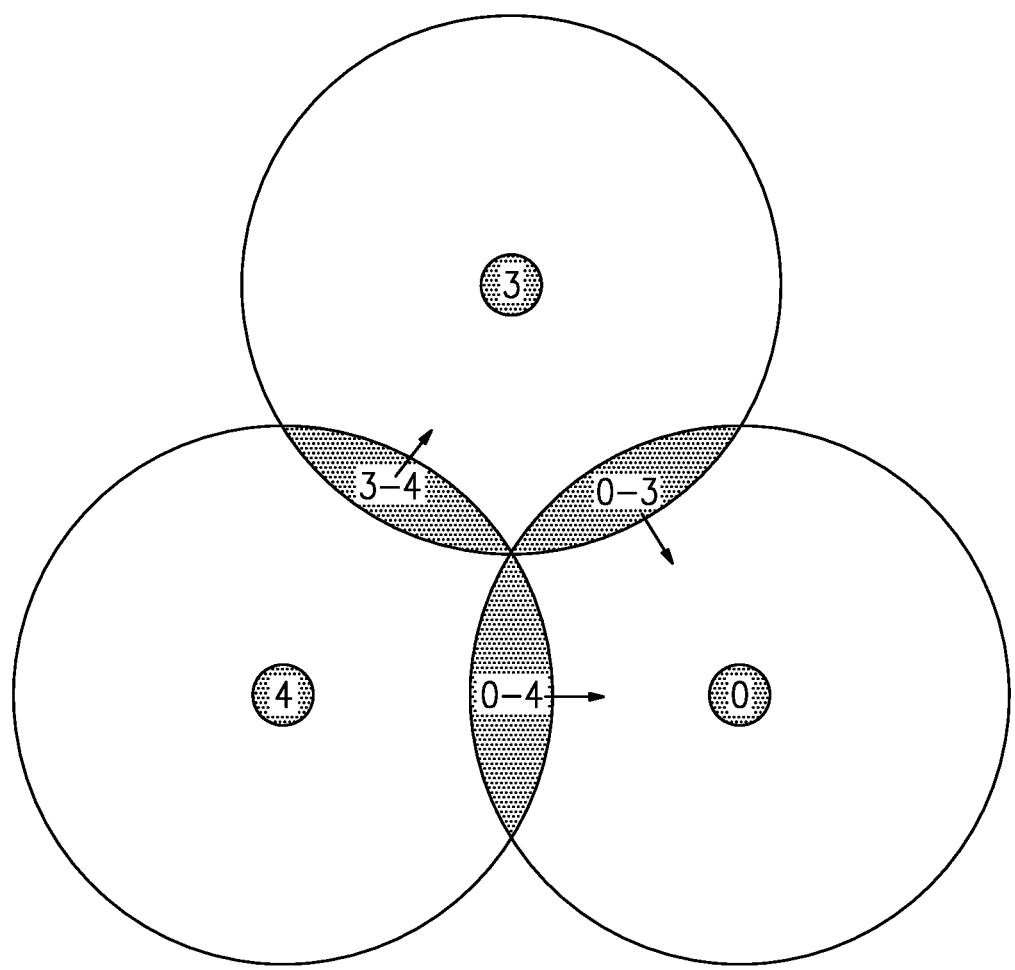
FIG. 6 shows an isolated view of three of the seven example zones of FIG. 5.

FIG. 6 shows an isolated view of three of the seven zones of FIG. 5. More particularly, the third and fourth surrounding zones, as well as the central zone, are shown to provide overlapping regions.

FIG. 6 also shows an example of how such overlapping regions can be handled. In some implementations, there may be an order of preference in how an impedance tuner achieves the matched impedance state. For example, not introducing any LC component (e.g., when the detected impedance is in the central zone (Zone 0 in FIGS. 5 and 6) may be preferable over all other tuning operations. In another example, introducing one component in the impedance tuner may be preferable over a tuning operation involving introduction of two components.

Accordingly, and assuming that the third zone (Zone 3 in FIGS. 5 and 6) involves introduction of one component and the fourth zone (Zone 4 in FIGS. 5 and 6) involves introduction of two components, the example scheme shown in FIG. 6 can be implemented. More particularly, one can see that if a detected impedance is in any overlapping region involving the central zone (Zone 0), then such an impedance can be assigned to be in the central zone. Thus, the overlapping region ("0-3") between the central zone (Zone 0) and the third zone (Zone 3) can be considered to be in the central zone. Similarly, the overlapping region ("0-4") between the central zone (Zone 0) and the fourth zone (Zone 4) can be considered to be in the central zone.

Referring to FIG. 6, if a detected impedance is in an overlapping region involving a one-component zone (e.g., Zone 3) and a two-component zone (e.g., Zone 4), then such an impedance can be assigned to be in the zone associated with a lower component count. Thus, the overlapping region ("3-4") between the third zone (Zone 3) and the fourth zone (Zone 4) can be considered to be in the third zone.

There are situations where an overlapping region involves two zones having same component count. For example, suppose that each of the second and third zones (Zones 2 and 3 in FIG. 5) is a one-component zone. Even if both zones are one-component zones, one may involve a series component (e.g., Zone 2), while the other zone involves a shunt component (e.g., Zone 3). Thus, if tuning operation with the series component is preferable, then the overlapping region can be considered to be in the corresponding zone (e.g., Zone 2). If tuning operation with the shunt component is preferable, then the overlapping region can be considered to be in the corresponding zone (e.g., Zone 3).

Figure 7:
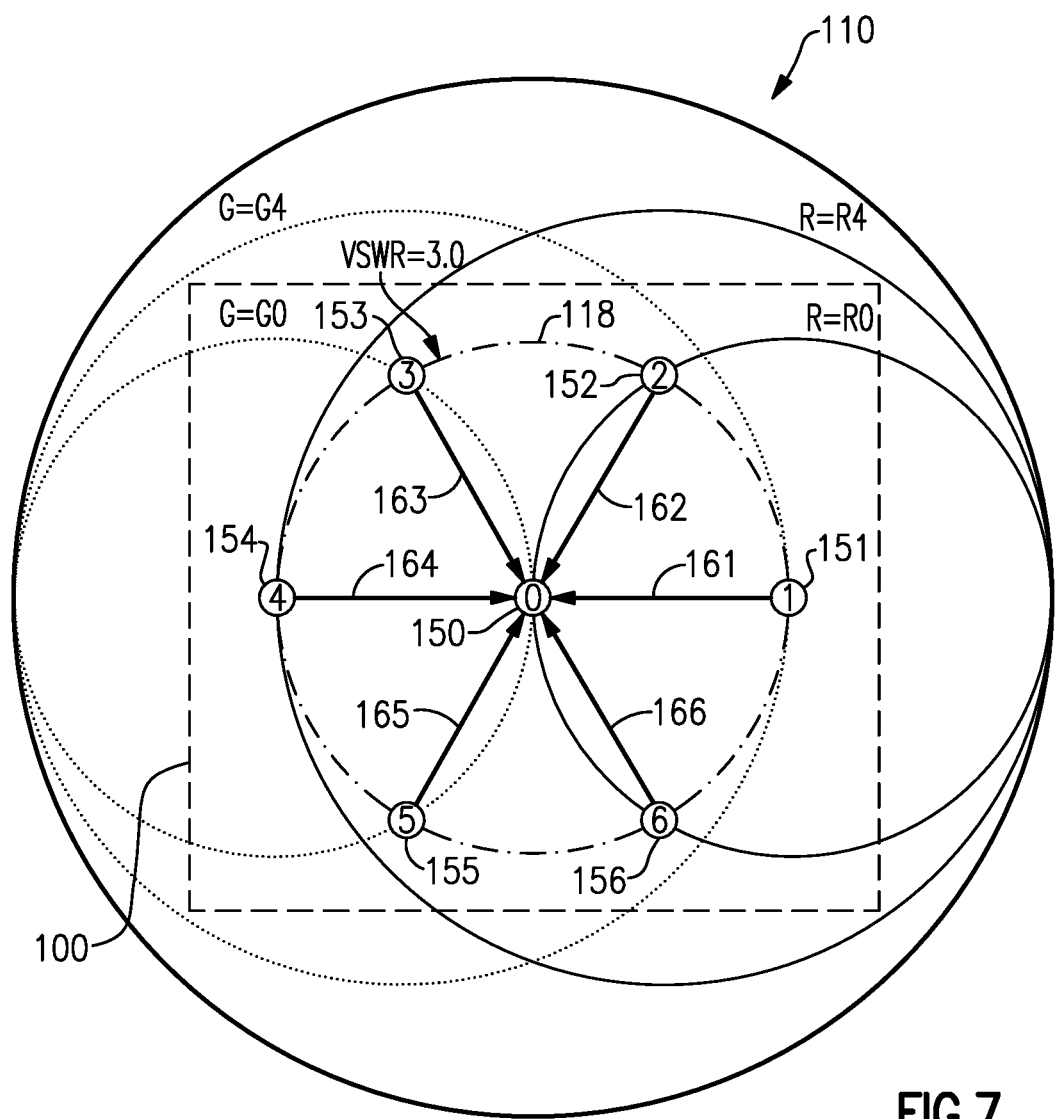
FIG. 7 also shows that in some embodiments, an impedance tuner having one or more features as described herein can be configured to adjust a mismatched impedance state at one of multiple impedance zones associated with a constant-VSWR circle, to a matched impedance state.

FIG. 7 shows a simplified depiction of the 7-state example of FIG. 5. In the Smith chart 110 of FIG. 7, the seven zones are simply depicted as their respective centers 150, 151, 152, 153, 154, 155, 156, with an understanding that overlapping regions can be handled appropriately (e.g., as in the example of FIG. 6).

FIG. 7 also shows that in some embodiments, an impedance tuner 100 having one or more features as described herein can be configured to adjust a mismatched impedance state at one of multiple impedance zones associated with a constant-VSWR circle, to a matched impedance state. In FIG. 7, such adjustments from the surrounding impedance zones (Zones 1 to 6) to the central zone (Zone 0) are depicted as arrows 161, 162, 163, 164, 165, 166, respectively. In some embodiments, the impedance tuner 100 can include one or more circuits as described herein and be configured to provide the foregoing tuning functionality. In some embodiments, the impedance tuner 100 can include any circuit, including circuits not specifically described herein, that is configured to provide the foregoing tuning functionality.

Figure 8:
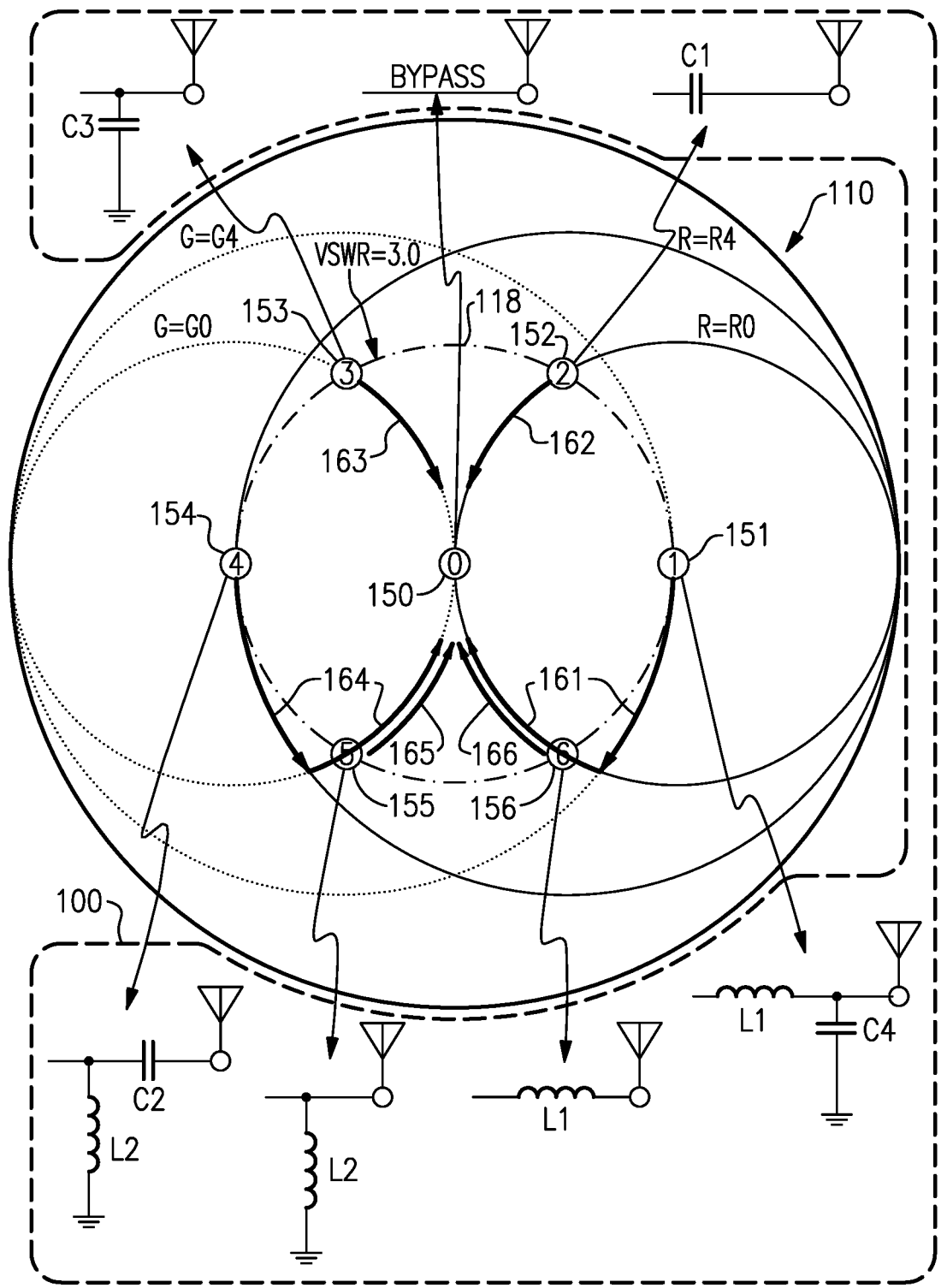
FIG. 8 shows an example of an impedance tuner that can perform the impedance transformations of FIG. 7 when a detected impedance is mismatched, and maintain a matched impedance state if the detected impedance is matched.

FIG. 8 shows an example of an impedance tuner 100 that can perform the impedance transformations (161, 162, 163, 164, 165, 166) of FIG. 7, when a detected impedance is mismatched, and maintain a matched impedance state if the detected impedance is matched. In some embodiments, such an impedance tuner can include a number of LC components implemented relative to a signal path, and for a given impedance transformation, utilize one or two of such components. If there is no impedance transformation to be made, the impedance tuner 100 can provide a bypass functionality.

In the example of FIG. 8, the signal path and the various LC components are depicted as being implemented relative to an antenna so as to provide tuning for variations in impedance presented by the antenna. However, it will be understood that one or more features of the present disclosure can also be implemented in applications that does not necessarily involve an antenna, and where impedance matching between two nodes (e.g., a circuit node and a load node) is desired.

In the example of FIG. 8, and referring to the more generalized depiction of FIG. 7, the impedance tuner 100 can provide a bypass functionality when the detected impedance is already in the matched zone (Zone 0 with center 150). When the detected impedance is in one of the six surrounding zones, an impedance transformation can be achieved by introducing one or more LC components relative to the signal path. As described herein in reference to FIG. 4, presence of an L or C component moves the impedance from its initial location on the Smith chart 110 to another location along a constant-resistance circle or a constant-conductance circle.

In FIG. 8, the example constant-VSWR circle 118 (on which are the centers of the six surrounding zones) has a normalized VSWR value of 3.0. Thus, the center 151 of the first zone (Zone 1) is also on a constant-resistance circle having a normalized resistance value of 3.0 (not shown in FIG. 8), as well as on a constant-conductance circle having a normalized conductance value of G=G4=1/3.0.

Accordingly, if the detected impedance is in the first zone (Zone 1), introduction of a shunt capacitance (C4) can have an effect of transforming the detected impedance from Zone 1 to an impedance state that lies on the constant-resistance circle having a normalized resistance value of R=R0=1.0. The impedance matched zone (Zone 0) also lies on such a constant-resistance circle. Thus, introduction of a series inductance (L1) can have an effect of transforming the impedance along the R=R0 circle to the impedance matched state of Zone 0. Accordingly, a combination of two components (e.g., the shunt capacitance C4 and the series inductance L1) can provide a combination of two transformations indicated as 161, from Zone 1 to the impedance matched state of Zone 0.

In FIG. 8, the center 152 of the second zone (Zone 2) is on the above-referenced R=R0 constant-resistance circle. Accordingly, if the detected impedance is in the second zone (Zone 2), introduction of a series capacitance (C1) can have an effect of transforming the detected impedance from Zone 2 to the impedance matched state of Zone 0. Accordingly, a single component (e.g., the series capacitance C1) can provide a single direct transformation indicated as 162, from Zone 2 to the impedance matched state of Zone 0.

In FIG. 8, the center 153 of the third zone (Zone 3) is on a constant-conductance circle having a normalized conductance value of G=G0=1.0, which is related to the above-referenced R=R0 constant-resistance circle. Accordingly, if the detected impedance is in the third zone (Zone 3), introduction of a shunt capacitance (C3) can have an effect of transforming the detected impedance from Zone 3 to the impedance matched state of Zone 0. Accordingly, a single component (e.g., the shunt capacitance C3) can provide a single direct transformation indicated as 163, from Zone 3 to the impedance matched state of Zone 0.

In FIG. 8, the center 154 of the fourth zone (Zone 4) is on a constant-resistance circle having a normalized resistance value of R=R4. Accordingly, if the detected impedance is in the fourth zone (Zone 4), introduction of a series capacitance (C2) can have an effect of transforming the detected impedance from Zone 4 to an impedance state that lies on the constant-conductance circle having a normalized conductance value of G=G0=1.0. The impedance matched zone (Zone 0) also lies on such a constant-conductance circle. Thus, introduction of a shunt inductance (L2) can have an effect of transforming the impedance along the G=G0 circle to the impedance matched state of Zone 0. Accordingly, a combination of two components (e.g., the series capacitance C2 and the shunt inductance L2) can provide a combination of two transformations indicated as 164, from Zone 4 to the impedance matched state of Zone 0.

In FIG. 8, the center 155 of the fifth zone (Zone 5) is on the above-referenced G=G0 constant-conductance circle. Accordingly, if the detected impedance is in the fifth zone (Zone 5), introduction of a shunt inductance (L2) can have an effect of transforming the detected impedance from Zone 5 to the impedance matched state of Zone 0. Accordingly, a single component (e.g., the shunt inductance L2) can provide a single direct transformation indicated as 165, from Zone 5 to the impedance matched state of Zone 0.

In FIG. 8, the center 156 of the sixth zone (Zone 6) is on the above-referenced R=R0 constant-resistance circle. Accordingly, if the detected impedance is in the sixth zone (Zone 6), introduction of a series inductance (L1) can have an effect of transforming the detected impedance from Zone 6 to the impedance matched state of Zone 0. Accordingly, a single component (e.g., the series inductance L1) can provide a single direct transformation indicated as 166, from Zone 6 to the impedance matched state of Zone 0.

Figure 9:
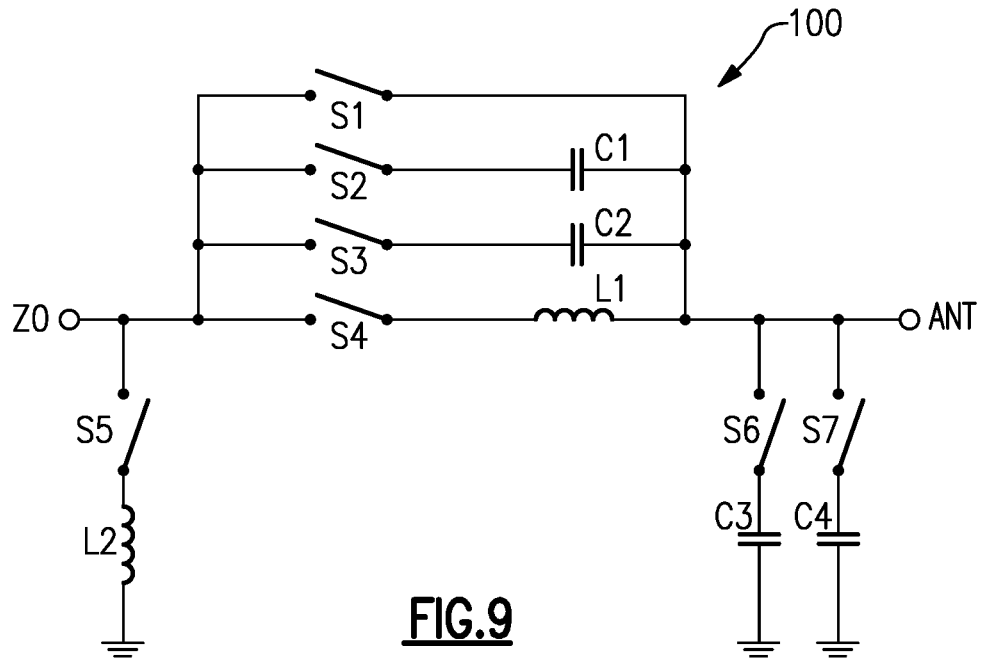
FIG. 9 shows an example of an impedance tuner circuit that can be utilized to provide the various impedance transformations and the bypass functionalities of FIG. 8.

FIG. 9 shows an example of an impedance tuner circuit 100 that can be utilized to provide the various impedance transformations and the bypass functionalities of FIG. 8. In the example of FIG. 9, a signal node on the left can be coupled to a radio circuit operating at a matched impedance Z0 (e.g., 50 ohms); accordingly, such a node is indicated as Z0. Also, an antenna node (ANT) on the right can be coupled to an antenna, and such an antenna can present a matched or mismatched impedance.

In the example of FIG. 9, various series components, as well as a bypass functionality, can be provided by parallel switchable paths between the nodes Z0 and ANT. A shunt inductance can be provided by a switchable inductive path to ground from the node Z0. A plurality of shunt capacitance states can be provided by two parallel switchable capacitive paths to ground from the node ANT.

With the example impedance tuner circuit 100 of FIG. 9, FIGS. 10A to 10G show examples of how the bypass functionality and the six impedance transformations of FIG. 8 can be achieved. Table 1 lists switch states of such bypass/transformation operations. In Table 1, switch states of 1 and 0 correspond to ON and OFF states, respectively

TABLE 1

| Operation | S1 | S2 | S3 | S4 | S5 | S6 | S7 |
|---|---|---|---|---|---|---|---|
| Bypass | 1 | 0 | 0 | 0 | 0 | 0 | 0 |
| Zone 1 to Zone 0 | 0 | 0 | 0 | 1 | 0 | 1 | 0 |
| Zone 2 to Zone 0 | 0 | 1 | 0 | 0 | 0 | 0 | 0 |
| Zone 3 to Zone 0 | 1 | 0 | 0 | 0 | 0 | 1 | 1 |
| Zone 4 to Zone 0 | 0 | 1 | 1 | 0 | 1 | 0 | 0 |
| Zone 5 to Zone 0 | 1 | 0 | 0 | 0 | 1 | 0 | 0 |
| Zone 6 to Zone 0 | 0 | 0 | 0 | 1 | 0 | 0 | 0 |

Figure 10A:
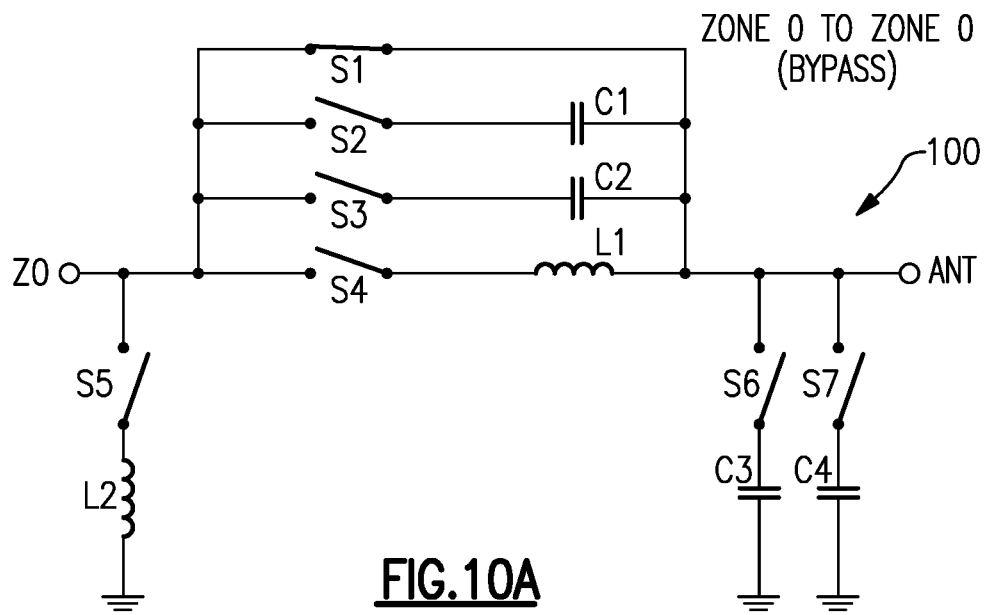
FIGS. 10A to 10G show examples of how the bypass functionality and the six impedance transformations of FIG. 8 can be achieved with the example impedance tuner of FIG. 9.

In some embodiments, and referring to FIG. 10A and Table 1, the impedance tuner circuit 100 can be operated to provide a bypass functionality by having the switch S1 ON, and all other switches OFF. Accordingly, a bypass path without any LC component, and thus without any impedance transformation, can be provided between the nodes Z0 and ANT.

Figure 10B:
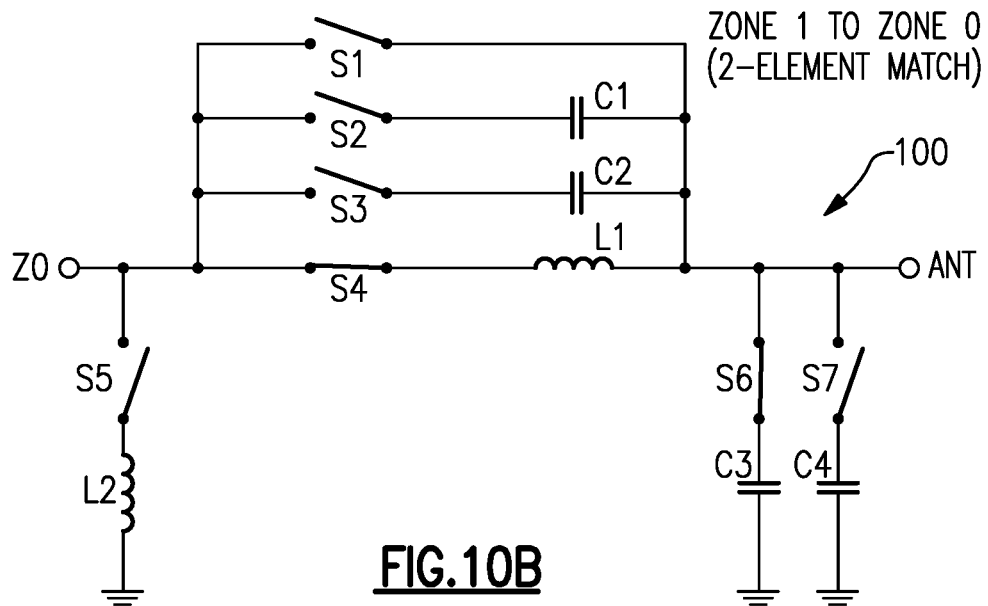

In some embodiments, and referring to FIG. 10B and Table 1, the impedance tuner circuit 100 can be operated to provide an impedance transformation from Zone 1 to Zone 0 by having the switches S4 and S6 ON, and all other switches OFF. Accordingly, a 2-element transformation (e.g., 161 in FIG. 8) can be provided, with a combination of series inductance L1 and shunt capacitance C3 (e.g., indicated as L1 and C4 in FIG. 8). It is noted that designations of LC components may or may not be the same in FIG. 9 and FIG. 8.

Figure 10C:
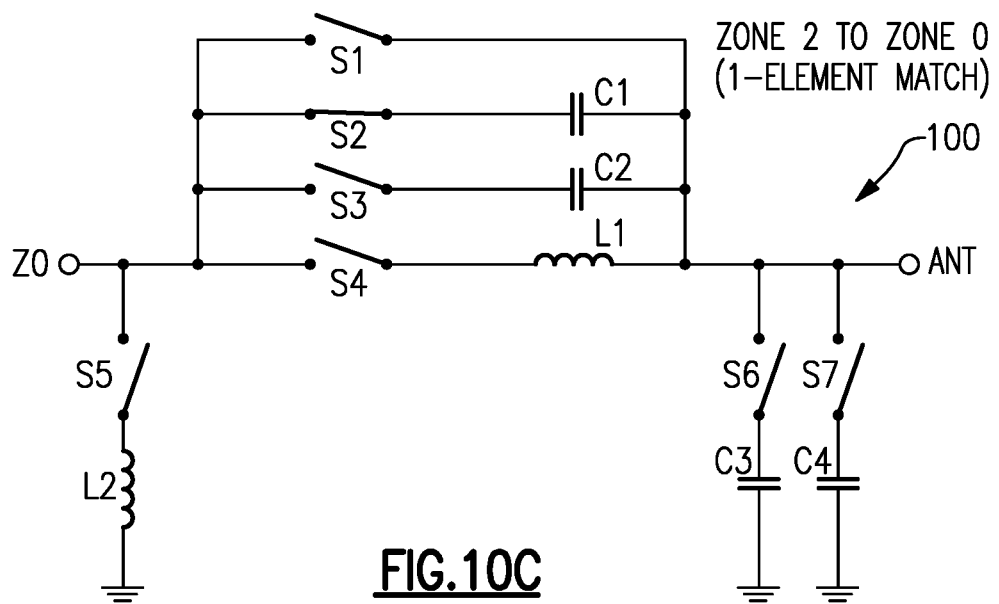

In some embodiments, and referring to FIG. 10C and Table 1, the impedance tuner circuit 100 can be operated to provide an impedance transformation from Zone 2 to Zone 0 by having the switch S2 ON, and all other switches OFF. Accordingly, a 1-element transformation (e.g., 162 in FIG. 8) can be provided with a series capacitance C1 (e.g., indicated as C1 in FIG. 8).

Figure 10D:
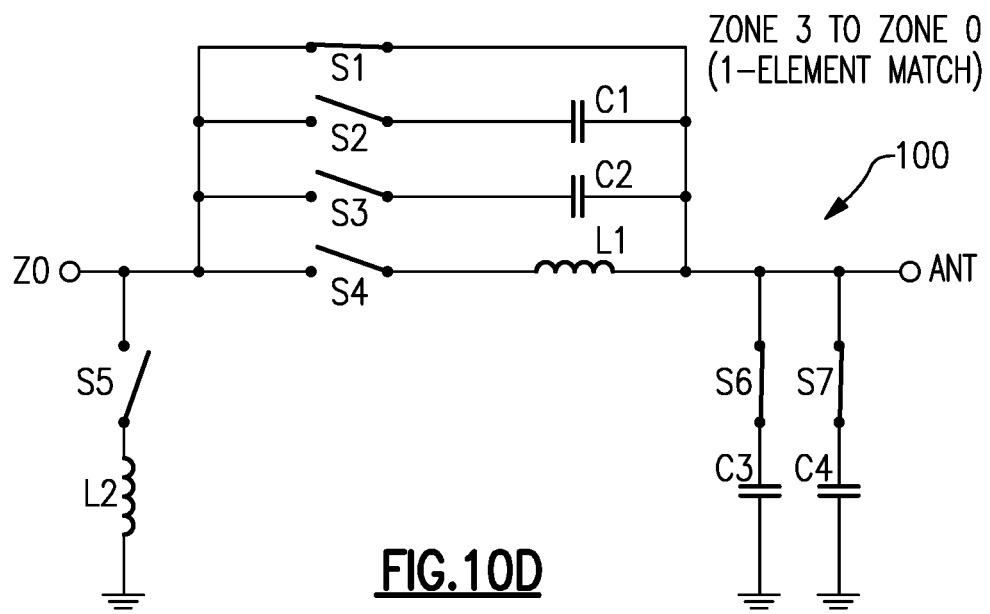

In some embodiments, and referring to FIG. 10D and Table 1, the impedance tuner circuit 100 can be operated to provide an impedance transformation from Zone 3 to Zone 0 by having the switches S1, S6 and S7 ON, and all other switches OFF. Accordingly, an equivalent of a 1-element transformation (e.g., 163 in FIG. 8) can be provided with a shunt capacitance of C3+C4 (e.g., indicated as C3 in FIG. 8).

Figure 10E:
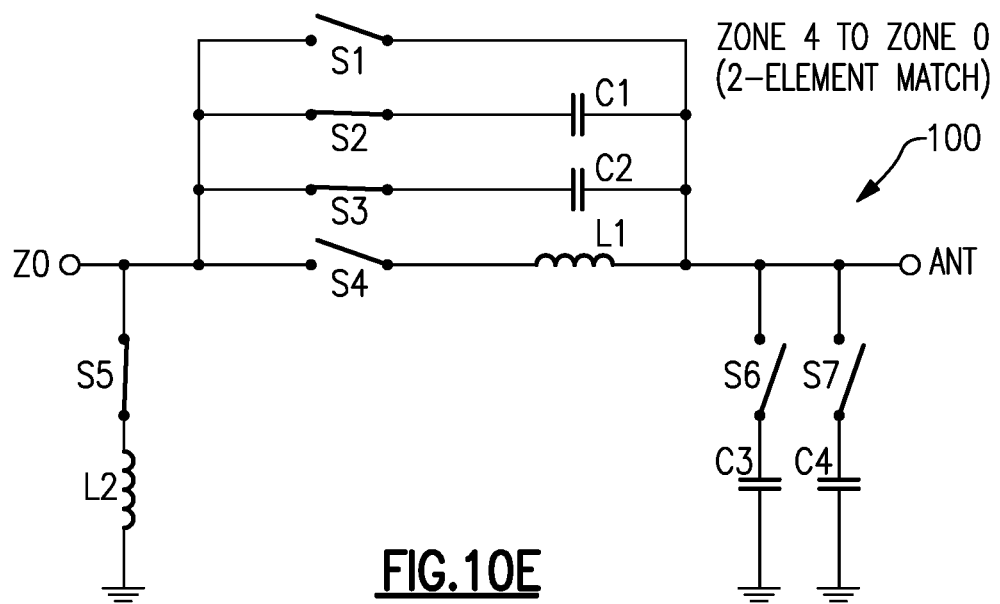

In some embodiments, and referring to FIG. 10E and Table 1, the impedance tuner circuit 100 can be operated to provide an impedance transformation from Zone 4 to Zone 0 by having the switches S2, S3 and S5 ON, and all other switches OFF. Accordingly, an equivalent of a 2-element transformation (e.g., 164 in FIG. 8) can be provided, with a combination of series capacitance (C1+C2) and shunt inductance L2 (e.g., indicated as C2 and L2 in FIG. 8).

Figure 10F:
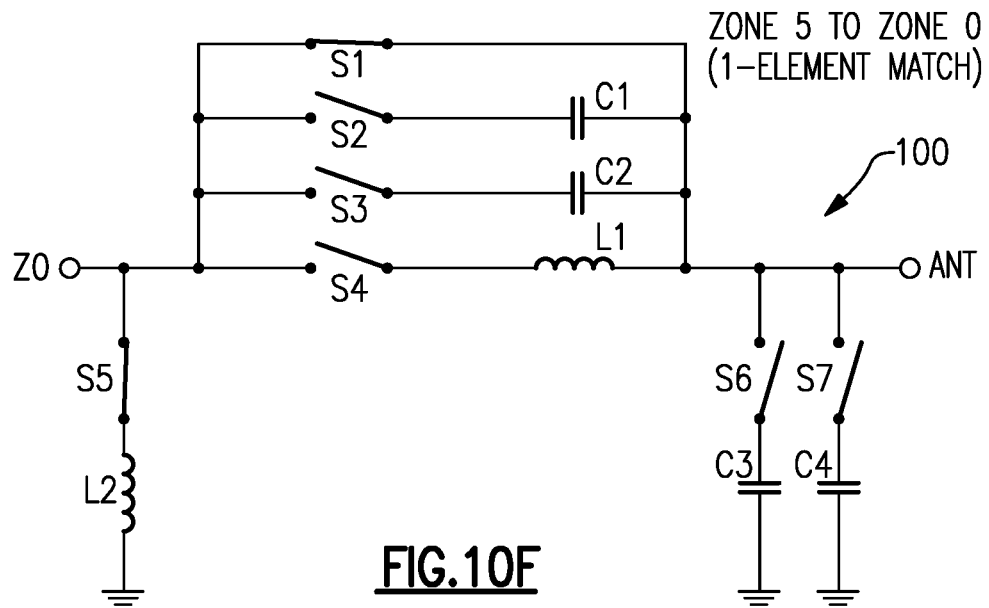

In some embodiments, and referring to FIG. 10F and Table 1, the impedance tuner circuit 100 can be operated to provide an impedance transformation from Zone 5 to Zone 0 by having the switches S1 and S5 ON, and all other switches OFF. Accordingly, a 1-element transformation (e.g., 165 in FIG. 8) can be provided with a shunt inductance L2 (e.g., indicated as L2 in FIG. 8).

Figure 10G:
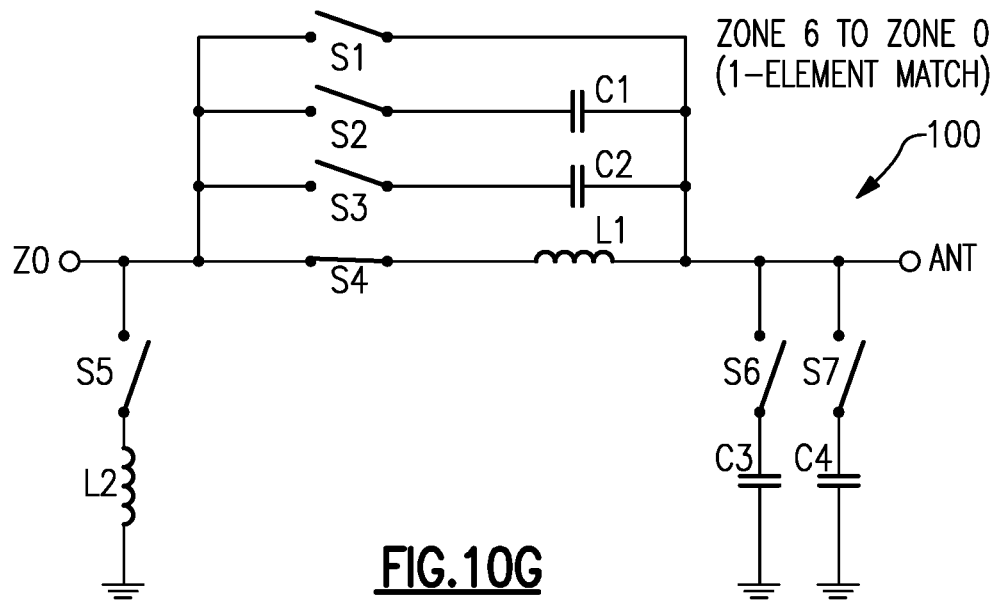

In some embodiments, and referring to FIG. 10G and Table 1, the impedance tuner circuit 100 can be operated to provide an impedance transformation from Zone 6 to Zone 0 by having the switch S4 ON, and all other switches OFF. Accordingly, a 1-element transformation (e.g., 166 in FIG. 8) can be provided with a series inductance L1 (e.g., indicated as L1 in FIG. 8).

Referring to FIGS. 9 and 10, it is noted that C1 and C2 are implemented in parallel to provide series capacitances, and C3 and C4 are implemented in parallel to provide shunt capacitances. It is further noted that the series capacitance associated with the 1-element Zone 2 to Zone 0 transformation (C1 in FIG. 8 and C1 in FIG. 10C) is typically different than the series capacitance associated with the 2-element Zone 4 to Zone 0 transformation (C2 in FIG. 8 and C1+C2 in FIG. 10E). Thus, at least two values of series capacitances are needed or desired for the impedance tuner circuit 100 of FIGS. 9 and 10.

In some embodiments, such two values of series capacitances can be provided with a first capacitance selected for the 1-element transformation, and a second capacitance selected for the 2-element transformation. In this configuration, a third series capacitance value (sum of the two capacitances) can be provided by utilizing a parallel combination of the two capacitances. However, such a third series capacitance value will be greater than the larger of the two capacitances.

In some embodiments, such as in the example of FIGS. 9 and 10, such two values of series capacitances can be provided with a first capacitance (e.g., C1) selected for the 1-element transformation (e.g., as in FIG. 10C), and a second capacitance (C2) selected such that when combined with the first capacitance, the resulting net capacitance (C1+C2) is suitable for the 2-element transformation (e.g., as in FIG. 10E). In this configuration, a third series capacitance value can be provided by utilizing only the second capacitance (C2). In such a configuration, the third series capacitance value will be less than the sum of the two capacitances. Examples of how such an extra series capacitance can be utilized are described herein in greater detail.

Similarly, in some embodiments, the two values of shunt capacitances can be provided with a first capacitance selected for the 1-element transformation, and a second capacitance selected for the 2-element transformation. In this configuration, a third shunt capacitance value (sum of the two capacitances) can be provided by utilizing a parallel combination of the two capacitances. However, such a third shunt capacitance value will be greater than the larger of the two capacitances.

In some embodiments, such as in the example of FIGS. 9 and 10, the two values of shunt capacitances can be provided with a first capacitance (e.g., C3) selected for the 2-element transformation (e.g., as in FIG. 10B), and a second capacitance (C4) selected such that when combined with the first capacitance, the resulting net capacitance (C3+C4) is suitable for the 1-element transformation (e.g., as in FIG. 10D). In this configuration, a third shunt capacitance value can be provided by utilizing only the second capacitance (C4). In such a configuration, the third shunt capacitance value will be less than the sum of the two capacitances. Examples of how such an extra shunt capacitance can be utilized are described herein in greater detail.

Referring to FIGS. 9 and 10, it is noted that L1 provides the series inductance for both of the 1-element transformation (e.g., as in FIG. 10G) and the 2-element transformation (e.g., as in FIG. 10B). Similarly, L2 provides the shunt inductance for both of the 1-element transformation (e.g., as in FIG. 10F) and the 2-element transformation (e.g., as in FIG. 10E). Such a configuration can be implemented in applications where the same or similar inductance can be utilized for both 1-element and 2-element transformations as a series or shunt inductance.

However, if the 1-element and 2-element transformations require significantly different inductance values, two inductances can be implemented so as to provide two or more net inductance values for each of either or both of the series inductance and the shunt inductance. For example, a switchable inductance (e.g., L1' with a parallel switch) can be provided in series with the series inductance L1 of FIG. 9. Such an arrangement can provide net series inductance values of L1 and L1+L1'. If L1 is also made to be switchable (e.g., with a parallel switch), then the net series inductance values can be L1, L1' and L1+L1'.

Figure 11:
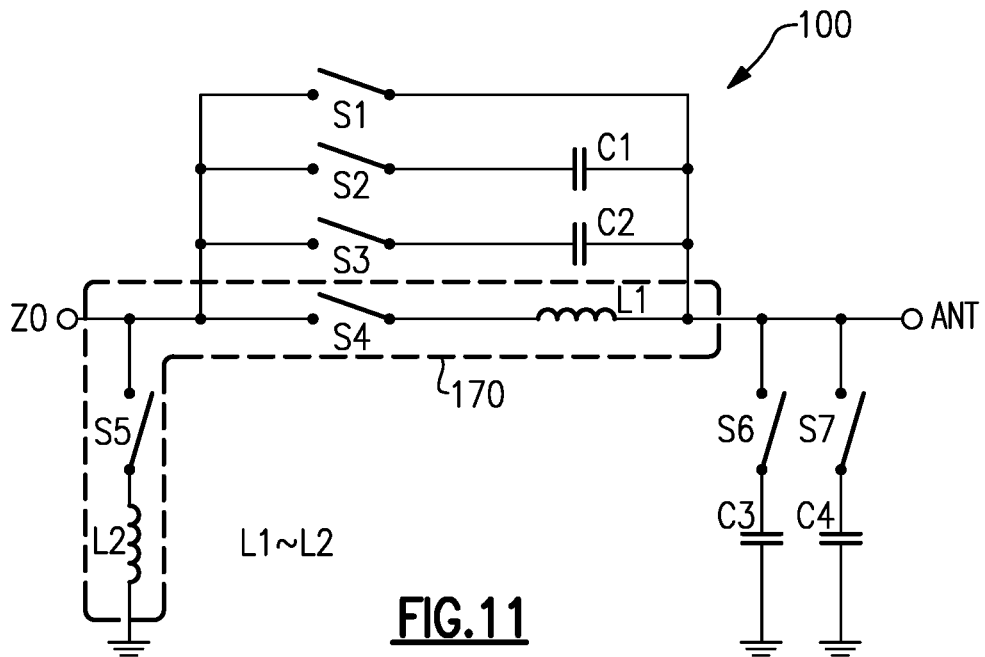
FIG. 11 shows an impedance tuner circuit that is similar to the example of FIG. 9, but where the series inductance L1 and the shunt inductance L2 have similar values.

FIG. 11 shows an impedance tuner circuit 100 that is the same as the example of FIG. 9, but where the series inductance L1 and the shunt inductance L2 (in an assembly 170) have similar values. In such a situation, the impedance tuner circuit 100 of FIG. 11 can be modified to an impedance tuner circuit 100 shown in FIG. 12.

Figure 12:
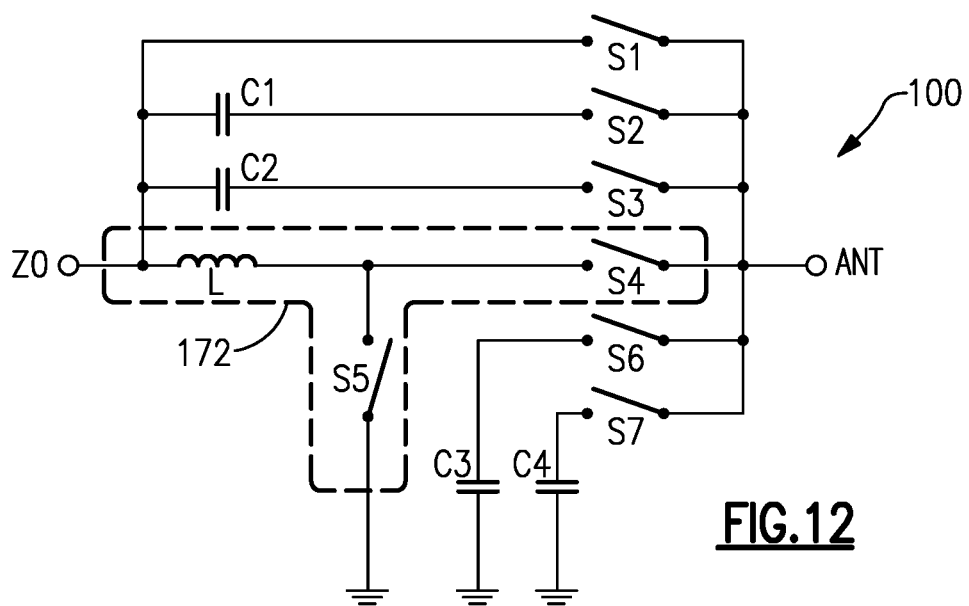
FIG. 12 shows that in some embodiments, an impedance tuner circuit can include a single inductance L and a plurality of switches arranged so as to provide a series inductance functionality, a shunt inductance functionality, or some combination thereof.

More particularly, FIG. 12 shows that in some embodiments, an impedance tuner circuit 100 can include the switchable bypass path and switchable capacitances C1, C2, C3, C4 arranged electrically similar to the example of FIG. 11. In FIG. 12, however, a single inductance L is provided, with one end coupled to the node Z0, and the other end coupled to the node ANT through a switch S4 and to ground through a switch S5. Such an assembly associated with the inductance L is indicated as 172. In some embodiments, such an assembly with one inductance (L) can provide the inductance-related functionalities of the assembly 170 (having the two inductances L1, L2) of FIG. 11. Examples related to such one-inductance functionalities are described herein in greater detail.

Figure 13:
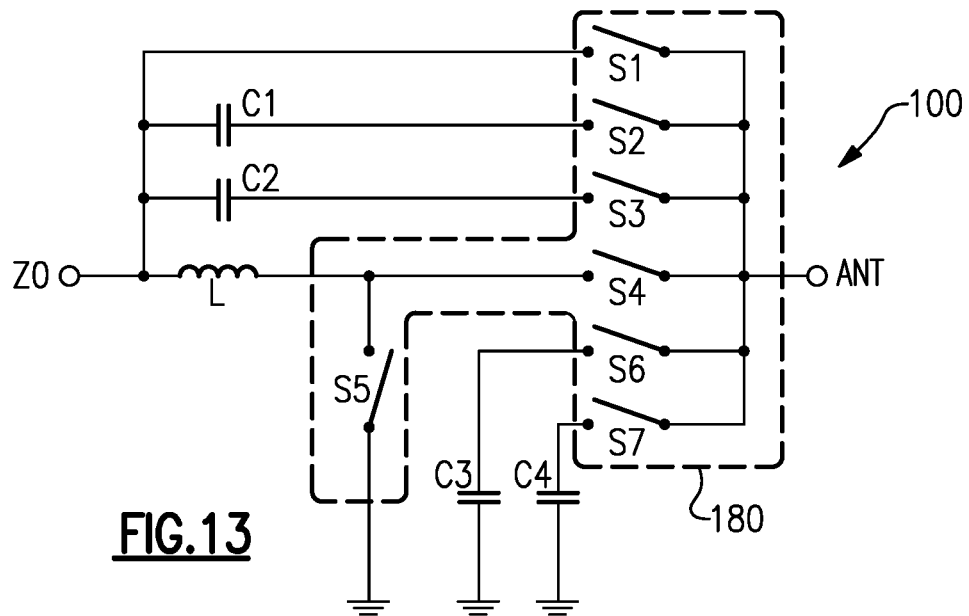
FIG. 13 shows that in some embodiments, the impedance tuner circuit of FIG. 12 can be implemented such that at least the switches are formed on a single semiconductor die such as a silicon-on-insulator (SOI) die.

FIG. 13 shows an impedance tuner circuit 100 having generally the same architecture as the impedance tuner circuit 100 of FIG. 12. In the example of FIG. 13, an assembly of switches, indicated as 180, can be implemented on a single semiconductor die such as a silicon-on-insulator (SOI) die. Additional examples related to switches, die implementations, other product implementations, etc. are described herein in greater detail.

With the example impedance tuner circuit 100 of FIG. 12, FIGS. 14A to 14G show examples of how the bypass functionality and the six impedance transformations of FIG. 8 can be achieved. Table 2 lists switch states of such bypass/transformation operations. In Table 2, switch states of 1 and 0 correspond to ON and OFF states, respectively

TABLE 2

| Operation | S1 | S2 | S3 | S4 | S5 | S6 | S7 |
|---|---|---|---|---|---|---|---|
| Bypass | 1 | 0 | 0 | 0 | 0 | 0 | 0 |
| Zone 1 to Zone 0 | 0 | 0 | 0 | 1 | 0 | 1 | 0 |
| Zone 2 to Zone 0 | 0 | 1 | 0 | 0 | 0 | 0 | 0 |
| Zone 3 to Zone 0 | 1 | 0 | 0 | 0 | 0 | 1 | 1 |
| Zone 4 to Zone 0 | 0 | 1 | 1 | 0 | 1 | 0 | 0 |
| Zone 5 to Zone 0 | 1 | 0 | 0 | 0 | 1 | 0 | 0 |
| Zone 6 to Zone 0 | 0 | 0 | 0 | 1 | 0 | 0 | 0 |

Figure 14A:
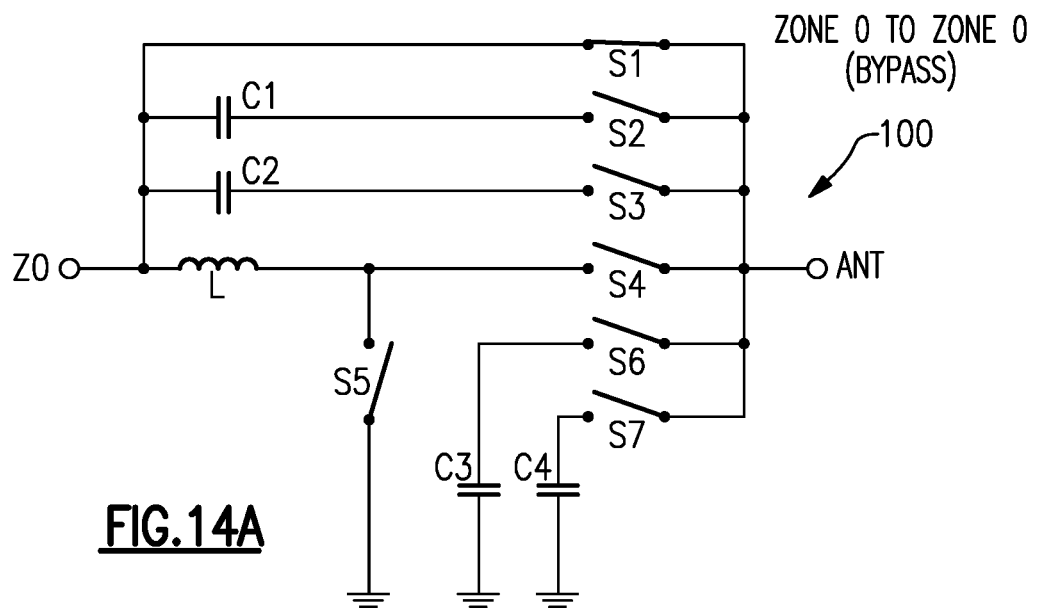
FIGS. 14A to 14G show examples of how the bypass functionality and the six impedance transformations of FIG. 8 can be achieved with the example impedance tuner of FIG. 12.

In some embodiments, and referring to FIG. 14A and Table 2, the impedance tuner circuit 100 can be operated to provide a bypass functionality by having the switch S1 ON, and all other switches OFF. Accordingly, a bypass path without any LC component, and thus without any impedance transformation, can be provided between the nodes Z0 and ANT.

Figure 14B:
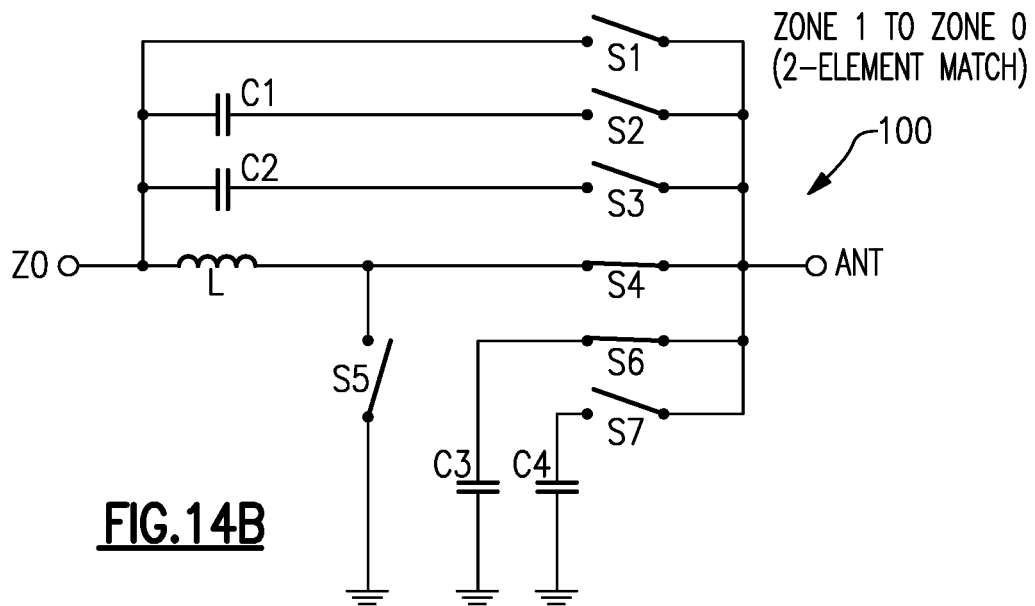

In some embodiments, and referring to FIG. 14B and Table 2, the impedance tuner circuit 100 can be operated to provide an impedance transformation from Zone 1 to Zone 0 by having the switches S4 and S6 ON, and all other switches OFF. Accordingly, a 2-element transformation (e.g., 161 in FIG. 8) can be provided, with a combination of the inductance L and shunt capacitance C3 (e.g., indicated as L1 and C4 in FIG. 8). It is noted that designations of LC components may or may not be the same in FIG. 13 and FIG. 8.

Figure 14C:
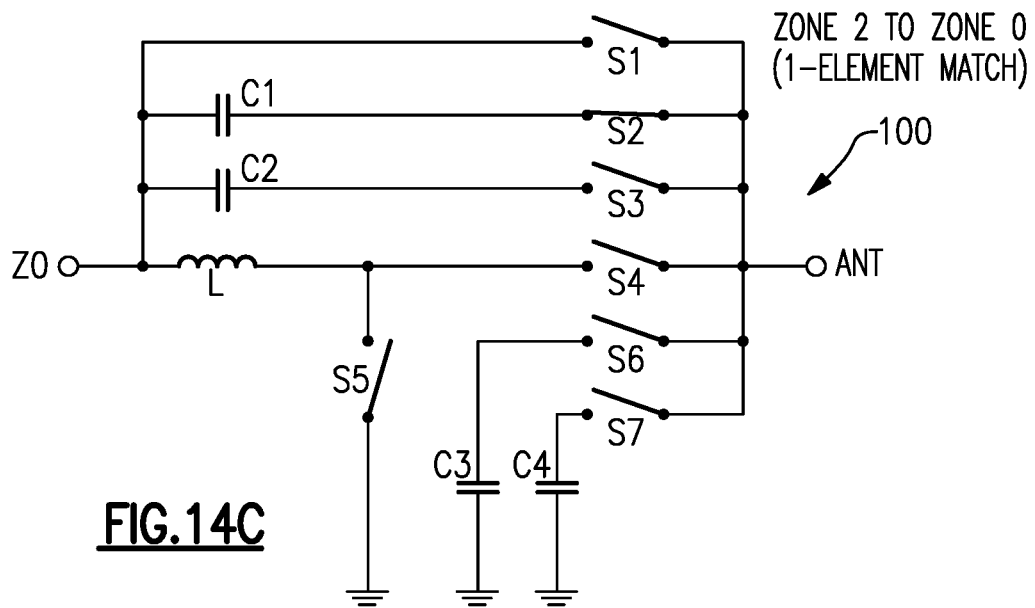

In some embodiments, and referring to FIG. 14C and Table 2, the impedance tuner circuit 100 can be operated to provide an impedance transformation from Zone 2 to Zone 0 by having the switch S2 ON, and all other switches OFF. Accordingly, a 1-element transformation (e.g., 162 in FIG. 8) can be provided with a series capacitance C1 (e.g., indicated as C1 in FIG. 8).

Figure 14D:
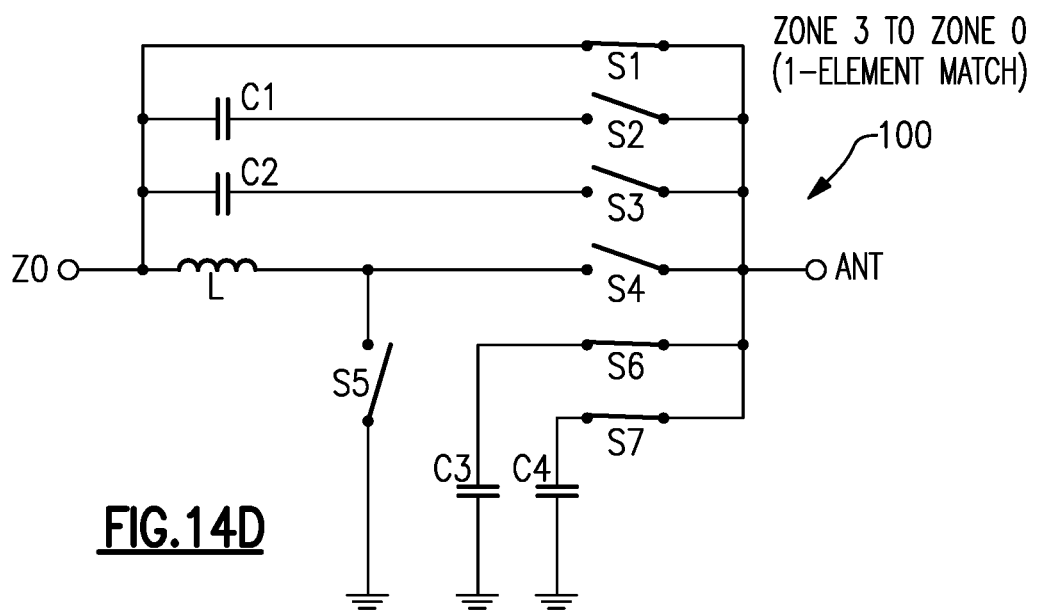

In some embodiments, and referring to FIG. 14D and Table 2, the impedance tuner circuit 100 can be operated to provide an impedance transformation from Zone 3 to Zone 0 by having the switches S1, S6 and S7 ON, and all other switches OFF. Accordingly, an equivalent of a 1-element transformation (e.g., 163 in FIG. 8) can be provided with a shunt capacitance of C3+C4 (e.g., indicated as C3 in FIG. 8).

Figure 14E:
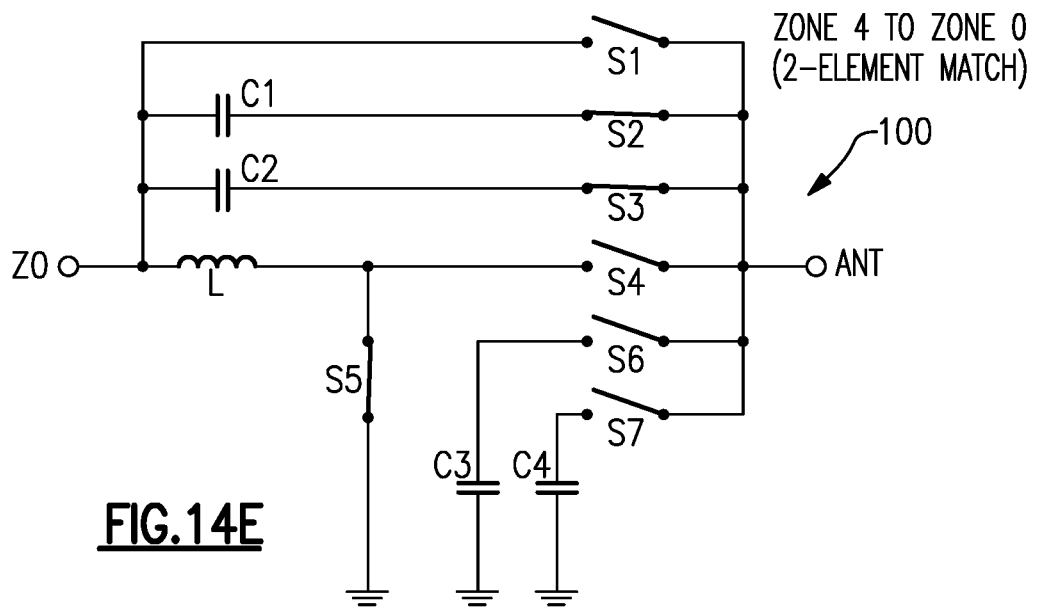

In some embodiments, and referring to FIG. 14E and Table 2, the impedance tuner circuit 100 can be operated to provide an impedance transformation from Zone 4 to Zone 0 by having the switches S2, S3 and S5 ON, and all other switches OFF. Accordingly, an equivalent of a 2-element transformation (e.g., 164 in FIG. 8) can be provided, with a combination of series capacitance (C1+C2) and the inductance L (e.g., indicated as C2 and L2 in FIG. 8).

Figure 14F:
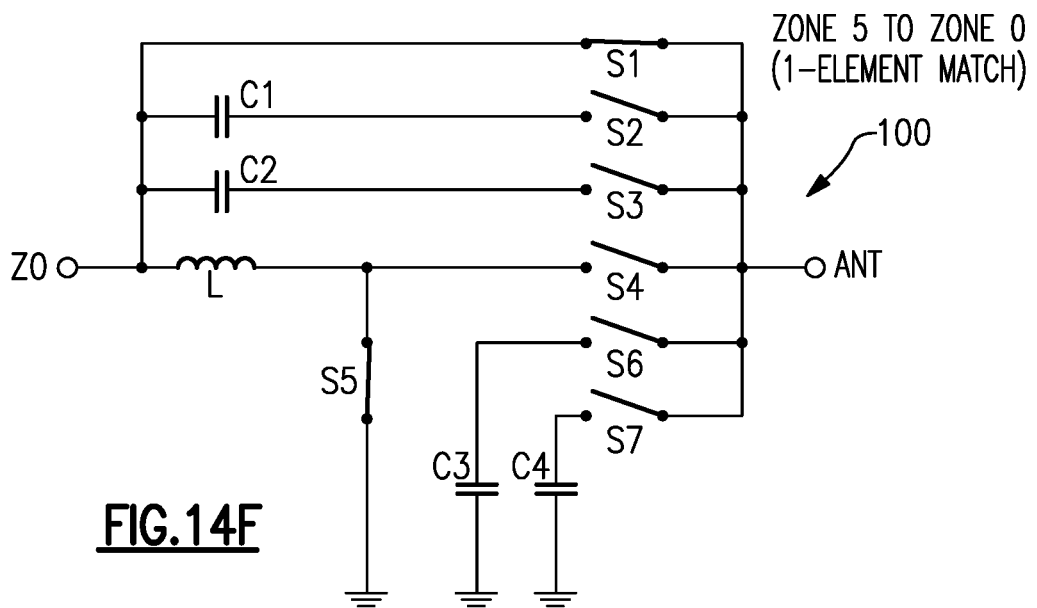

In some embodiments, and referring to FIG. 14F and Table 2, the impedance tuner circuit 100 can be operated to provide an impedance transformation from Zone 5 to Zone 0 by having the switches S1 and S5 ON, and all other switches OFF. Accordingly, a 1-element transformation (e.g., 165 in FIG. 8) can be provided with the inductance L (e.g., indicated as L2 in FIG. 8).

Figure 14G:
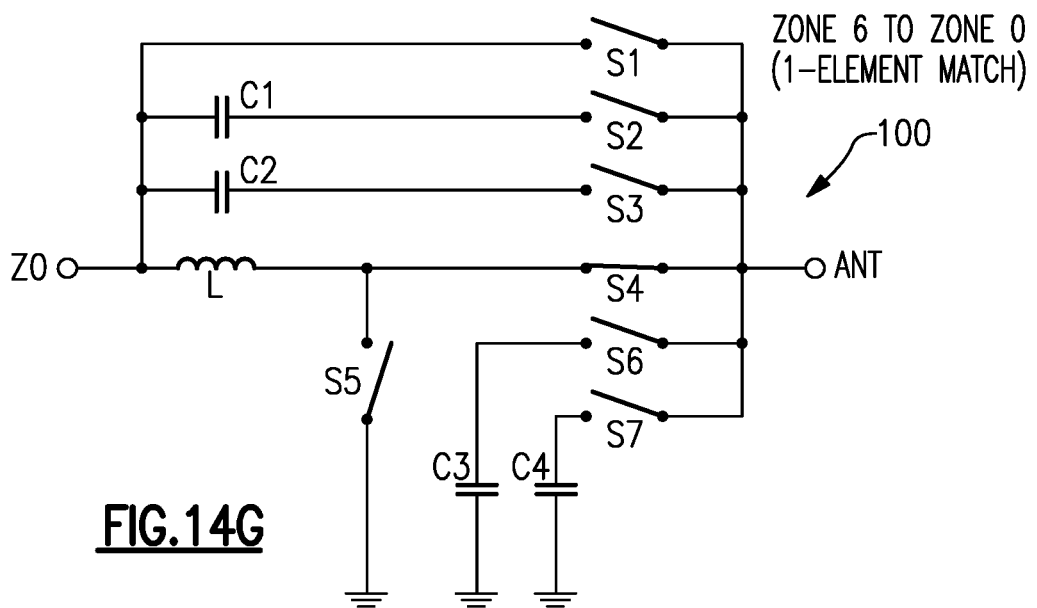

In some embodiments, and referring to FIG. 14G and Table 2, the impedance tuner circuit 100 can be operated to provide an impedance transformation from Zone 6 to Zone 0 by having the switch S4 ON, and all other switches OFF. Accordingly, a 1-element transformation (e.g., 166 in FIG. 8) can be provided with the inductance L (e.g., indicated as L1 in FIG. 8).

Figure 15:
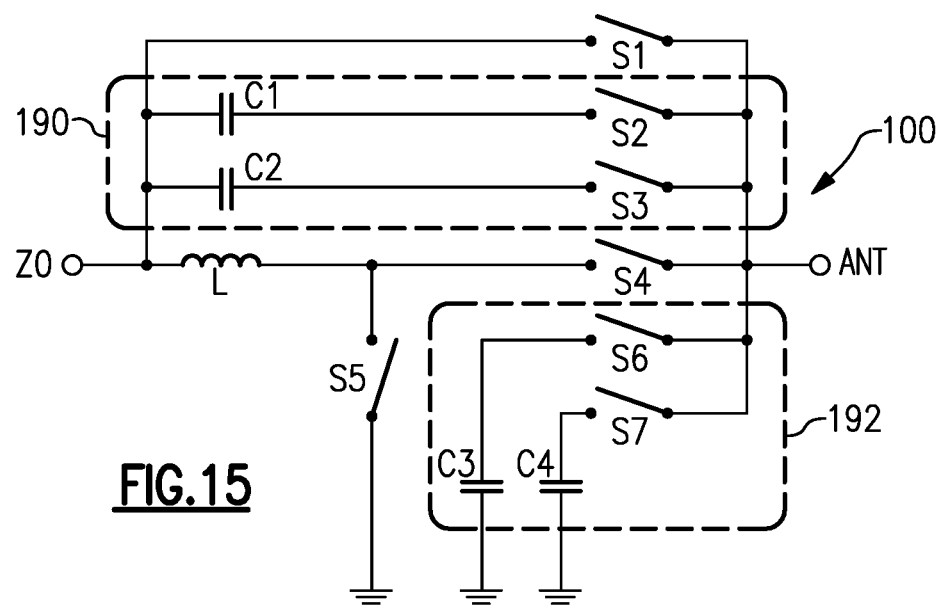
FIG. 15 show the impedance tuner circuit of FIG. 12 where parallel combination of C1 and C2 and parallel combination of C3 and C4 can be utilized to form at least some of the impedance tuner circuit's states.

In the examples of FIGS. 12 and 14, it will be understood that with C1 and C2 being implemented in parallel, and C3 and C4 being implemented in parallel, such arrangements can be configured to be similar to the examples described herein in reference to FIGS. 9 and 10. FIG. 15 shows the impedance tuner circuit 100 of FIGS. 12 and 14, with the parallel combination of C1 and C2 indicated as 190, and the parallel combination of C3 and C4 indicated as 192. FIGS. 16A-16D show four possible switching states that can be achieved by each of such parallel combinations, with $S_i$ being S2 or S6, $S_j$ being S3 or S7, $C_i$ being C1 or C3, and $C_j$ being C2 or C4.

Figure 16A:
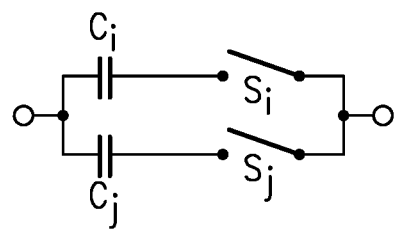
FIGS. 16A to 16D show four possible switching states that can be achieved by each of the parallel combinations of FIG. 15.
Figure 16B:
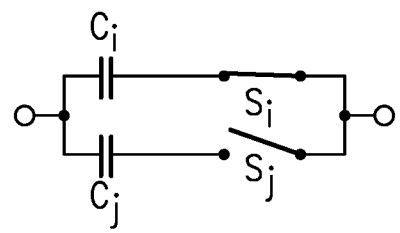
Figure 16C:
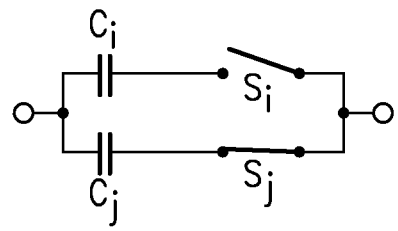
Figure 16D:
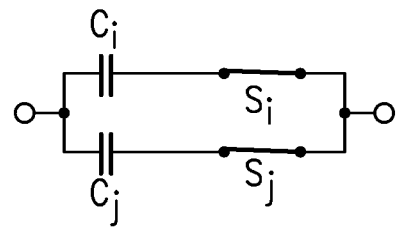

In FIG. 16A, both of the switches $S_i$ and $S_j$ are open; thus, the two end nodes are not coupled. In FIG. 16B, $S_i$ is closed, and $S_j$ is open; thus, the net capacitance is $C_i$. In FIG. 16C, $S_i$ is open, and $S_j$ is closed; thus, the net capacitance is $C_j$. In FIG. 16D, both of the switches $S_i$ and $S_j$ are closed; thus, the net capacitance is $C_i+C_j$.

Referring to the bypass and the 1 or 2-element transformations of FIGS. 14A-14G, it is noted that if the four switching states of FIGS. 16A-16D are applied to the assembly 192 of shunt switches S6 and S7, the state of FIG. 16A can facilitate at least the bypass state of Zone 0 (FIG. 14A) and the 1-element (series inductance) state of Zone 6 (FIG. 14G). The state of FIG. 16B can facilitate at least the 1-element (shunt capacitance) state of Zone 3 (FIG. 14D) and the 2-element (series inductance and shunt capacitance) state of Zone 1 (FIG. 14B). Accordingly, Zone 0 and Zone 3 can be considered to be a combined zone with different states being provided by the different switching states of the shunt switches S6 and S7. Similarly, Zone 6 and Zone 1 can be considered to be a combined zone with different states being provided by the different switching states of the shunt switches S6 and S7.

Figure 17:
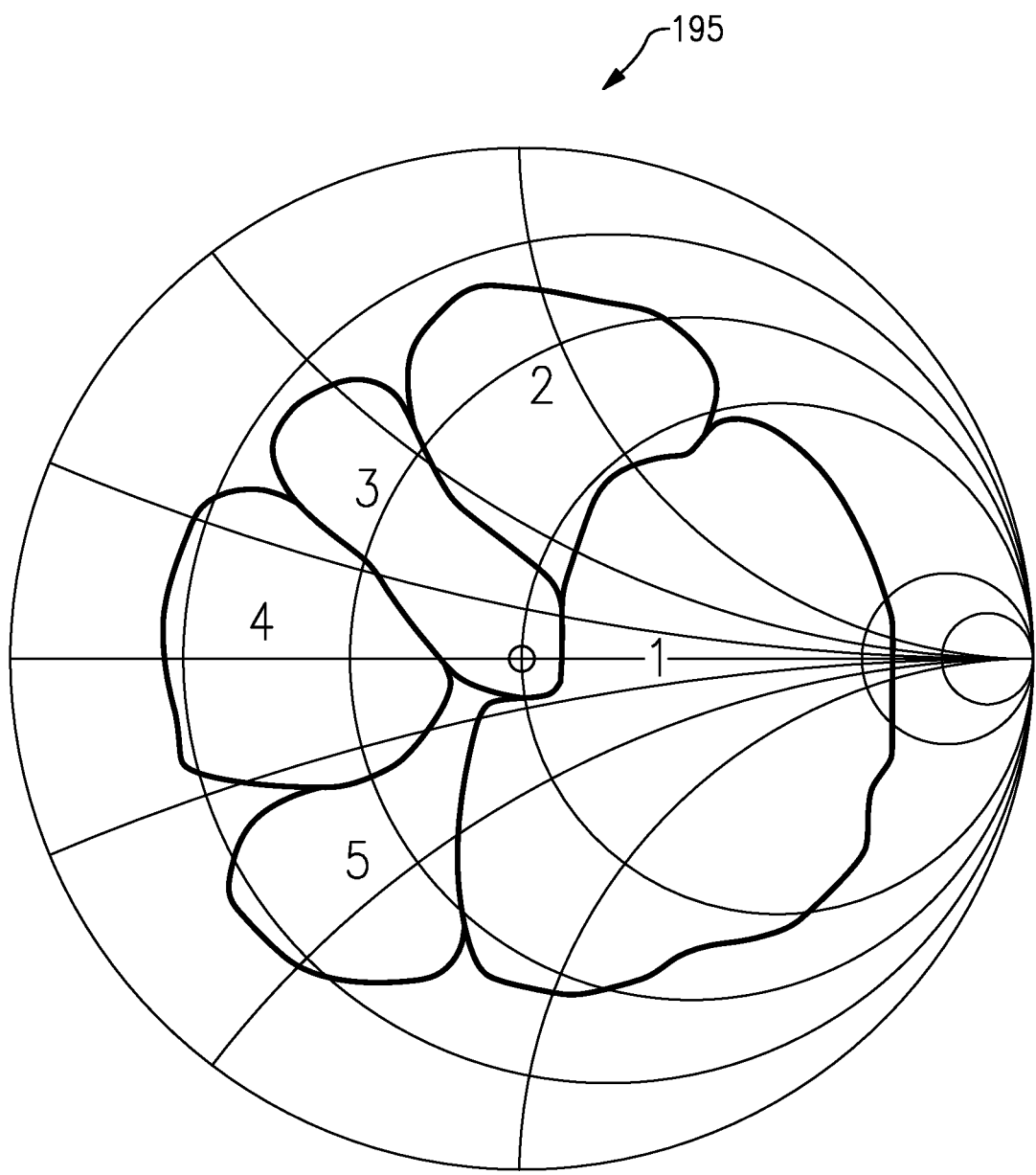
FIG. 17 shows an example where some of the impedance zones associated with FIGS. 14A to 14G can be combined based on switching states.

It is noted that the foregoing combining of Zones 0 and 3 and Zones 6 and 1 can be effectuated by using two of the four possible switching states of the shunt switches S6 and S7. When one includes all four possible switching states of S6 and S7, as well as all four switching states of series switches S2 and S3, and considering that there are now five zones, a relatively large 80 switching states (5×4×4) can be achieved. If all 80 impedance states corresponding to the 80 switching states are implemented, the five zones can have shapes (on a Smith chart) that vary from a circle or a combination of two circles. Such varied shapes of the five zones are depicted in a Smith chart representation 195 of FIG. 17.

Figure 18:
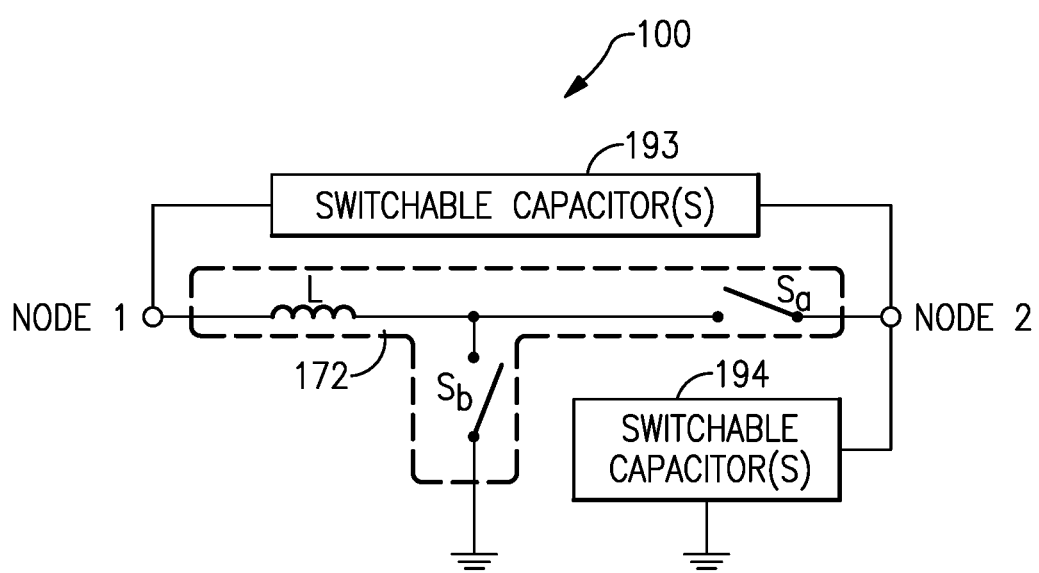
FIG. 18 shows that in some embodiments, an impedance tuner circuit having one or more features as described herein can be based on an inductance that can be switched to provide functionalities including an open circuit, a series inductance and a shunt inductance.

The impedance tuner circuit 100 of FIGS. 12 and 14 is an example where a single inductance L implemented between two nodes can provide a series inductance or a shunt inductance to yield a respective impedance transformation by operation of a switching circuit. FIG. 18 shows that in some embodiments, an impedance tuner circuit 100 can be based on an inductance L that can be switched to provide functionalities including an open circuit, a series inductance and a shunt inductance.

More particularly, a circuit assembly 172 can be provided between a first node (Node 1) (such as node Z0 in FIG. 12) and a second node (Node 2) (such as node ANT in FIG. 12). The circuit assembly 172 can include an inductance L (e.g., an inductor) with one end coupled to the first node and a second end coupled to the second node through a switch $S_a$. The circuit assembly 172 can further include a switch $S_b$ that provides a switchable path from a node between the inductance L and the switch $S_a$. Accordingly, if each of $S_a$ and $S_b$ is open, Node 1 is disconnected from ground, and also disconnected from Node 2. If $S_a$ is closed and $S_b$ is open, the inductance L acts as a series inductance between Node 1 and Node 2. If $S_a$ is open and $S_b$ is closed, the inductance L acts as a shunt inductance with respect to Node 1. If each of $S_a$ and $S_b$ is closed to form a state that may or may not be used, Node 1 is connected to ground through the inductance L, and also connected to Node 2 through the inductance L.

Referring to FIG. 18, the impedance tuner circuit 100 can further include a circuit 193 implemented between the first and second nodes, and having one or more switchable capacitors. In some embodiments, such a circuit can include a bypass path. In some embodiments, the circuit 193 can include the three example parallel paths associated with the switches S1, S2, S3 in the impedance tuner circuit 100 of FIG. 12.

Referring to FIG. 18, the impedance tuner circuit 100 can further include a circuit 194 implemented between the second node and ground, and having one or more switchable capacitors. In some embodiments, the circuit 194 can include the two example parallel paths associated with the switches S6, S7 in the impedance tuner circuit 100 of FIG. 12.

Figure 19A:
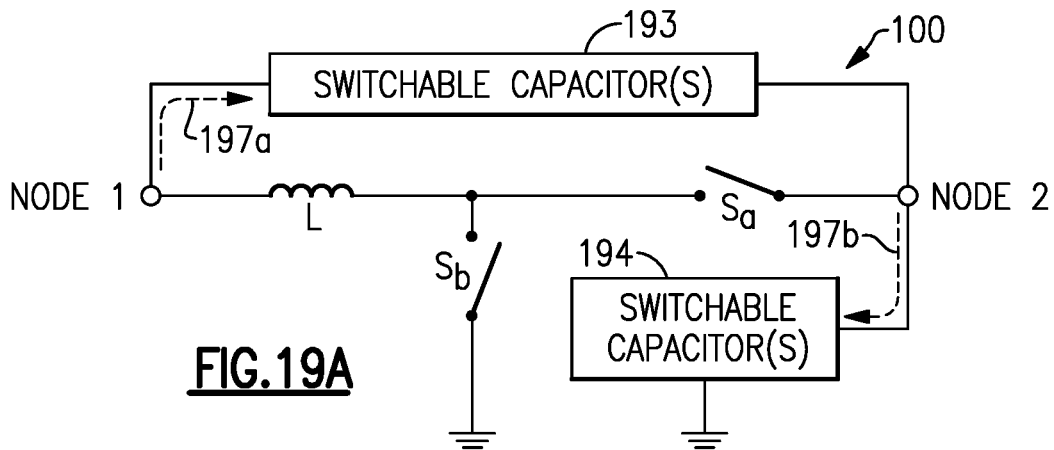
FIGS. 19A to 19C show examples of the functionalities for the switchable inductance of FIG. 18.
Figure 19B:
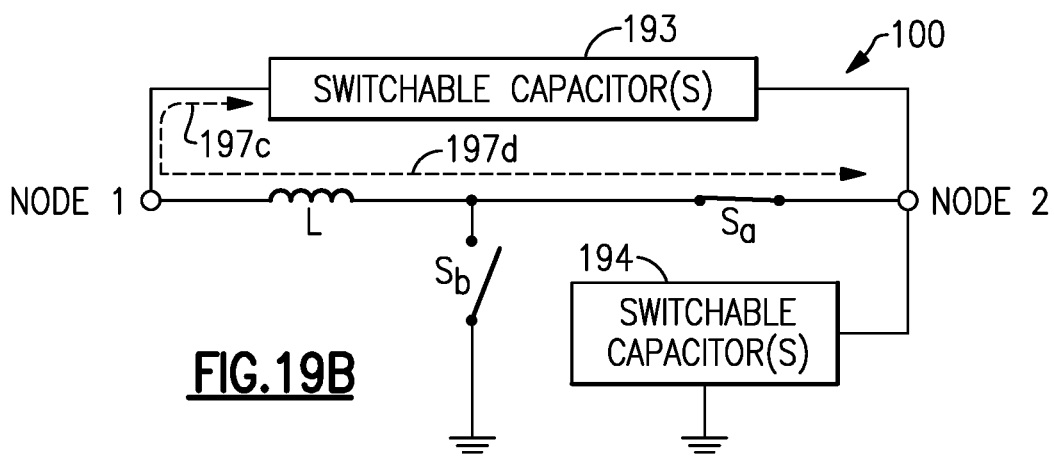
Figure 19C:
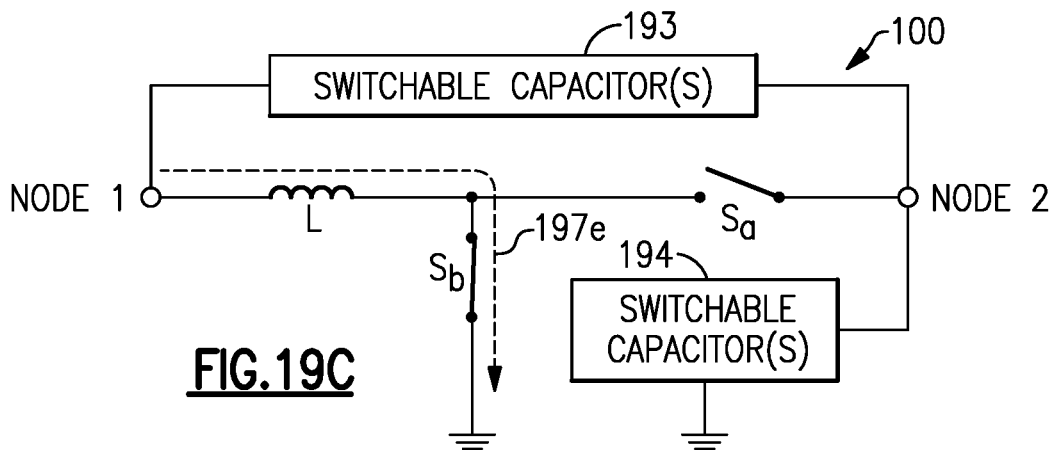

FIGS. 19A to 19C show example states of the impedance tuner circuit 100 of FIG. 18, where the impedance L is not utilized (FIG. 19A), utilized as a series inductance (FIG. 19B), and utilized as a shunt inductance (FIG. 19C). More particularly, FIG. 19A shows a state of the impedance tuner circuit 100 with each of the switches $S_a$ and $S_b$ being open. Accordingly, the inductance L is not being utilized as a series inductance or a shunt inductance. In such a state, either or both of the circuits 193 and 194 can be enabled, such that either or both of couplings 197a (between Node 1 and Node 2) and 197b (between Node 2 and ground) are present.

FIG. 19B shows a state of the impedance tuner circuit 100 with the switch $S_a$ being closed and $S_b$ being open. Accordingly, the inductance L is being utilized as a series inductance. In such a state, Node 1 is coupled to Node 2 through the inductance L to provide a coupling 197d, and the circuit 193 may or may not be enabled. If enabled, a coupling 197c can be present between Node 1 and Node 2. Similarly, the circuit 194 may or may not be enabled.

FIG. 19C shows a state of the impedance tuner circuit 100 with the switch $S_a$ being open and $S_b$ being closed. Accordingly, the inductance L is being utilized as a shunt inductance with respect to Node 1 to provide a coupling 197e. In such a state, the circuit 193 may or may not be enabled. Similarly, the circuit 194 may or may not be enabled.

In many wireless applications, it is desirable to provide an electrostatic discharge (ESD) protection circuit relative to an antenna. Such an ESD protection circuit can include a DC-short path (e.g., an inductor) to ground from an antenna node.

Figure 20:
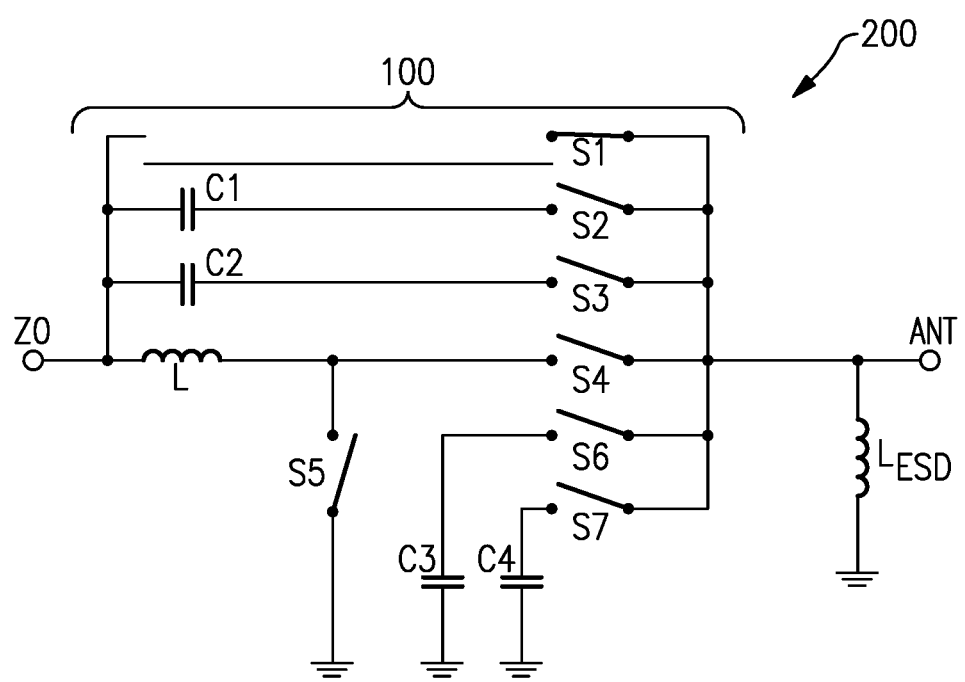
FIG. 20 shows an example antenna tuning architecture where an ESD inductor is provided to DC-couple the antenna node to ground.

In some embodiments, such an ESD protection can be provided with the antenna. FIG. 20 shows an example antenna tuning architecture 200 where an ESD inductor ($L_{ESD}$) is provided to DC-couple the antenna node (ANT) to ground. In the example of FIG. 20, such an ESD inductor is assumed to be provided with the antenna, such that an impedance tuner circuit 100 does not include an ESD inductor. In FIG. 20, the impedance tuner circuit 100 is similar to the example of FIG. 12. However, it will be understood that a similar antenna tuning architecture can be implemented with other embodiments of the impedance tuner circuit as described herein.

In some embodiments, an impedance tuner circuit, a related product such as a die and/or a packaged module, or some combination thereof, can include its own ESD protection circuit such as an ESD inductor. Such a feature can be desirable in wireless applications where an ESD inductor is not present with an antenna, or in situations where the presence of such an ESD inductor is not known. In some embodiments, such a feature (an ESD inductor dedicated with the impedance tuner circuit) can allow further performance tuning of the impedance tuner circuit.

Figure 21:
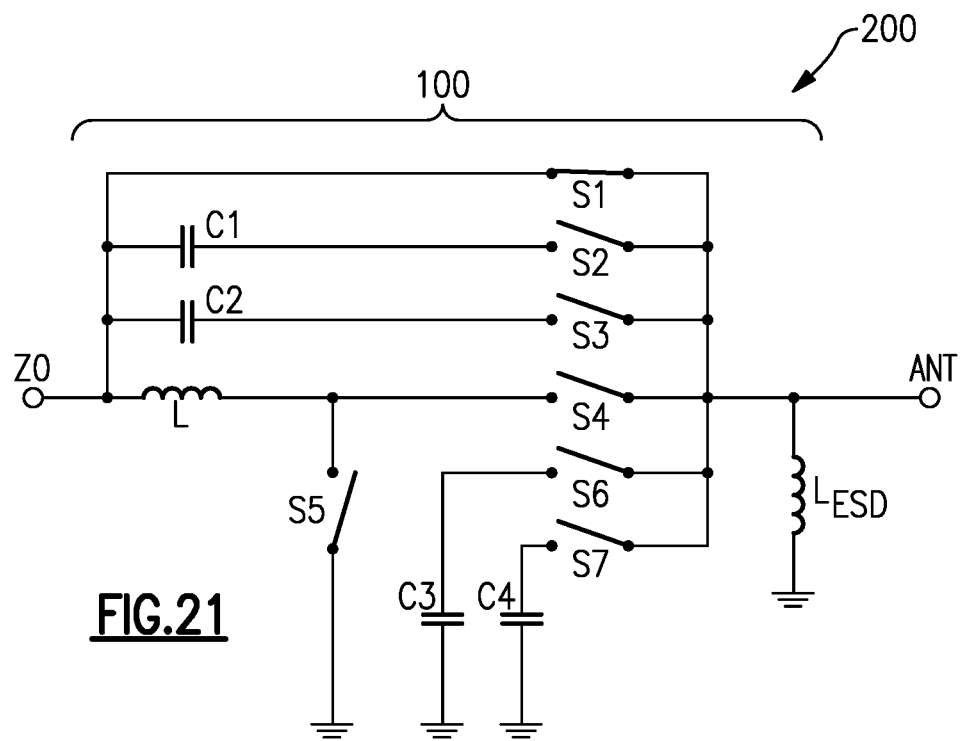
FIG. 21 shows that in some embodiments, an impedance tuner circuit can include an ESD inductor.

FIG. 21 shows an example antenna tuning architecture 200 similar to the example of FIG. 20. In FIG. 21, however, an ESD inductor ($L_{ESD}$) is depicted as being a part of the impedance tuner circuit 100. In such a configuration, because the ESD inductor is part of the impedance tuner circuit 100, its inductance value relative to other component(s) can be selected with greater flexibility than the configuration of FIG. 20.

For example, and referring to FIG. 21, consider the impedance tuner circuit 100 operating in a bypass mode. In such a mode, switch S1 is ON, and all other switches are OFF. Some or all of such switches in the OFF state collectively provide an off-capacitance that typically provides an undesirable parasitic effect.

Figure 22:
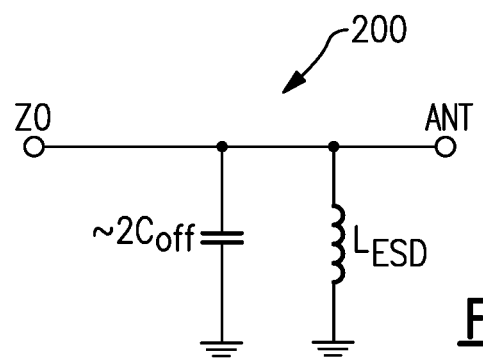
FIG. 22 depicts an approximately equivalent circuit of the antenna tuner circuit of FIG. 21 in a bypass mode.

It is noted that in the foregoing bypass mode, the effect of the off-capacitance is mostly manifested as some shunt capacitance (e.g., having a value of about $2C_{off}$). Thus, FIG. 22 depicts an approximately equivalent circuit of the antenna tuning architecture 200 in the bypass mode. In such an equivalent circuit, the off-capacitance manifested as shunt capacitance ($\sim 2C_{off}$) is shown with the ESD inductor ($L_{ESD}$).

In some embodiments, the inductance value of the ESD inductor ($L_{ESD}$) can be selected to tune out or reduce the parasitic effect of the shunt capacitance ($\sim 2C_{off}$) at, for example, the center frequency of a signal being passed through the impedance tuner circuit 100. Such a selection of $L_{ESD}$ can be more practical in situations where a particular inductance value for ESD protection (by DC coupling) is not critical.

Figure 23:
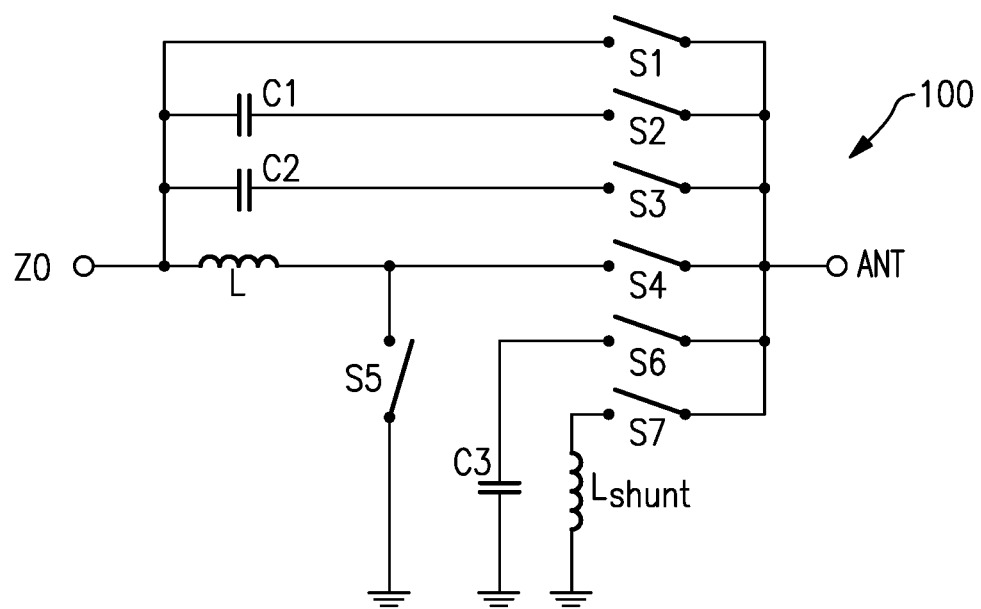
FIG. 23 shows that in some embodiments, an antenna tuner circuit having one or more features as described herein can include a switchable inductance for coupling an antenna node to ground.

In the examples of impedance tuner circuits of FIGS. 9 and 12, the switchable paths to ground from the antenna node are switchable capacitive paths. FIG. 23 shows that in some embodiments, an impedance tuner circuit 100 can be configured to include a switchable inductive path to ground from an antenna node (ANT). Such a switchable inductive path can include a switch S7 arranged in series with an inductance $L_{shunt}$ (e.g., an inductor), between the antenna node and the ground. For the example of FIG. 23, other than the switch S7 being associated with the inductance $L_{shunt}$ instead of a capacitance, remainder of the impedance tuner circuit 100 can be similar to the example of FIG. 12. It will be understood that the switchable inductive path from the antenna node to ground can also be implemented with an impedance tuner circuit similar to that of the example of FIG. 9.

In some embodiments, the impedance tuner circuit 100 of FIG. 23 can be configured to provide effective antenna tuning for some frequency ranges such as 5 GHz WLAN frequency range (5150-5875 MHz). Examples related to the configuration of FIG. 23 are described herein in greater detail.

Figure 24:
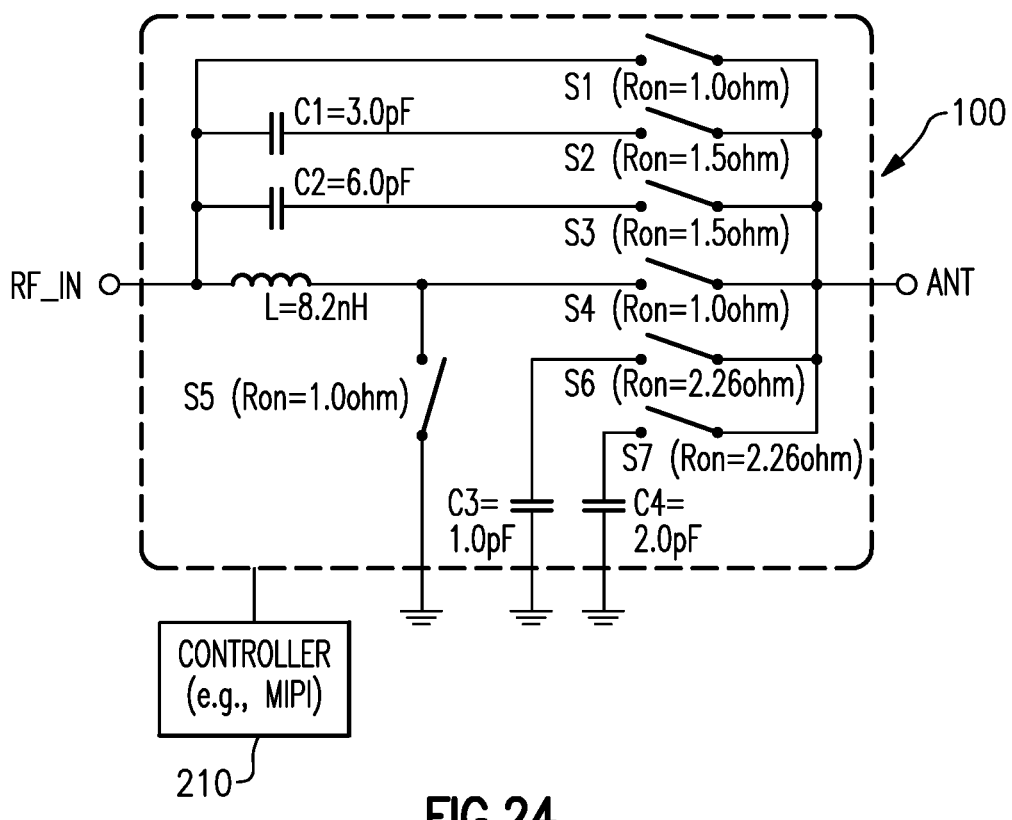
FIG. 24 shows an example where the antenna tuner circuit of FIG. 12 is configured as a lowband (LB) antenna tuner.

FIG. 24 shows an example where the impedance tuner circuit 100 of FIG. 12 is configured to support a lowband (LB) frequency range (617-960 MHz). FIG. 24 also shows that in some embodiments, operation of such an impedance tuner circuit can be facilitated by a controller 210 utilizing, for example, Mobile Industry Processor Interface (MIPI) based signals. Such control signals can be utilized to, for example, control the states of the various switches of the impedance tuner circuit 100.

Table 3 lists example values of capacitances, inductance and switch on-resistances (Ron) associated with the impedance tuner circuit 100 of FIG. 24 configured for LB operation.

TABLE 3

| Circuit element | Electrical property |
|---|---|
| S1 | Ron = 1.0 ohm |
| S2 | Ron = 1.5 ohm |
| S3 | Ron = 1.5 ohm |
| S4 | Ron = 1.0 ohm |
| S5 | Ron = 1.0 ohm |
| S6 | Ron = 2.26 ohm |
| S7 | Ron = 2.26 ohm |
| L | Inductance = 8.2 nH |
| C1 | Capacitance = 3.0 pF |
| C2 | Capacitance = 6.0 pF |
| C3 | Capacitance = 1.0 pF |
| C4 | Capacitance = 2.0 pF |

It is noted that the impedance tuner circuit 100 of FIG. 24 includes seven switches. Assuming that each switch can be in an ON (or 1) state or an OFF (or 0) state, the impedance tuner circuit 100 itself can have a total of $2^7=128$ switching states. It is further noted that some of such 128 states may not be utilized, or achieve similar functionality of the impedance tuner circuit 100.

Table 4 lists examples of states of the seven switches that can provide various switching configurations for the impedance tuner circuit 100 of FIG. 24. In Table 4, Tune State value refers to the corresponding switching state of the impedance tuner circuit 100, and 1 or 0 refers to ON or OFF states, respectively, of the switches.

TABLE 4

| Tune state | S1 | S2 | S3 | S4 | S5 | S6 | S7 |
|---|---|---|---|---|---|---|---|
| 1 | 0 | 0 | 1 | 0 | 0 | 0 | 0 |
| 2 | 0 | 0 | 1 | 0 | 0 | 0 | 1 |
| 3 | 0 | 0 | 1 | 0 | 0 | 1 | 0 |
| 4 | 0 | 0 | 1 | 0 | 0 | 1 | 1 |
| 5 | 0 | 1 | 0 | 0 | 0 | 0 | 0 |
| 6 | 0 | 1 | 0 | 0 | 0 | 0 | 1 |
| 7 | 0 | 1 | 0 | 0 | 0 | 1 | 0 |
| 8 | 0 | 1 | 0 | 0 | 0 | 1 | 1 |
| 9 | 0 | 1 | 1 | 0 | 0 | 0 | 0 |
| 10 | 0 | 1 | 1 | 0 | 0 | 0 | 1 |
| 11 | 0 | 1 | 1 | 0 | 0 | 1 | 0 |
| 12 | 0 | 1 | 1 | 0 | 0 | 1 | 1 |

TABLE 4-continued

| Tune state | S1 | S2 | S3 | S4 | S5 | S6 | S7 |
|---|---|---|---|---|---|---|---|
| 13 | 0 | 0 | 1 | 0 | 1 | 0 | 0 |
| 14 | 0 | 0 | 1 | 0 | 1 | 0 | 1 |
| 15 | 0 | 0 | 1 | 0 | 1 | 1 | 0 |
| 16 | 0 | 0 | 1 | 0 | 1 | 1 | 1 |
| 17 | 0 | 1 | 0 | 0 | 1 | 0 | 0 |
| 18 | 0 | 1 | 0 | 0 | 1 | 0 | 1 |
| 19 | 0 | 1 | 0 | 0 | 1 | 1 | 0 |
| 20 | 0 | 1 | 0 | 0 | 1 | 1 | 1 |
| 21 | 0 | 1 | 1 | 0 | 1 | 0 | 0 |
| 22 | 0 | 1 | 1 | 0 | 1 | 0 | 1 |
| 23 | 0 | 1 | 1 | 0 | 1 | 1 | 0 |
| 24 | 0 | 1 | 1 | 0 | 1 | 1 | 1 |
| 25 | 0 | 0 | 0 | 1 | 0 | 0 | 0 |
| 26 | 0 | 0 | 0 | 1 | 0 | 0 | 1 |
| 27 | 0 | 0 | 0 | 1 | 0 | 1 | 0 |
| 28 | 0 | 0 | 0 | 1 | 0 | 1 | 1 |
| 29 | 0 | 1 | 0 | 1 | 0 | 0 | 0 |
| 30 | 0 | 1 | 0 | 1 | 0 | 0 | 1 |
| 31 | 0 | 1 | 0 | 1 | 0 | 1 | 0 |
| 32 | 0 | 1 | 0 | 1 | 0 | 1 | 1 |
| 33 | 1 | 0 | 0 | 0 | 0 | 0 | 0 |
| 34 | 1 | 0 | 0 | 0 | 0 | 0 | 1 |
| 35 | 1 | 0 | 0 | 0 | 0 | 1 | 0 |
| 36 | 1 | 0 | 0 | 0 | 0 | 1 | 1 |
| 37 | 1 | 0 | 0 | 0 | 1 | 0 | 0 |
| 38 | 1 | 0 | 0 | 0 | 1 | 0 | 1 |
| 39 | 1 | 0 | 0 | 0 | 1 | 1 | 0 |
| 40 | 1 | 0 | 0 | 0 | 1 | 1 | 1 |
| 41 | 1 | 0 | 0 | 1 | 0 | 0 | 0 |
| 42 | 1 | 0 | 0 | 1 | 0 | 0 | 1 |
| 43 | 1 | 0 | 0 | 1 | 0 | 1 | 0 |
| 44 | 1 | 0 | 0 | 1 | 0 | 1 | 1 |

Figure 25A:
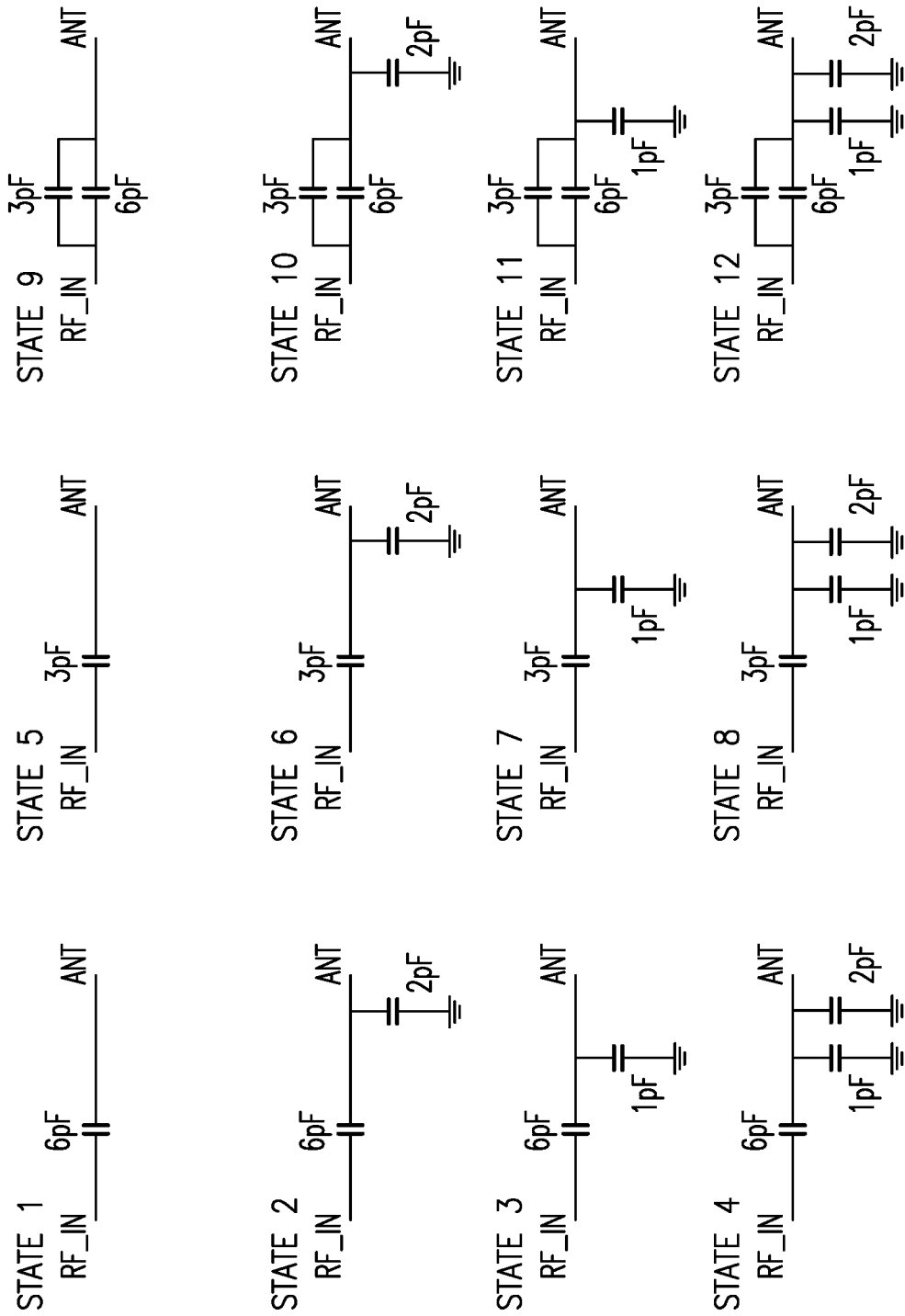
FIGS. 25A to 25D show examples of equivalent circuits associated with various switching states of the LB antenna tuner of FIG. 24.

FIGS. 25A to 25D show equivalent circuits corresponding to the various tune states of Table 4, for the impedance tuner circuit 100 of FIG. 24. FIG. 25A includes examples where the inductance L is not being utilized. For example, in State 1, S3 is ON and all other switches are OFF; thus, capacitance of C2=6.0 pF is provided between the RF_IN node and the ANT node in the impedance tuner circuit 100 of FIG. 24.

Figure 25B:
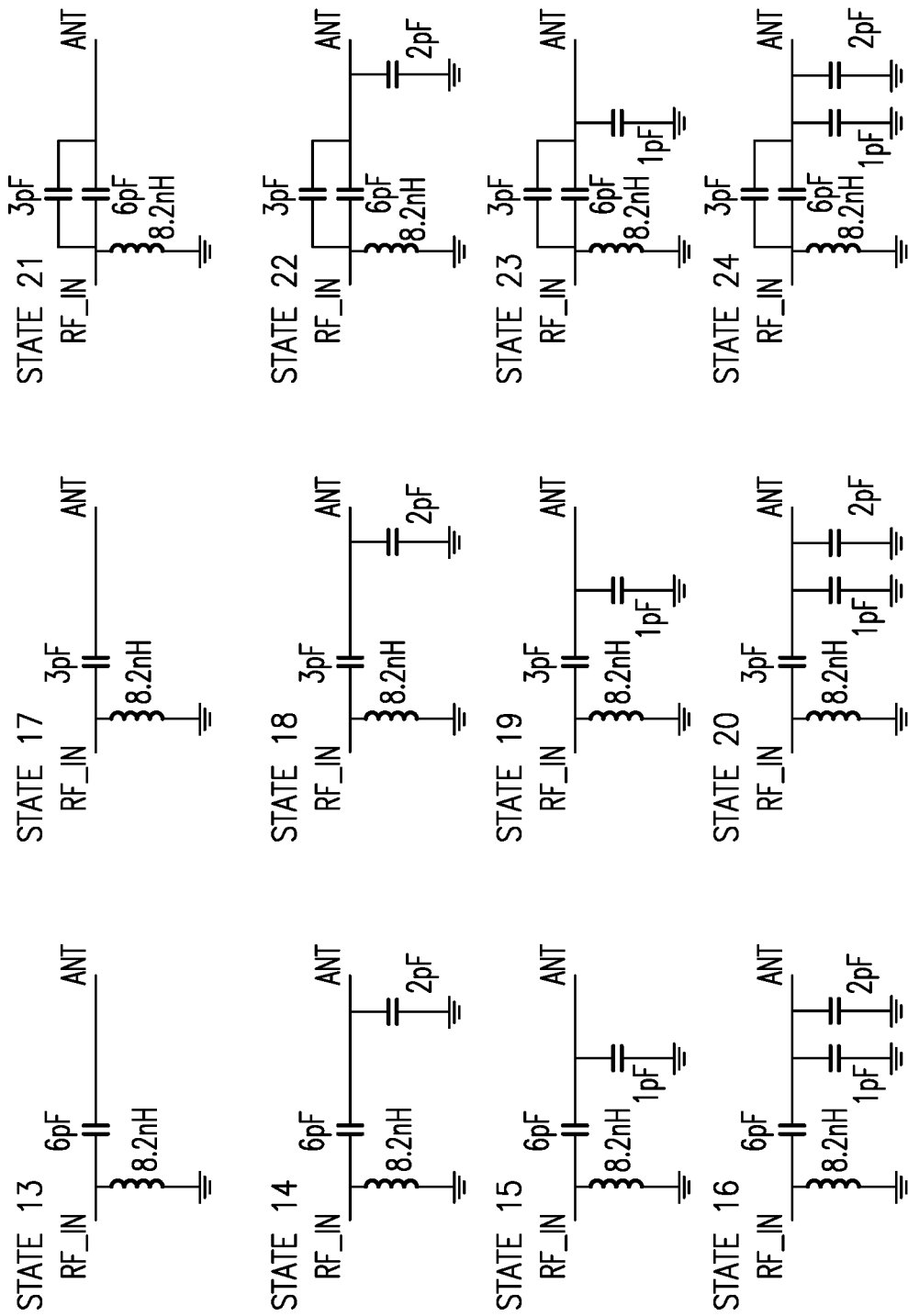

FIG. 25B includes examples where the inductance L is being utilized as a shunt inductance. For example, in State 13, S3 and S5 are ON and all other switches are OFF; thus, capacitance of C2=6.0 pF is provided between the RF_IN node and the ANT node, and shunt inductance L=8.2 nH is provided, in the impedance tuner circuit 100 of FIG. 24.

Figure 25C:
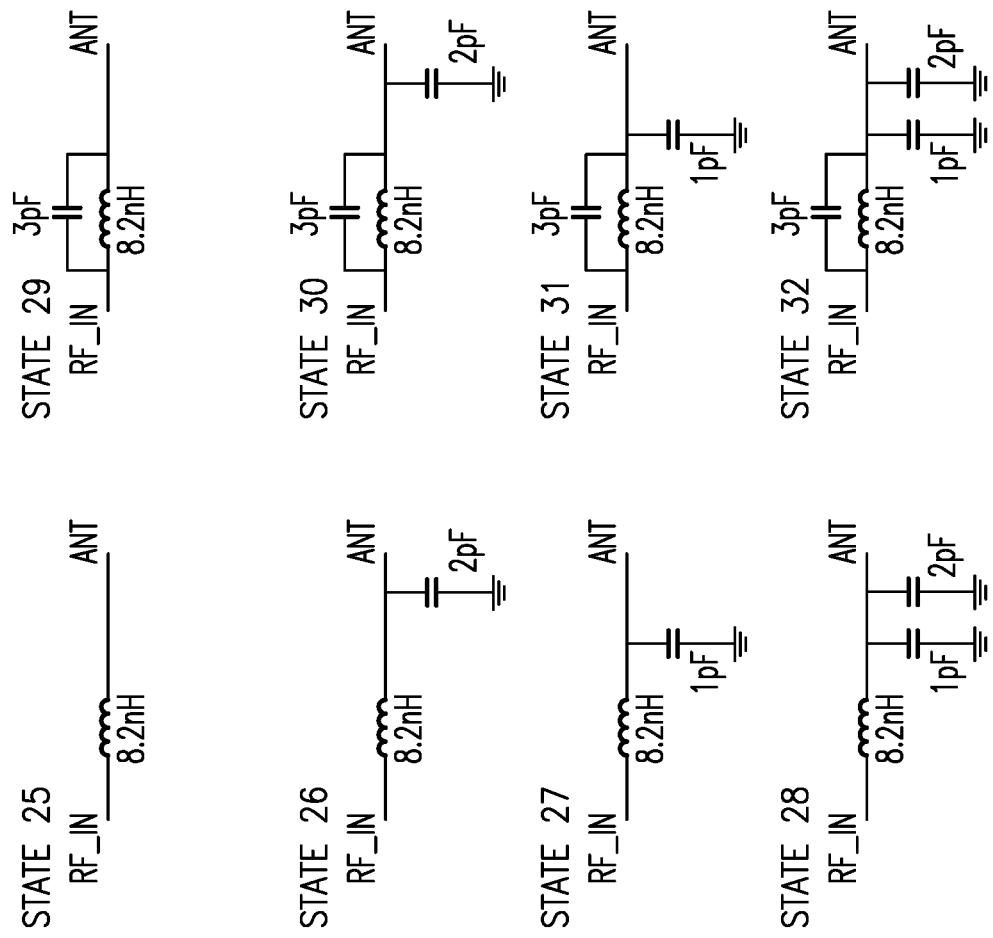

FIG. 25C includes examples where the inductance L is being utilized as a series inductance. For example, in State 25, S4 is ON and all other switches are OFF; thus, series inductance L=8.2 nH is provided, in the impedance tuner circuit 100 of FIG. 24.

Figure 25D:
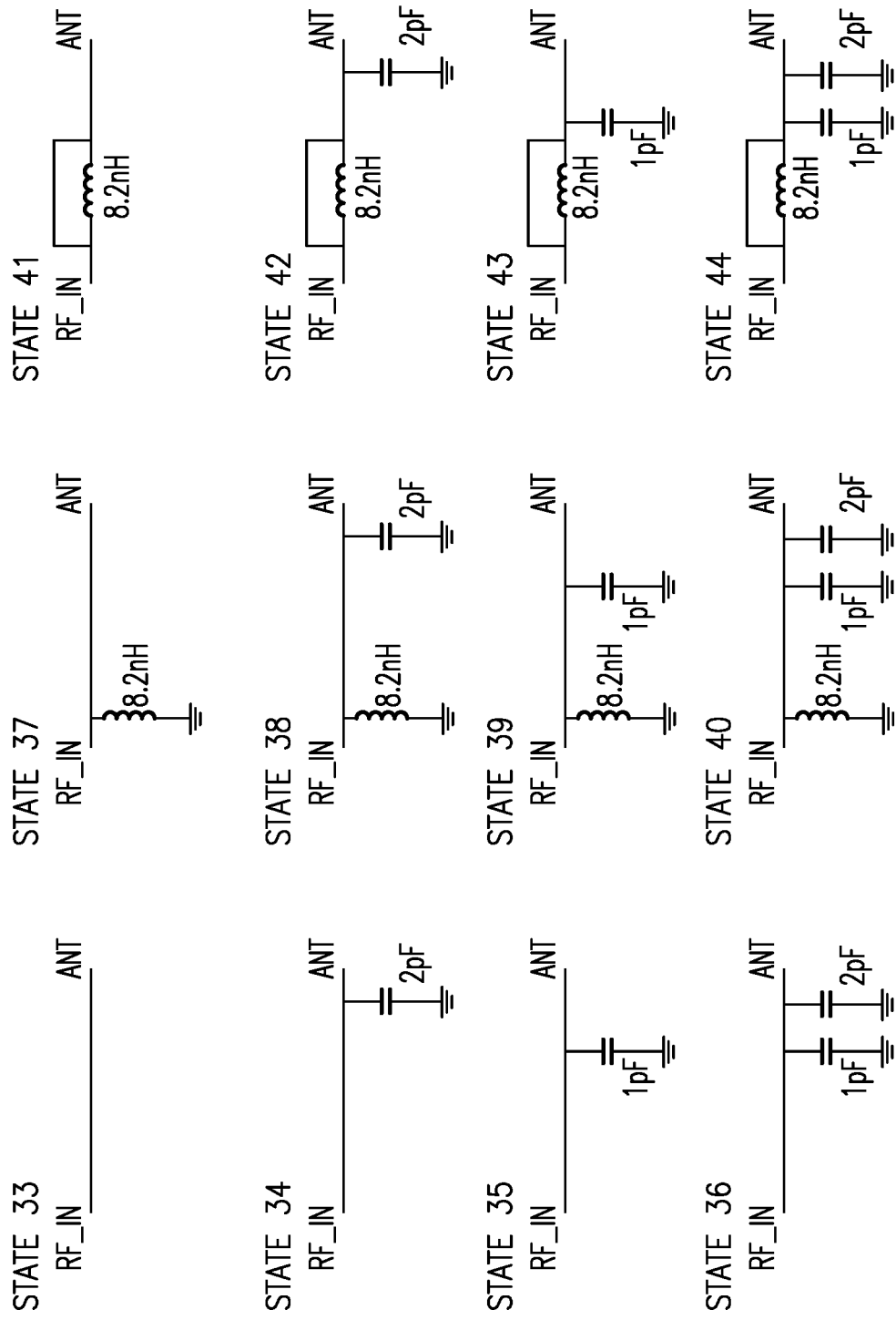

FIG. 25D includes other example states that can be implemented for the impedance tuner circuit 100 of FIG. 24. For example, in State 33, S1 is ON and all other switches are OFF, so as to provide a bypass path between the RF_IN node and the ANT node.

In another example, in State 41, S1 and S4 are ON and all other switches are OFF, so as to provide a parallel combination of the bypass path associated with S1 and the series inductance path associated with S4. It is noted that States 41 and 42 provide the lowest bypass loss among states where the bypass path switch S1 is ON. Thus, in some embodiments, a bypass functionality (e.g., for the impedance tuner circuit 100 of FIG. 24) can be achieved by including a parallel combination of a bypass path and a series inductor between two nodes (e.g., RF input and antenna nodes).

FIGS. 26 to 32 show examples of tuning performance for some of the tune states of Table 4 and FIGS. 24 and 25. For example, FIG. 26A shows an impedance state 220a presented by an antenna 104 to an antenna node along a signal path 105 without a tuning circuit. Such an impedance state is shown to be significantly mismatched from a desired impedance state at the center of the Smith chart.

Figure 26A:
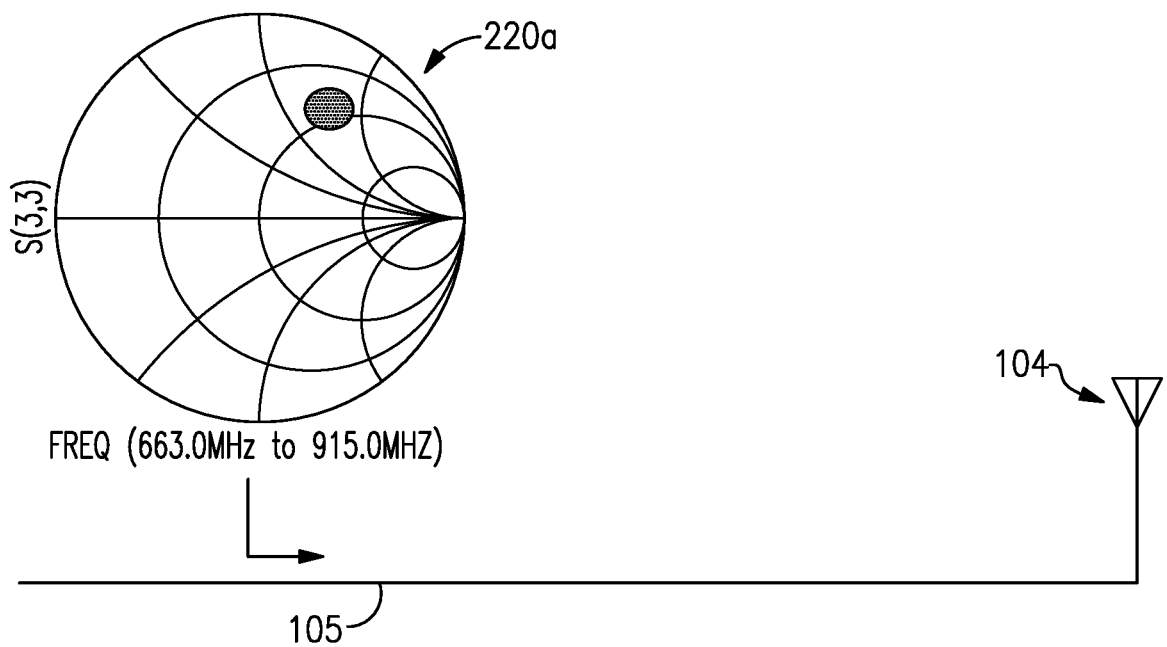
FIGS. 26A and 26B show an impedance tuning provided by an example switching state of the LB antenna tuner of FIG. 24.
Figure 26B:
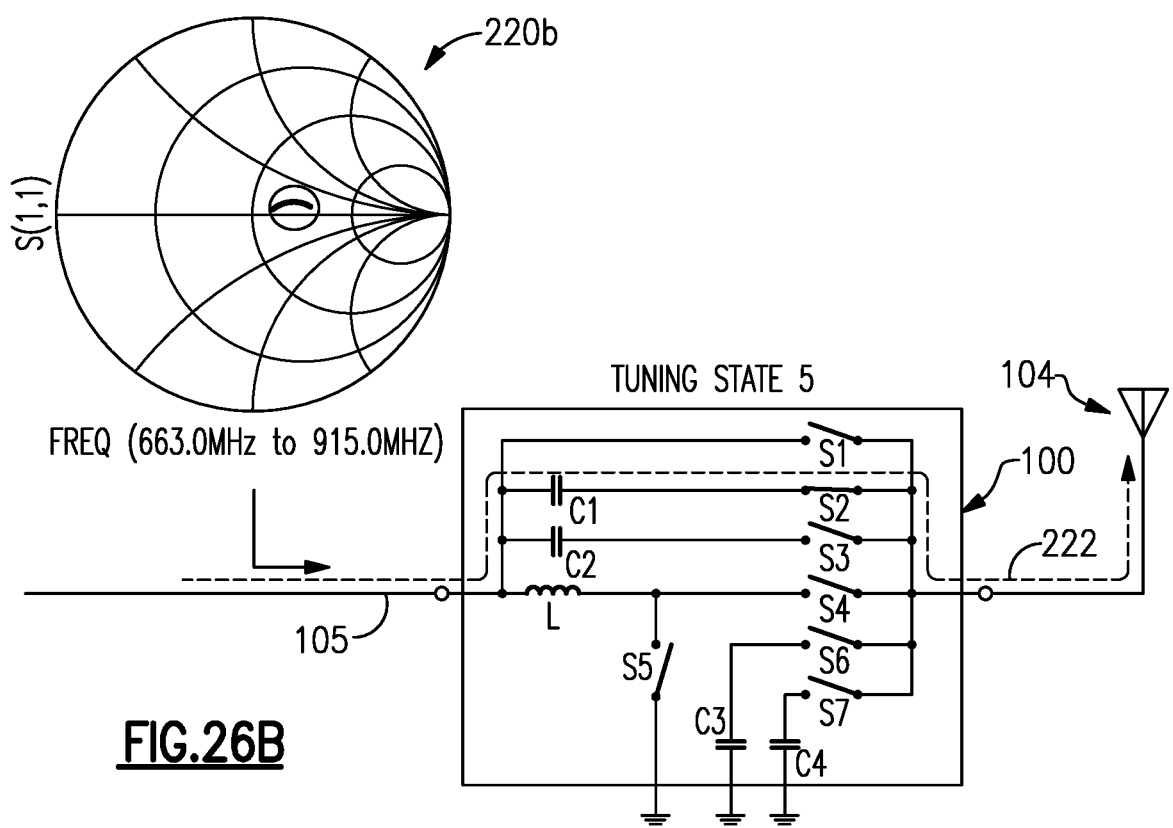

FIG. 26B shows an impedance state 220b presented to the antenna node along a signal path 105 with a tuning circuit 100 (e.g., the impedance tuner circuit 100 of FIG. 24) in State 5 (S2 ON, and all other switches OFF). Thus, a signal path 222, with a series capacitance (C1=3.0 pF), is provided to the antenna 104. With such tuning in LB operation, the tuned impedance 220b is shown to be at or closer to the desired impedance state at the center of the Smith chart.

Figure 27A:
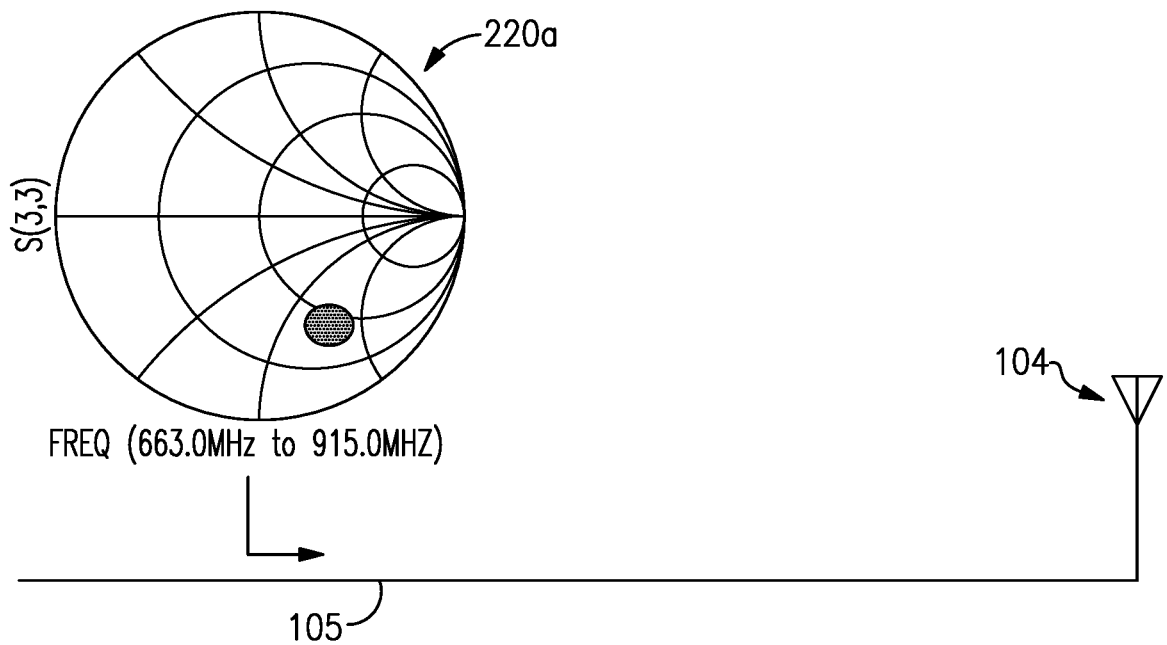
FIGS. 27A and 27B show an impedance tuning provided by another example switching state of the LB antenna tuner of FIG. 24.

In another example, FIG. 27A shows an impedance state 220a presented by an antenna 104 to an antenna node along a signal path 105 without a tuning circuit. Such an impedance state is shown to be significantly mismatched from a desired impedance state at the center of the Smith chart.

Figure 27B:
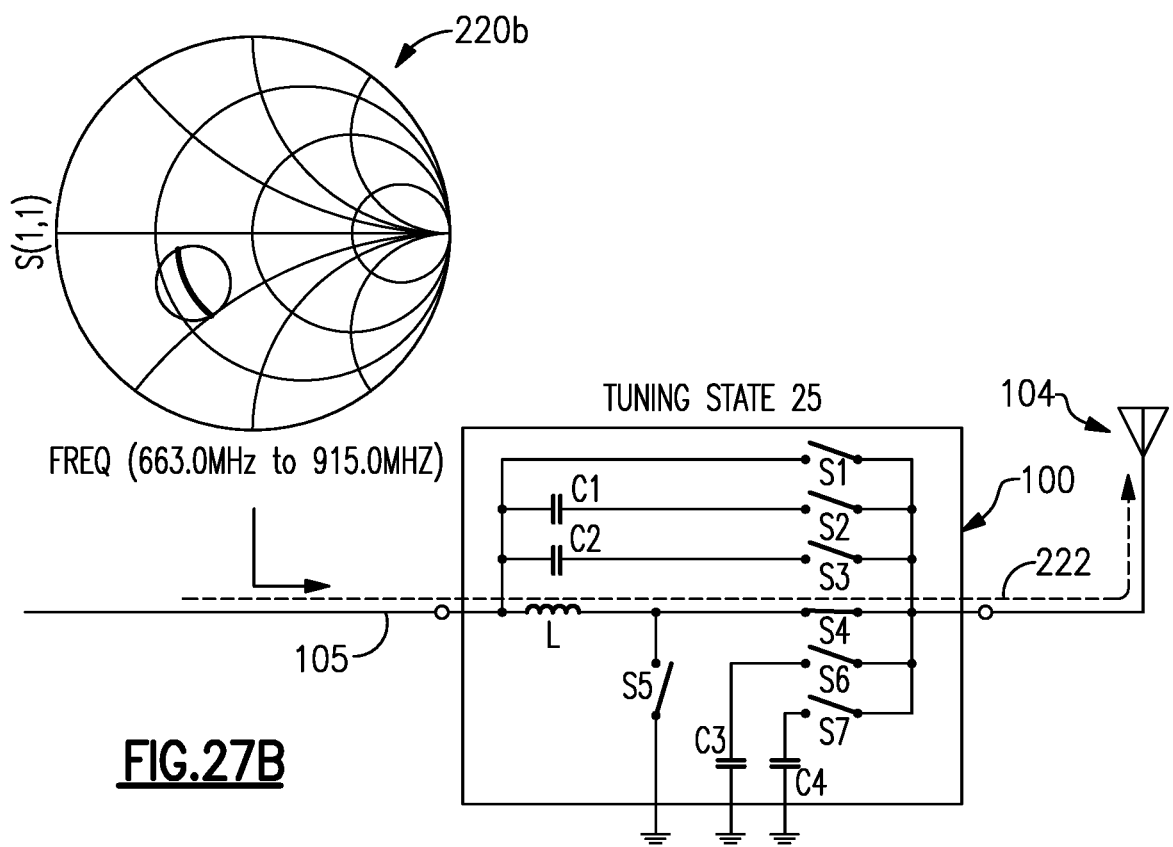

FIG. 27B shows an impedance state 220b presented to the antenna node along a signal path 105 with a tuning circuit 100 (e.g., the impedance tuner circuit 100 of FIG. 24) in State 25 (S4 ON, and all other switches OFF). Thus, a signal path 222, with a series inductance (L=8.2 nH), is provided to the antenna 104. With such tuning in LB operation, the tuned impedance 220b is shown to be at or closer to the desired impedance state at the center of the Smith chart.

Figure 28A:
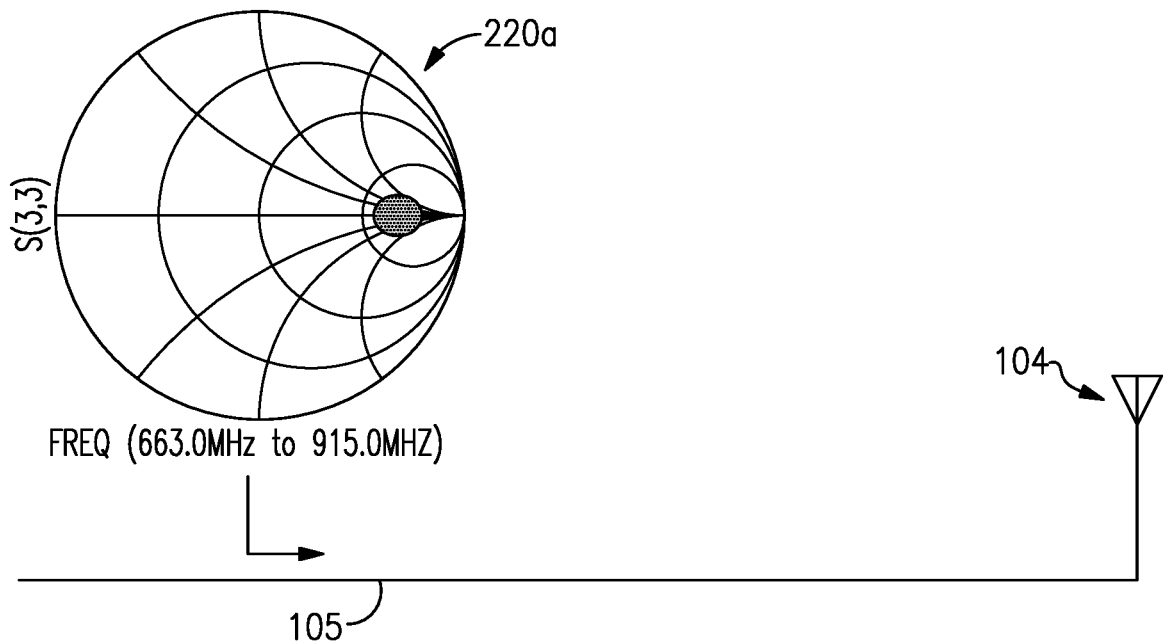
FIGS. 28A and 28B show an impedance tuning provided by yet another example switching state of the LB antenna tuner of FIG. 24.

In yet another example, FIG. 28A shows an impedance state 220a presented by an antenna 104 to an antenna node along a signal path 105 without a tuning circuit. Such an impedance state is shown to be significantly mismatched from a desired impedance state at the center of the Smith chart.

Figure 28B:
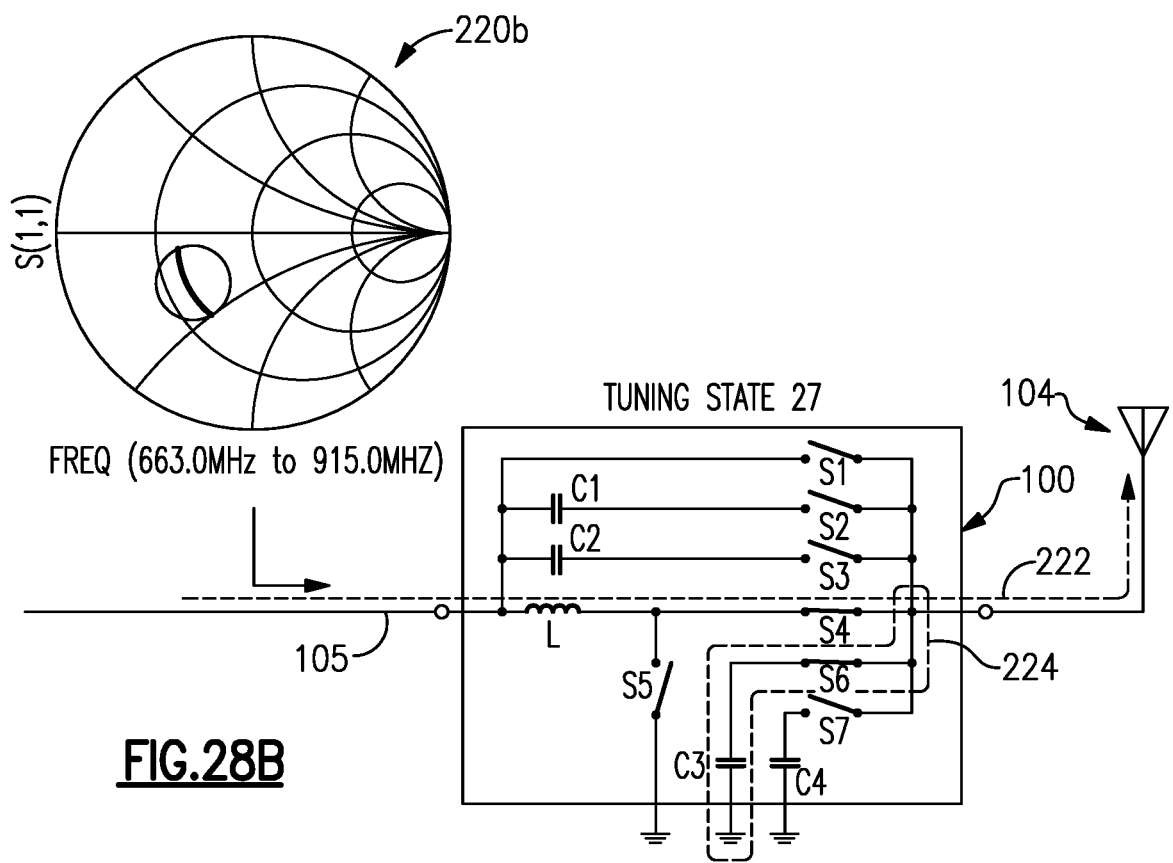

FIG. 28B shows an impedance state 220b presented to the antenna node along a signal path 105 with a tuning circuit 100 (e.g., the impedance tuner circuit 100 of FIG. 24) in State 27 (S4 and S6 ON, and all other switches OFF). Thus, a signal path 222 (with a series inductance (L=8.2 nH)) and a shunt capacitance (C3=1.0 pF) coupling 224 are provided. With such tuning in LB operation, the tuned impedance 220b is shown to be at or closer to the desired impedance state at the center of the Smith chart.

Figure 29A:
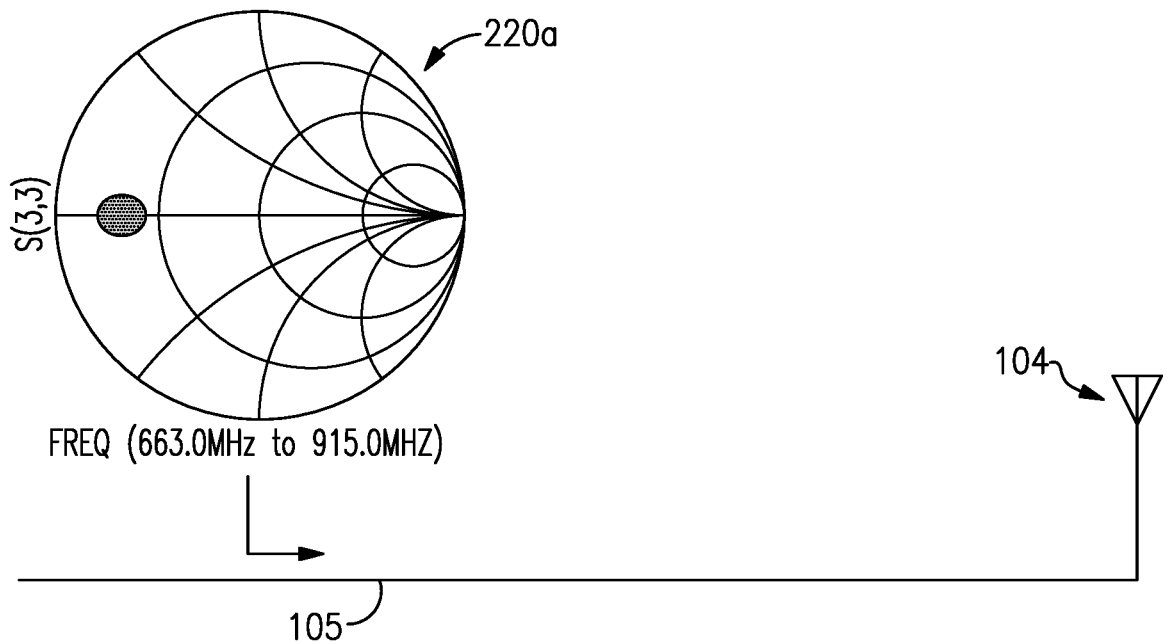
FIGS. 29A and 29B show an impedance tuning provided by yet another example switching state of the LB antenna tuner of FIG. 24.

In yet another example, FIG. 29A shows an impedance state 220a presented by an antenna 104 to an antenna node along a signal path 105 without a tuning circuit. Such an impedance state is shown to be significantly mismatched from a desired impedance state at the center of the Smith chart.

Figure 29B:
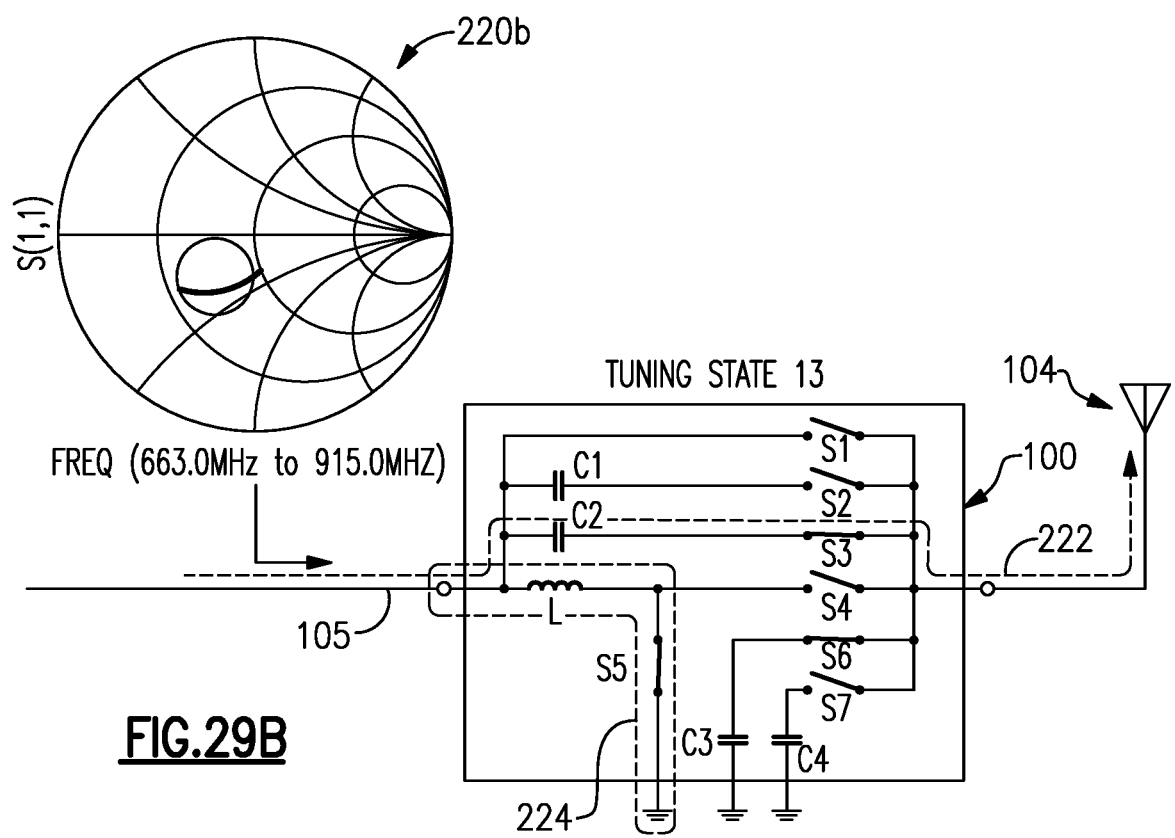

FIG. 29B shows an impedance state 220b presented to the antenna node along a signal path 105 with a tuning circuit 100 (e.g., the impedance tuner circuit 100 of FIG. 24) in State 13 (S3 and S5 ON, and all other switches OFF). Thus, a signal path 222 (with a series capacitance (C2=6.0 pF)) and a shunt inductance (L=8.2 nH) coupling 224 are provided. With such tuning in LB operation, the tuned impedance 220b is shown to be at or closer to the desired impedance state at the center of the Smith chart.

Figure 30A:
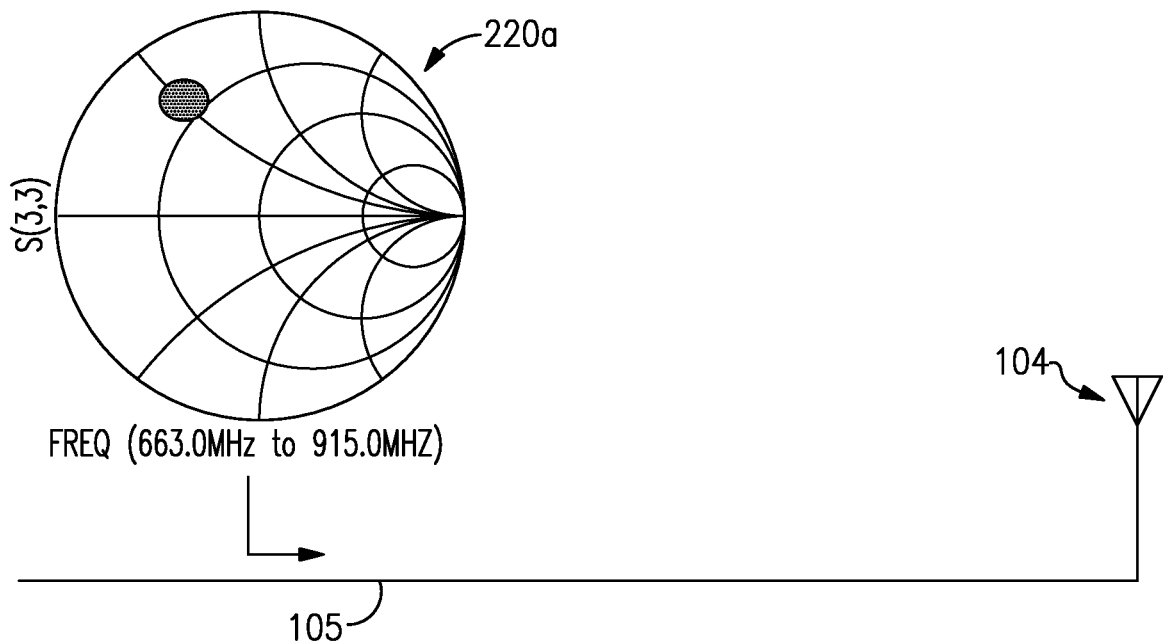
FIGS. 30A and 30B show an impedance tuning provided by yet another example switching state of the LB antenna tuner of FIG. 24.

In yet another example, FIG. 30A shows an impedance state 220a presented by an antenna 104 to an antenna node along a signal path 105 without a tuning circuit. Such an impedance state is shown to be significantly mismatched from a desired impedance state at the center of the Smith chart.

Figure 30B:
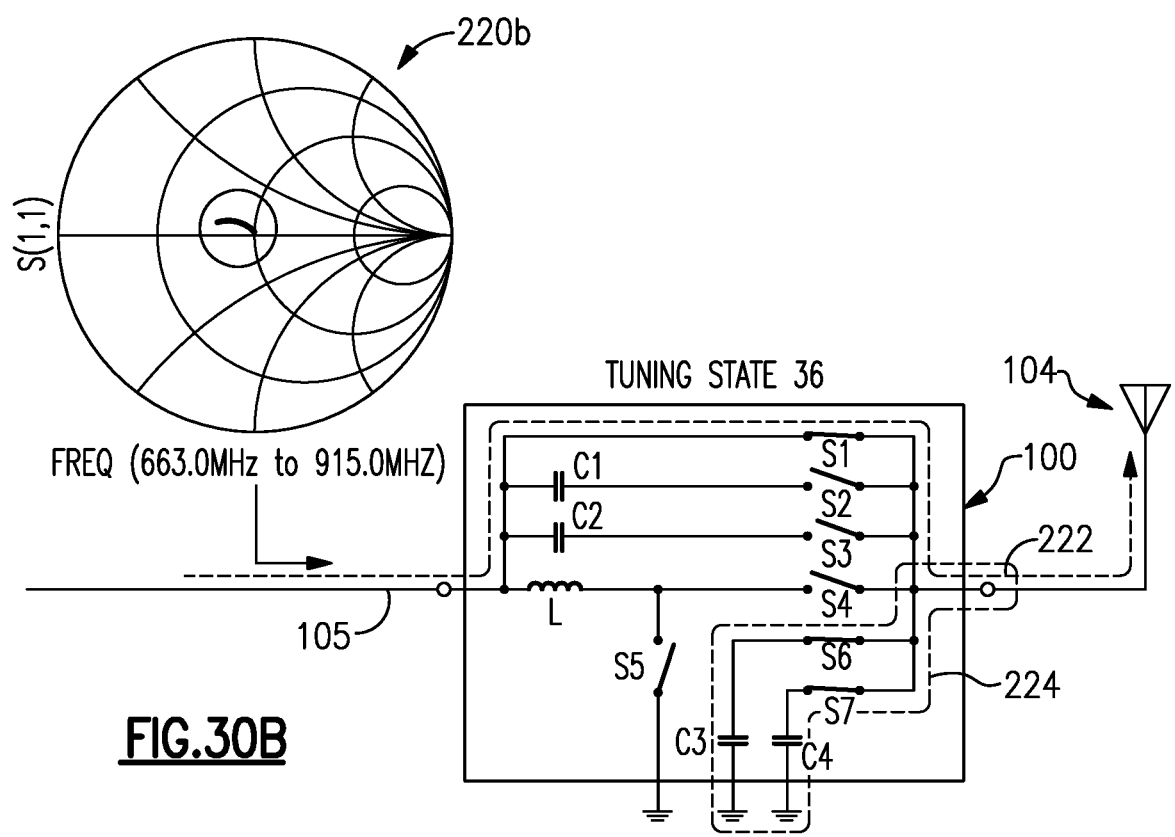

FIG. 30B shows an impedance state 220b presented to the antenna node along a signal path 105 with a tuning circuit 100 (e.g., the impedance tuner circuit 100 of FIG. 24) in State 36 (S1, S6 and S7 ON, and all other switches OFF). Thus, a signal path 222 (bypass path) and a shunt capacitance (C=C3+C4=3.0 pF) coupling 224 are provided. With such tuning in LB operation, the tuned impedance 220b is shown to be at or closer to the desired impedance state at the center of the Smith chart.

Figure 31A:
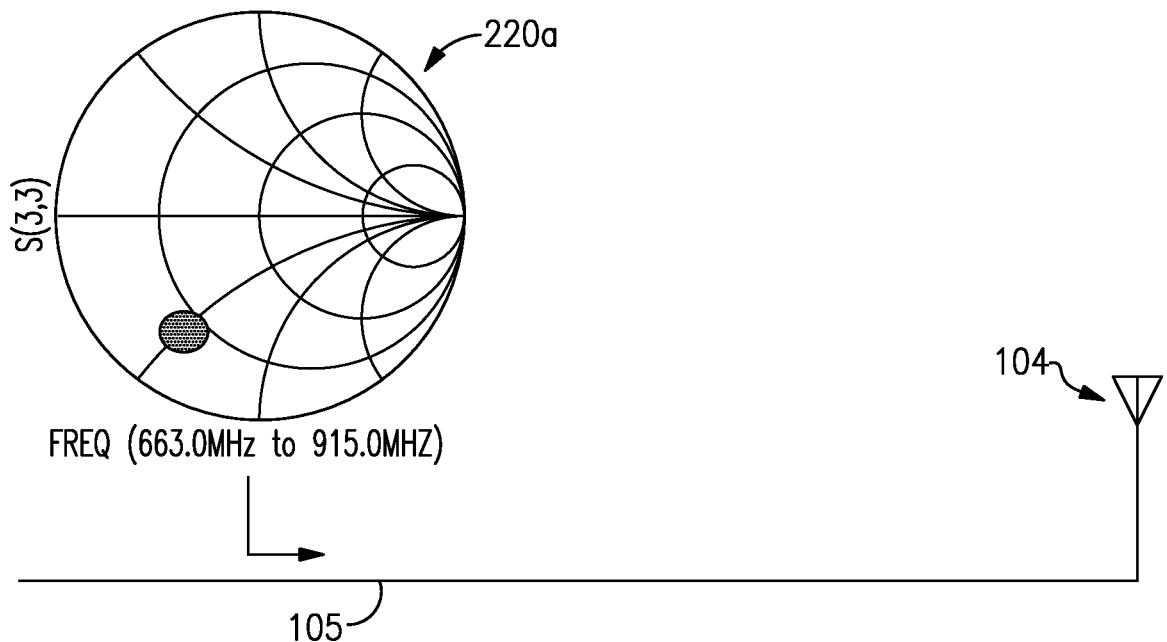
FIGS. 31A and 31B show an impedance tuning provided by yet another example switching state of the LB antenna tuner of FIG. 24.

In yet another example, FIG. 31A shows an impedance state 220a presented by an antenna 104 to an antenna node along a signal path 105 without a tuning circuit. Such an impedance state is shown to be significantly mismatched from a desired impedance state at the center of the Smith chart.

Figure 31B:
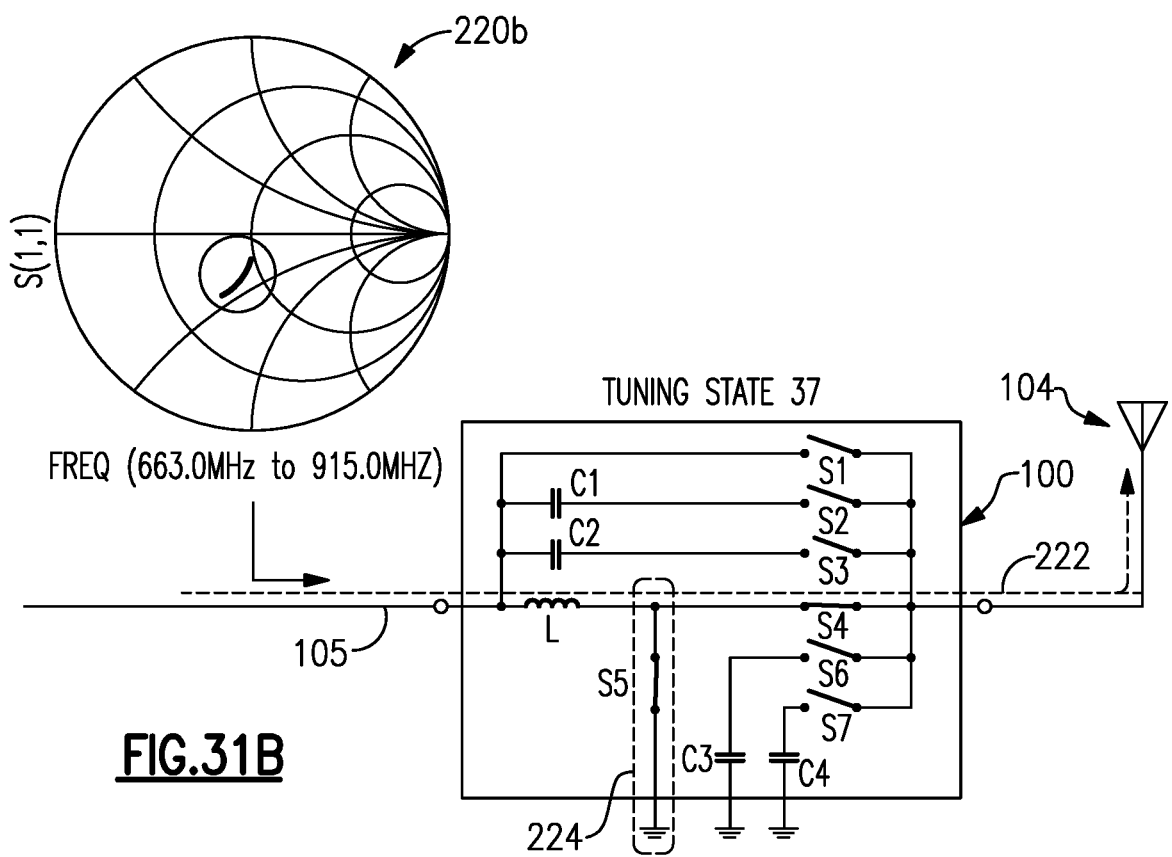

FIG. 31B shows an impedance state 220b presented to the antenna node along a signal path 105 with a tuning circuit 100 (e.g., the impedance tuner circuit 100 of FIG. 24) in State 37 (S4 and S5 ON, and all other switches OFF). Thus, a signal path 222 (with a series inductance (L=8.2 nH)) and a shunt coupling 224 (between L and the antenna) are provided. With such tuning in LB operation, the tuned impedance 220b is shown to be at or closer to the desired impedance state at the center of the Smith chart.

Figure 32A:
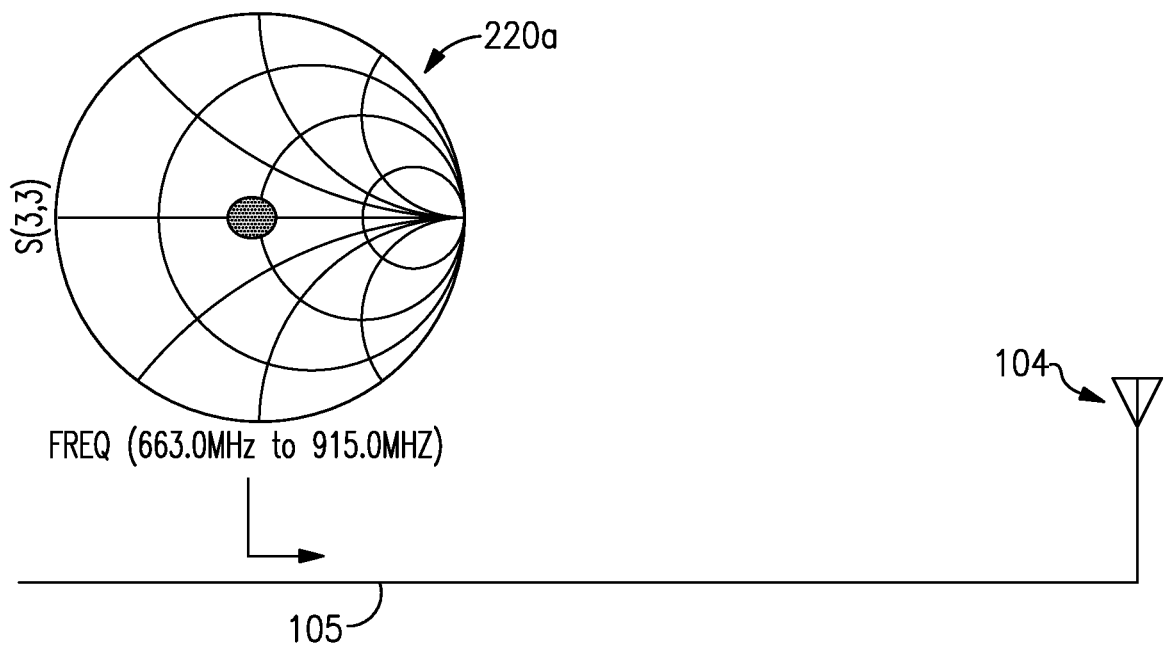
FIGS. 32A and 32B show an impedance tuning provided by yet another example switching state of the LB antenna tuner of FIG. 24.

In yet another example, FIG. 32A shows an impedance state 220a presented by an antenna 104 to an antenna node along a signal path 105 without a tuning circuit. Such an impedance state is shown to be matched to a desired impedance state at the center of the Smith chart.

Figure 32B:
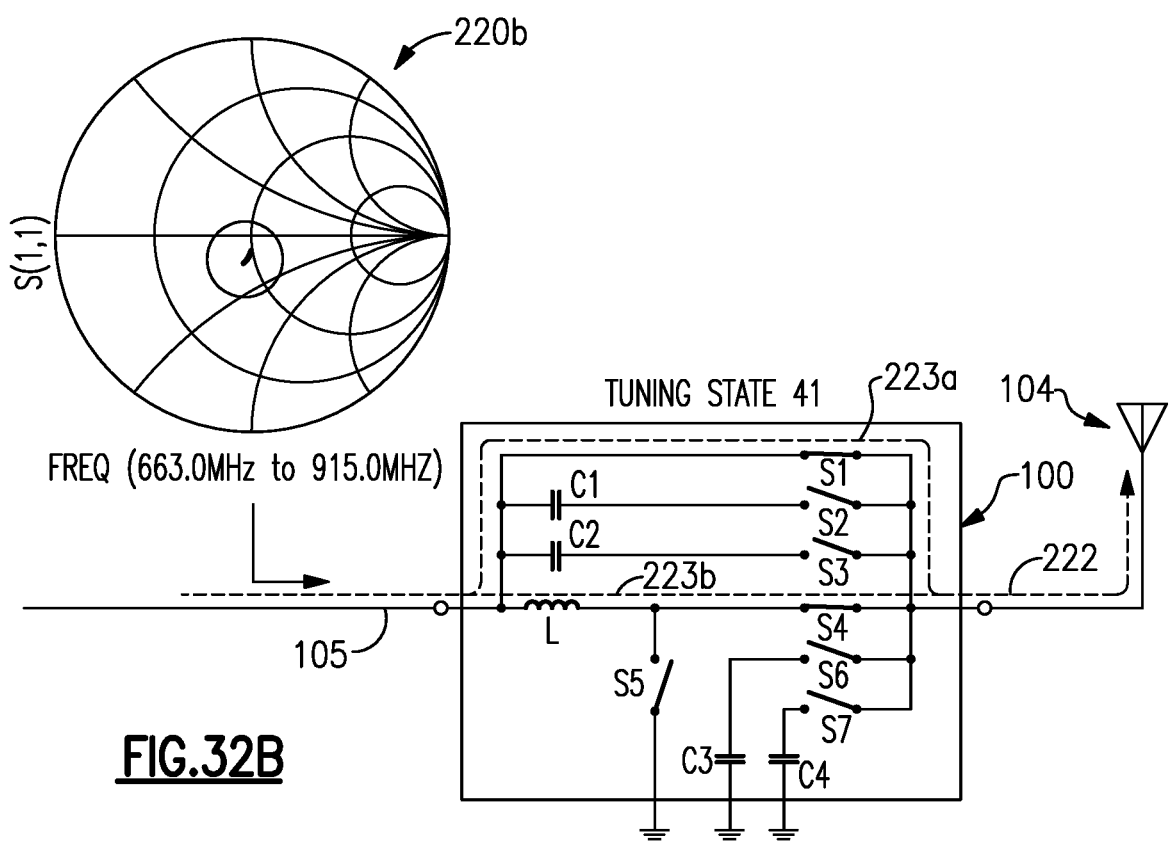

FIG. 32B shows an impedance state 220b presented to the antenna node along a signal path 105 with a tuning circuit 100 (e.g., the impedance tuner circuit 100 of FIG. 24) in State 41 (S1 and S4 ON, and all other switches OFF). Thus, a signal path 222 to the antenna 104 can include a parallel combination of a bypass path 223a and a series inductance (L=8.2 nH). With such tuning in LB operation, the tuned impedance 220b is shown to remain close to the desired impedance state at the center of the Smith chart.

Figure 33:
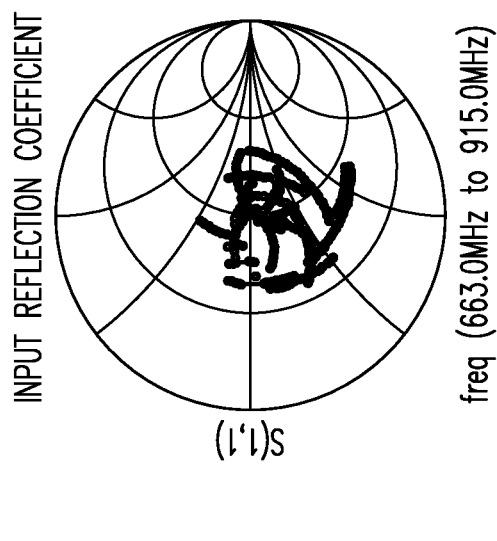
FIG. 33 shows an example of how the LB antenna tuner of FIG. 24 can be operated to provide tuning for various impedance conditions associated with the antenna.
Figure 33:
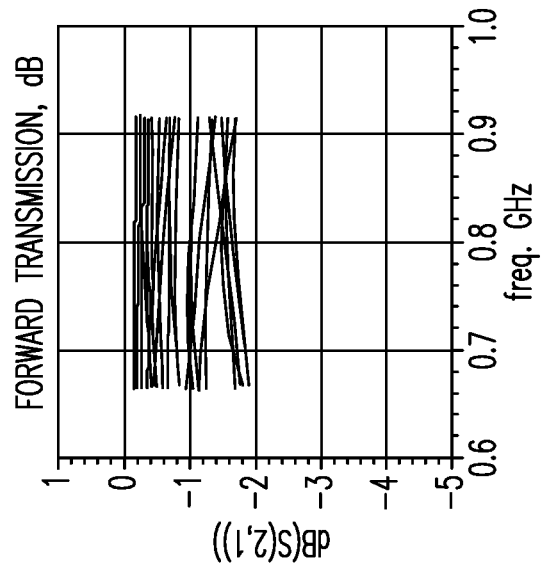
Figure 33:
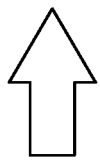
Figure 33:
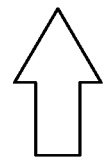
Figure 33:
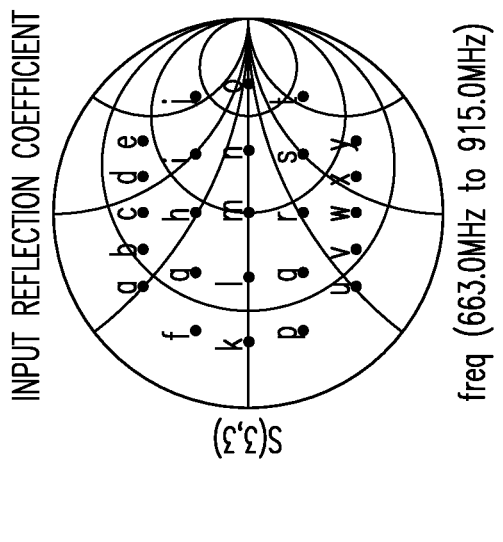
Figure 33:
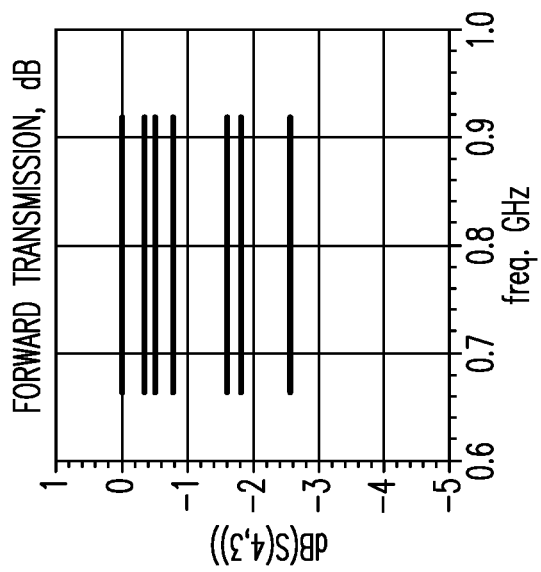

FIG. 33 shows examples of improvements in performance that can be achieved by the impedance tuner circuit 100 of FIG. 24 operated in lowband. The upper left portion of FIG. 33 shows various untuned impedance states on a Smith chart. Such states, indicated as "a" to "y," span VSWR values less than or equal to 5.0, and are obtained for an example frequency range of 663 to 915 MHz. Tune states of Table 4 that can be utilized to adjust or generally maintain the untuned states "a" to "y" are listed in Table 5.

TABLE 5

| Untuned impedance state (FIG. 33) | Tune state (Table 4) |
|---|---|
| a | 12 |
| b | 10 |
| c | 3 |
| d | 5 |
| e | 5 |
| f | 16 |
| g | 44 |
| h | 9 |
| i | 26 |
| j | 26 |
| k | 23 |
| l | 23 |
| m | 41 |
| n | 27 |
| o | 27 |
| p | 21 |
| q | 27 |
| r | 39 |
| s | 25 |
| t | 25 |
| u | 37 |
| v | 37 |

TABLE 5-continued

| Untuned impedance state (FIG. 33) | Tune state (Table 4) |
|---|---|
| w | 37 |
| x | 25 |
| y | 25 |

The upper right portion of FIG. 33 shows a Smith chart with tuned impedance states resulting from application of the tune state configurations (second column of Table 5) to the untuned impedance states (upper left portion of FIG. 33 and first column of Table 5). One can see that the tuned impedance states are clustered closer to the desired impedance state at the center of the Smith chart.

The lower left portion of FIG. 33 shows various forward transmission curves associated with the untuned impedance states ("a" to "y"), and the lower right portion of FIG. 33 shows forward transmission curves for the corresponding tuned impedance states. One can see that the tuned impedance states have forward transmission curves clustered around a value closer to the desired value of 0 dB.

Figure 34:
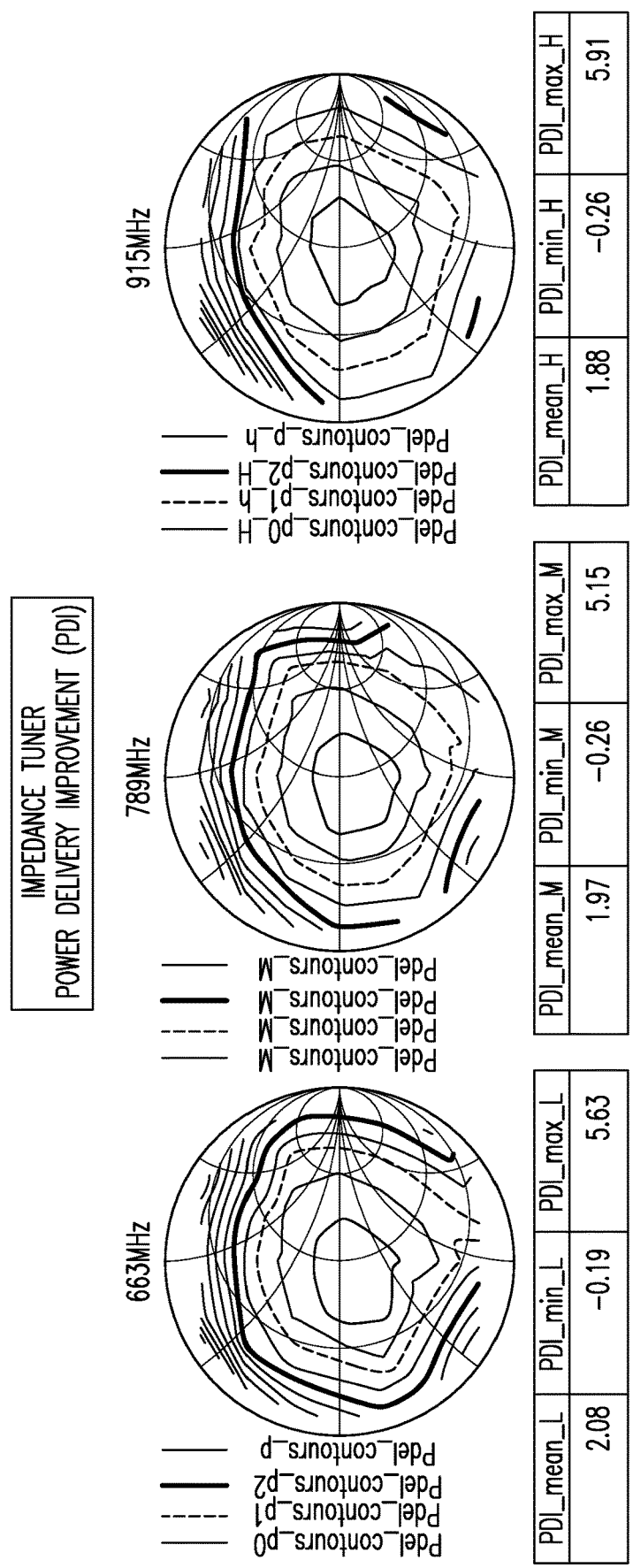
FIG. 34 shows examples of power delivery improvements provided by the LB antenna tuner of FIG. 24.

FIG. 34 shows examples of power delivery contour plots on Smith charts that can be achieved by the impedance tuner circuit 100 of FIG. 24 operated in lowband. The left portion of FIG. 34 is for a lower portion (663 MHz) of the lowband, the center portion of FIG. 34 is for a middle portion (789 MHz) of the lowband, and the right portion of FIG. 34 is for a higher portion (915 MHz) of the lowband. Below each Smith chart is a summary of insertion loss values (mean value, worst value, best value) resulting from use of the impedance tuner circuit 100. The worst insertion loss of about 0.26 dB occurs at the middle and higher frequencies, thereby showing that the impedance tuner circuit 100 has a very low loss when operated at the lowband.

Figure 35:
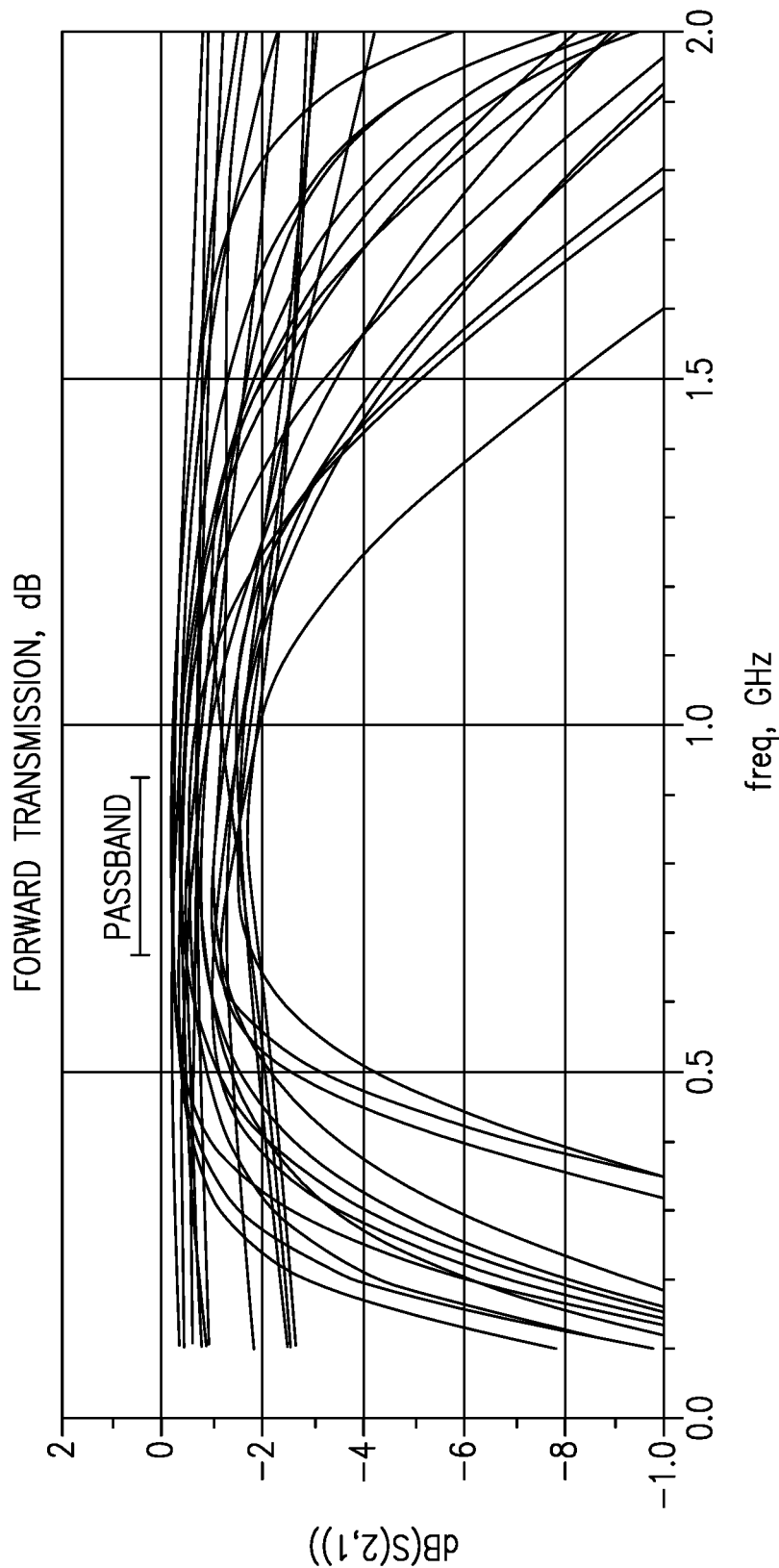
FIG. 35 shows that the LB antenna tuner of FIG. 24 can provide a relatively wideband performance.

FIG. 35 is an extension of the forward transmission plot for the tuned states (lower right portion) of FIG. 33, obtained for a wider frequency range (about 100 MHz to 2,000 MHz). The forward transmission plot of FIG. 35 shows that the improved forward transmission performance is a wideband response that covers at least the lowband frequency range (617 to 960 MHz).

Figure 36:
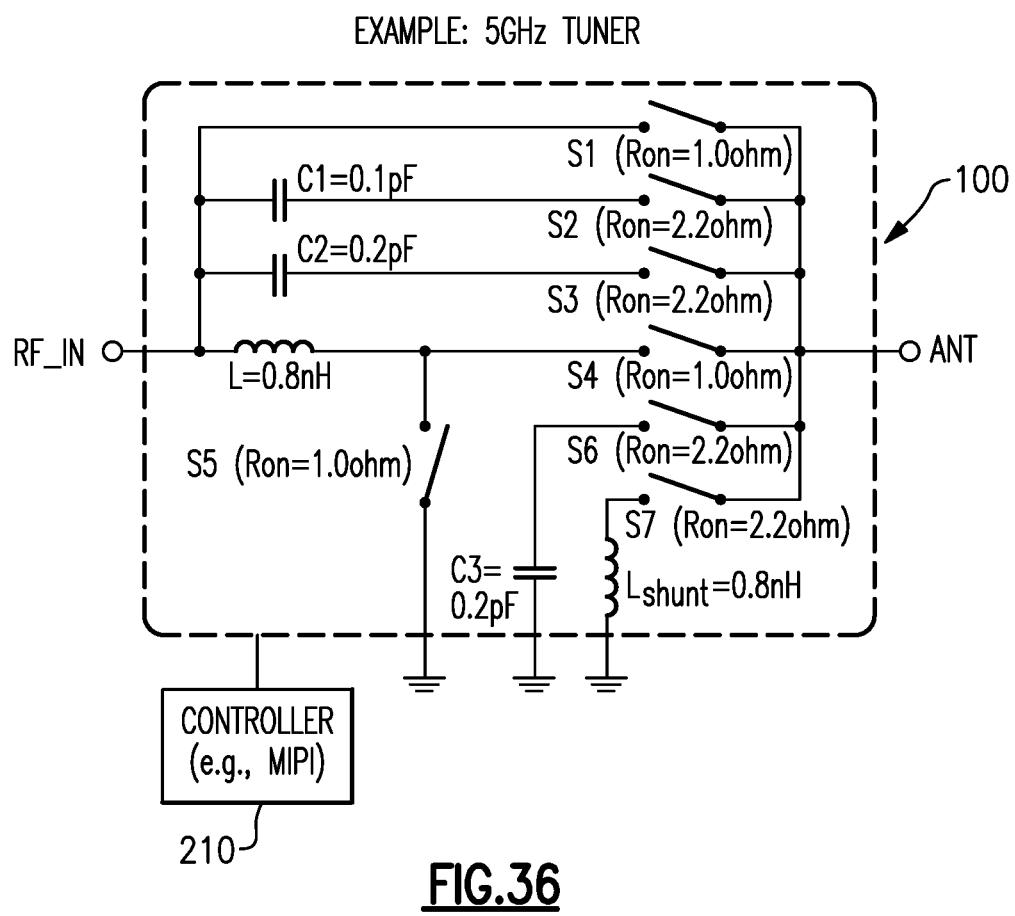
FIG. 36 shows an example where the antenna tuner circuit of FIG. 23 is configured as a 5 GHz antenna tuner.

FIG. 36 shows an example where the impedance tuner circuit 100 of FIG. 23 is configured to support a 5 GHz WLAN frequency range (5,150 to 5,875 MHz). FIG. 36 also shows that in some embodiments, operation of such an impedance tuner circuit can be facilitated by a controller 210 utilizing, for example, Mobile Industry Processor Interface (MIPI) based signals. Such control signals can be utilized to, for example, control the states of the various switches of the impedance tuner circuit 100.

Table 6 lists example values of capacitances, inductance and switch on-resistances (Ron) associated with the impedance tuner circuit 100 of FIG. 36 configured for the 5 GHz operation.

TABLE 6

| Circuit element | Electrical property |
|---|---|
| S1 | Ron = 1.0 ohm |
| S2 | Ron = 2.2 ohm |
| S3 | Ron = 2.2 ohm |
| S4 | Ron = 1.0 ohm |
| S5 | Ron = 1.0 ohm |
| S6 | Ron = 2.2 ohm |
| S7 | Ron = 2.2 ohm |
| L | Inductance = 0.8 nH |
| C1 | Capacitance = 0.1 pF |

TABLE 6-continued

| Circuit element | Electrical property |
| --- | --- |
| C2 | Capacitance = 0.2 pF |
| C3 | Capacitance = 0.2 pF |
| $L_{shunt}$ | Inductance = 0.8 nH |

It is noted that the impedance tuner circuit 100 of FIG. 36 includes seven switches, similar to the example of FIG. 24. Assuming that each switch can be in an ON (or 1) state or an OFF (or 0) state, the impedance tuner circuit 100 itself can have a total of $2^7=128$ switching states. It is further noted that some of such 128 states may not be utilized, or achieve similar functionality of the impedance tuner circuit 100.

As described herein, Table 4 lists examples of states of the seven switches that can provide various switching configurations for the LB impedance tuner circuit 100 of FIG. 24. In some embodiments, the same switching state numbers can be assigned for the seven switches of the 5 GHz impedance tuner 100 of FIG. 36.

Figure 37A:
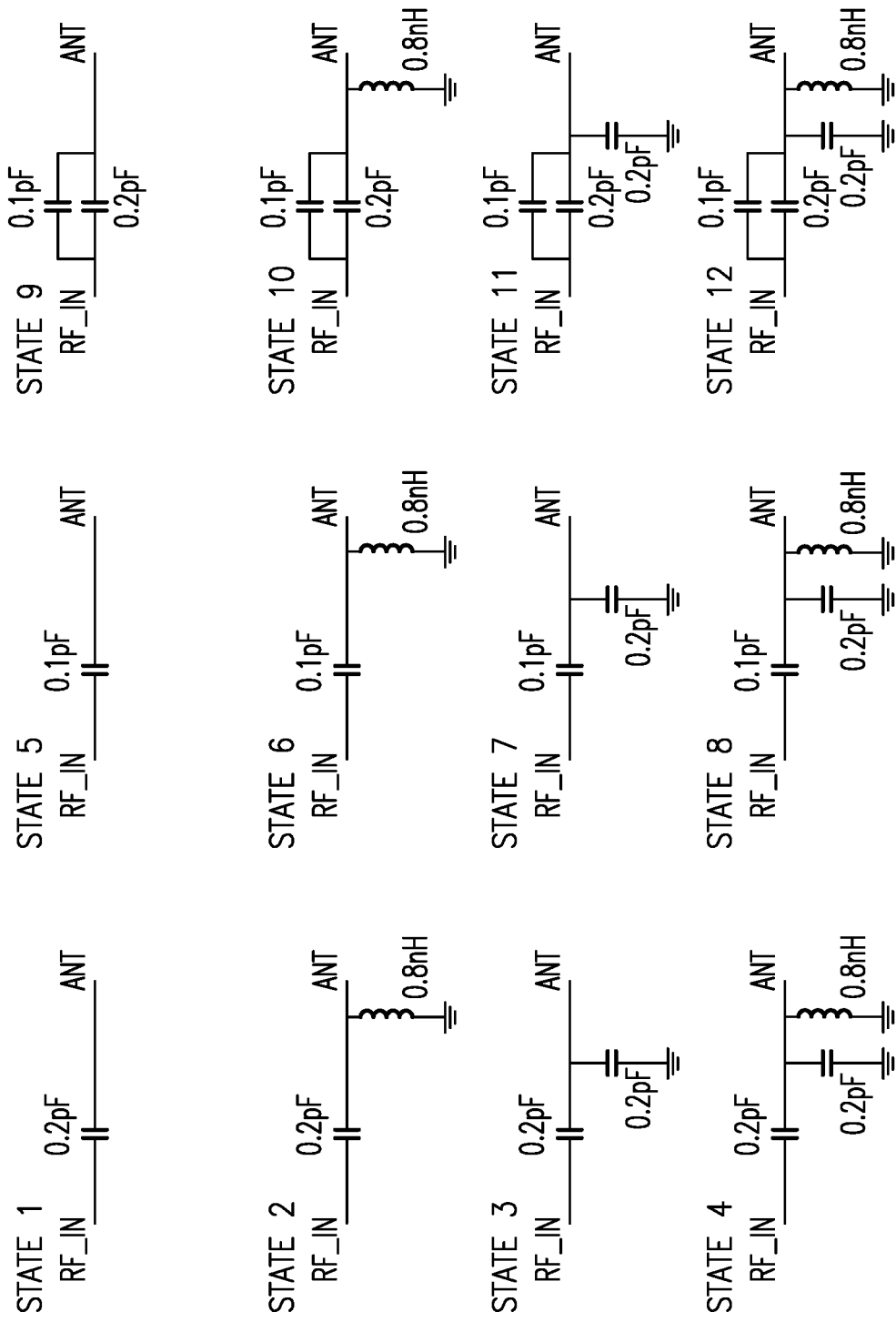
FIGS. 37A to 37D show examples of equivalent circuits associated with various switching states of the 5 GHz antenna tuner of FIG. 36.

FIGS. 37A to 37D show equivalent circuits corresponding to the various tune states of Table 4, for the impedance tuner circuit 100 of FIG. 36. FIG. 37A includes examples where the inductance L is not being utilized. For example, in State 1, S3 is ON and all other switches are OFF; thus, capacitance of C2=0.2 pF is provided between the RF_IN node and the ANT node in the impedance tuner circuit 100 of FIG. 36.

Figure 37B:
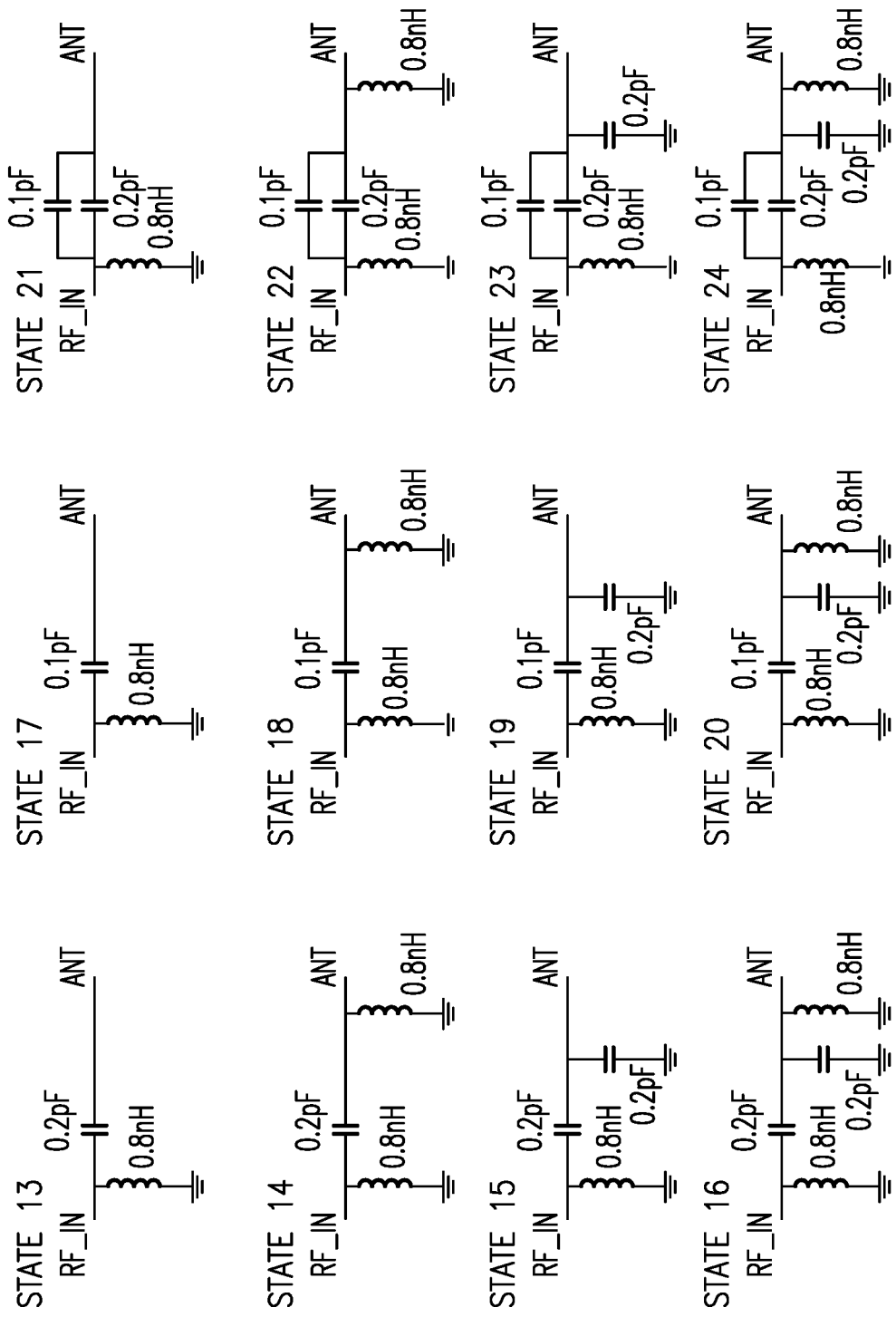

FIG. 37B includes examples where the inductance L is being utilized as a shunt inductance. For example, in State 13, S3 and S5 are ON and all other switches are OFF; thus, capacitance of C2=0.2 pF is provided between the RF_IN node and the ANT node, and shunt inductance L=0.8 nH is provided, in the impedance tuner circuit 100 of FIG. 36.

Figure 37C:
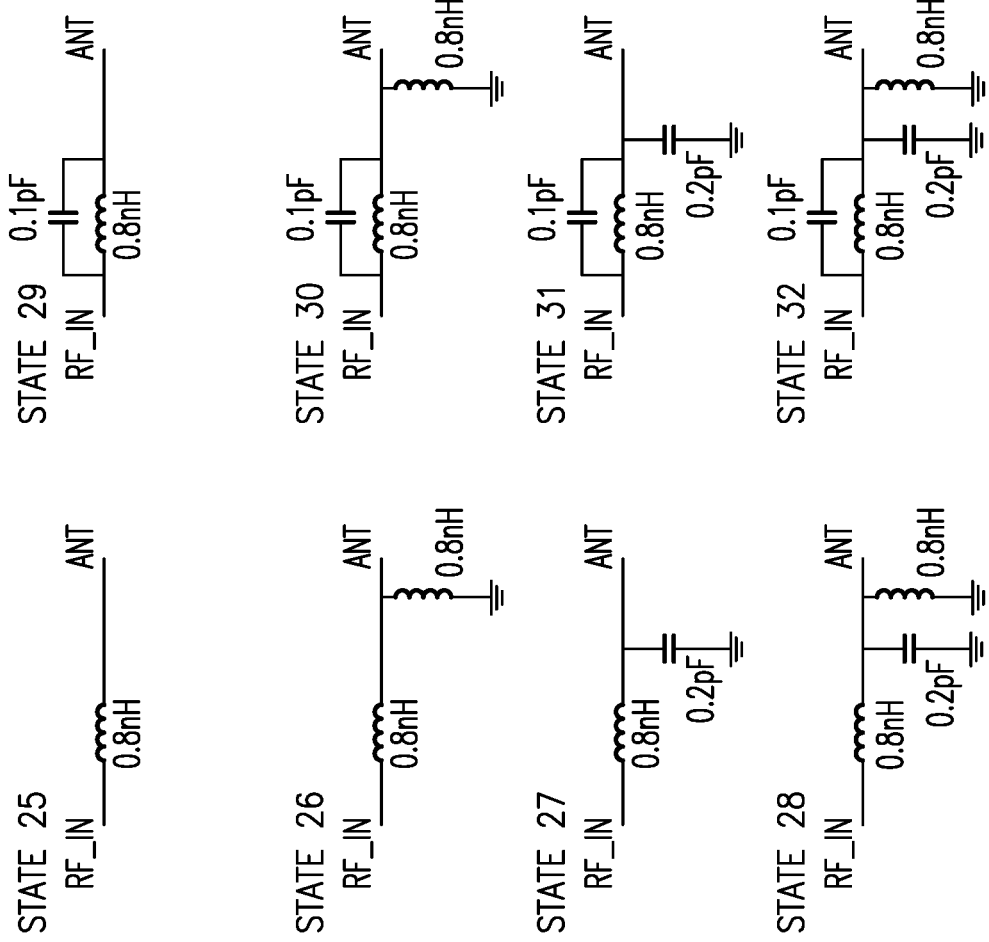

FIG. 37C includes examples where the inductance L is being utilized as a series inductance. For example, in State 25, S4 is ON and all other switches are OFF; thus, series inductance L=0.8 nH is provided, in the impedance tuner circuit 100 of FIG. 36.

FIG. 37C also includes an example where the shunt inductance $L_{shunt}$ is being utilized instead of the capacitance C4 of the example of FIG. 24. For example, in State 28, S4, S6 and S7 are ON and all other switches are OFF; thus, series inductance L=0.8 nH, shunt capacitance C3=0.2 pF and shunt inductance $L_{shunt}$=0.8 nH are provided, in the impedance tuner circuit 100 of FIG. 36.

Figure 37D:
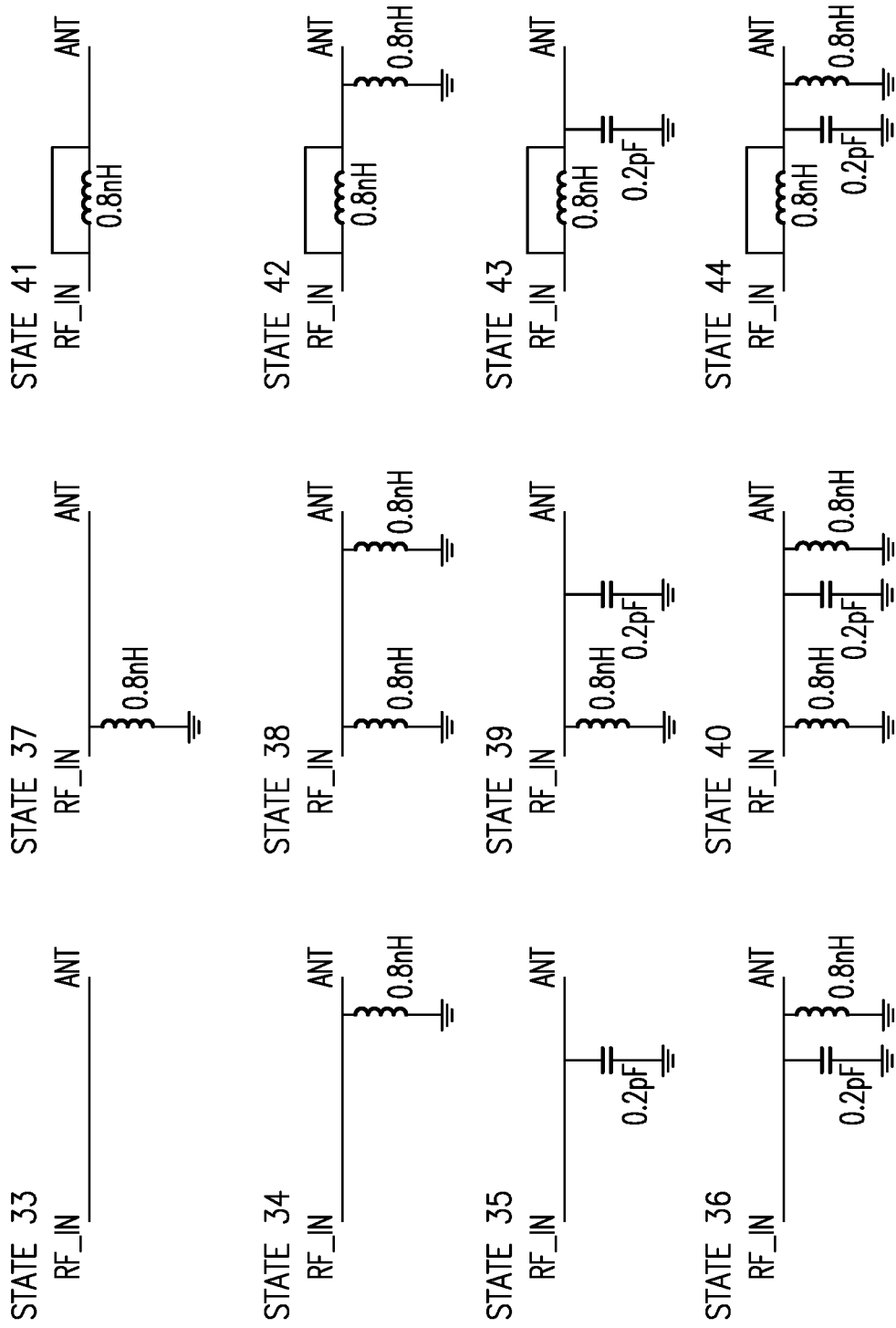

FIG. 37D includes other example states that can be implemented for the impedance tuner circuit 100 of FIG. 36. For example, in State 33, S1 is ON and all other switches are OFF, so as to provide a bypass path between the RF_IN node and the ANT node.

In another example, in State 41, S1 and S4 are ON and all other switches are OFF, so as to provide a parallel combination of the bypass path associated with S1 and the series inductance path associated with S4. It is noted that States 41 and 42 provide the lowest bypass loss among states where the bypass path switch S1 is ON. Thus, in some embodiments, a bypass functionality (e.g., for the impedance tuner circuit 100 of FIG. 36) can be achieved by including a parallel combination of a bypass path and a series inductor between two nodes (e.g., RF input and antenna nodes).

Figure 38:
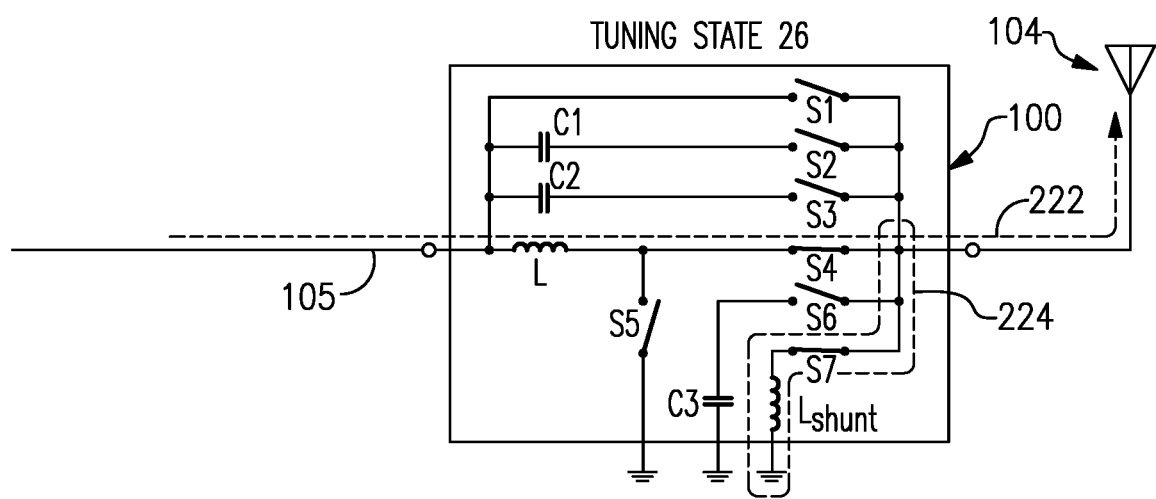
FIG. 38 shows an impedance tuning provided by an example switching state of the 5 GHz antenna tuner of FIG. 36, where the switchable inductance is enabled to provide an inductive shunt for the antenna node.

FIG. 38 shows an example tuning configuration where the shunt inductance $L_{shunt}$ is being utilized, for the impedance tuner circuit 100 of FIG. 36. More particularly, and referring to Table 4 and FIGS. 36 and 37, the impedance tuner circuit 100 implemented along a signal path 105 can be in the tuning state 26 so as to provide a signal path 222 (with a series inductance (L=0.8 nH)) and a shunt inductance ($L_{shunt}$=0.8 nH) coupling 224.

Figure 39:
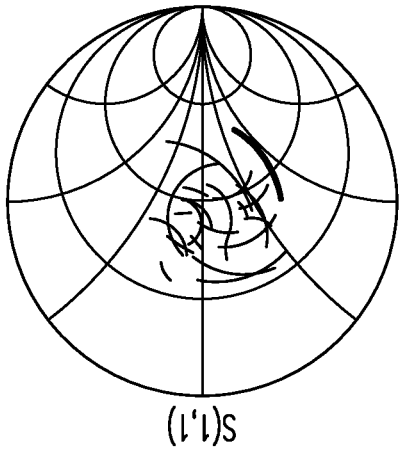
FIG. 39 shows an example of how the 5 GHz antenna tuner of FIG. 36 can be operated to provide tuning for various impedance conditions associated with the antenna.
Figure 39:
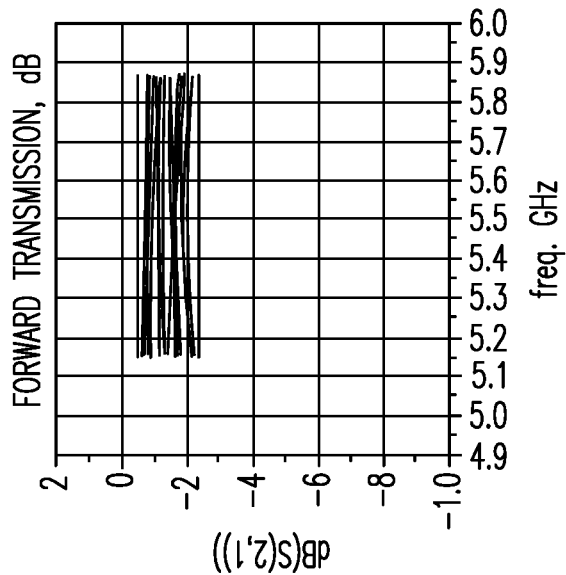
Figure 39:
Figure 39:
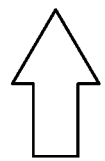
Figure 39:
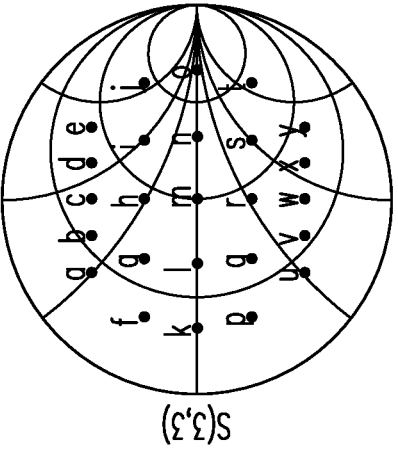
Figure 39:
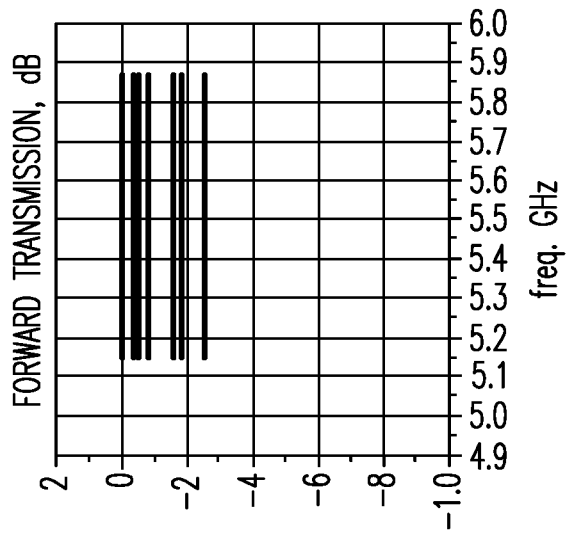

FIG. 39 shows examples of improvements in performance that can be achieved by the impedance tuner circuit 100 of FIG. 36 operated in the 5 GHz band. The upper left portion of FIG. 39 shows various untuned impedance states on a Smith chart. Such states, indicated as "a" to "y," span VSWR values less than or equal to 5.0, and are obtained for the 5 GHz frequency range (5,150 to 5,875 MHz). Tune states of Table 4 that can be utilized to adjust or generally maintain the untuned states "a" to "y" are listed in Table 7.

TABLE 7

| Untuned impedance state (FIG. 39) | Tune state (Table 4) |
| --- | --- |
| a | 17 |
| b | 9 |
| c | 9 |
| d | 5 |
| e | 31 |
| f | 23 |
| g | 41 |
| h | 41 |
| i | 29 |
| j | 29 |
| k | 23 |
| l | 33 |
| m | 25 |
| n | 29 |
| o | 8 |
| p | 34 |
| q | 34 |
| r | 42 |
| s | 37 |
| t | 6 |
| u | 38 |
| v | 26 |
| w | 28 |
| x | 37 |
| y | 37 |

The upper right portion of FIG. 39 shows a Smith chart with tuned impedance states resulting from application of the tune state configurations (second column of Table 7) to the untuned impedance states (upper left portion of FIG. 39 and first column of Table 7). One can see that the tuned impedance states are clustered closer to the desired impedance state at the center of the Smith chart.

The lower left portion of FIG. 39 shows various forward transmission curves associated with the untuned impedance states ("a" to "y"), and the lower right portion of FIG. 39 shows forward transmission curves for the corresponding tuned impedance states. One can see that the tuned impedance states have forward transmission curves clustered around a value closer to the desired value of 0 dB.

Figure 40:
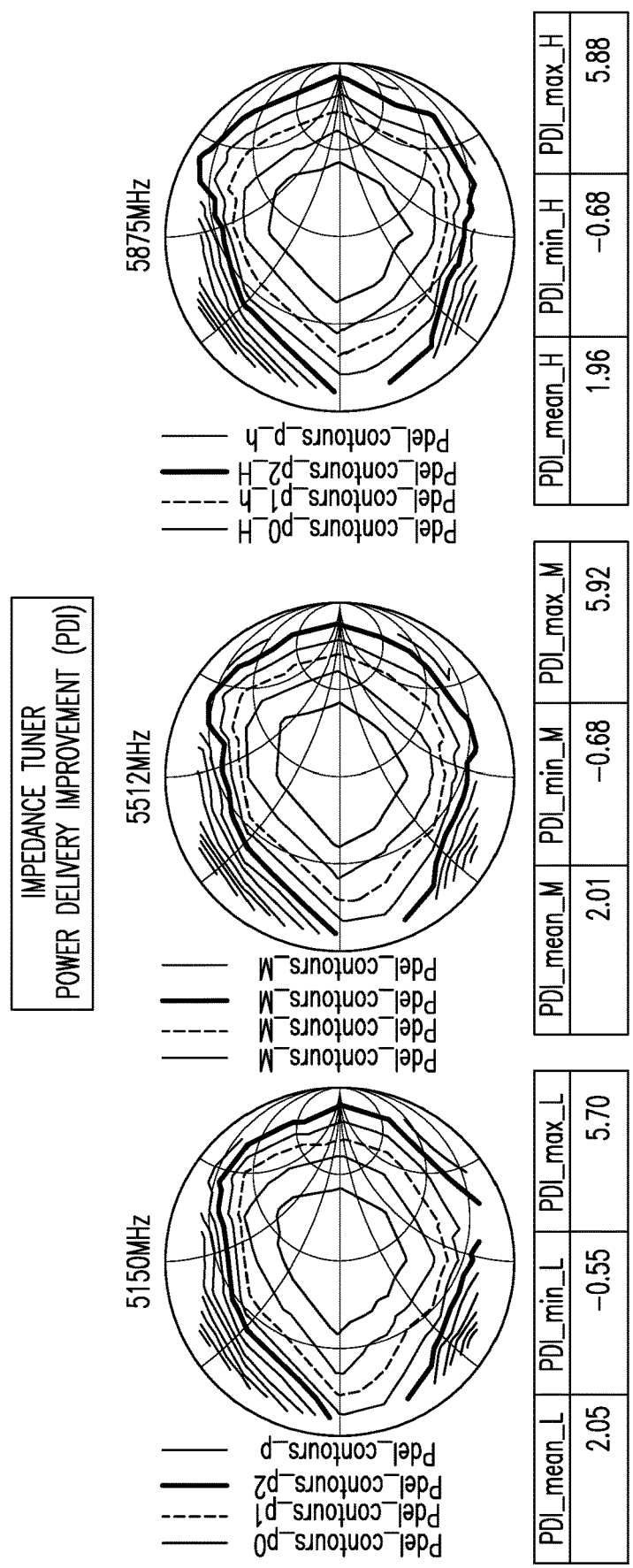
FIG. 40 shows examples of power delivery improvements provided by the 5 GHz antenna tuner of FIG. 36.

FIG. 40 shows examples of power delivery contour plots on Smith charts that can be achieved by the impedance tuner circuit 100 of FIG. 36 operated in the 5 GHz band. The left portion of FIG. 40 is for a lower portion (5,150 MHz) of the 5 GHz band, the center portion of FIG. 40 is for a middle portion (5,512 MHz) of the 5 GHz band, and the right portion of FIG. 40 is for a higher portion (5,875 MHz) of the 5 GHz band. Below each Smith chart is a summary of insertion loss values (mean value, worst value, best value) resulting from use of the impedance tuner circuit 100. The worst insertion loss of about 0.68 dB occurs at the middle and higher frequencies. Such an insertion loss is higher than a desired insertion loss condition (e.g., less than 0.4 dB); however, the insertion loss of about 0.68 dB can be within a reasonable limit.

Figure 41:
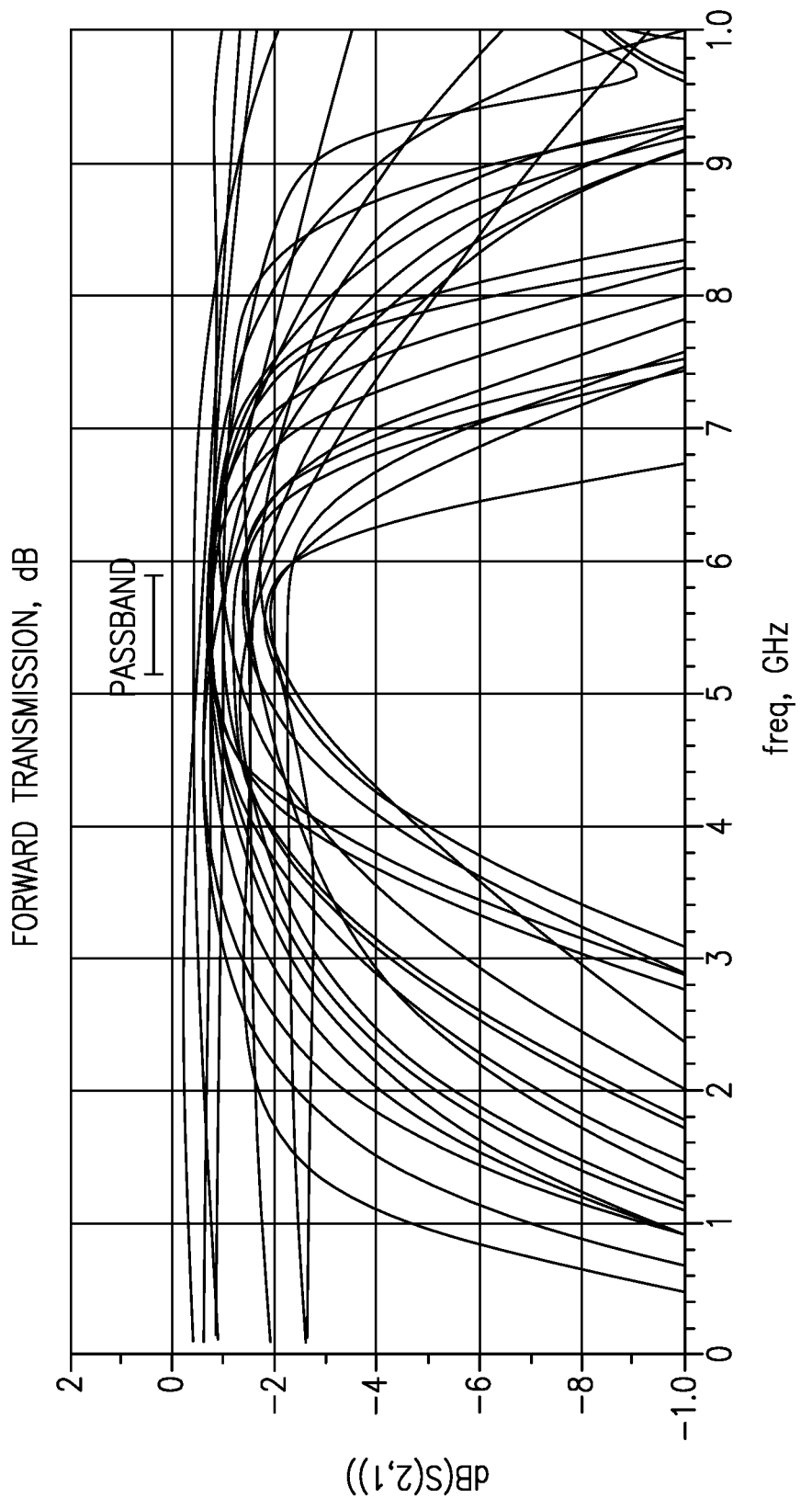
FIG. 41 shows that the 5 GHz antenna tuner of FIG. 36 can provide a relatively wideband performance.

FIG. 41 is an extension of the forward transmission plot for the tuned states (lower right portion) of FIG. 39, obtained for a wider frequency range (about 100 MHz to 10,000 MHz). The forward transmission plot of FIG. 41 shows that the improved forward transmission performance is a wideband response that covers at least the 5 GHz frequency range (5,150 to 5,875 MHz).

As described herein, FIGS. 24 to 35 relate to various examples associated with lowband (617 to 960 MHz), and FIGS. 36 to 41 relate to various examples associated with 5 GHz band (5,150 to 5,875 MHz). It will be understood that an impedance tuner circuit having one or more features as described herein can be configured to provide desired tuning for other frequency ranges, including, for example, midband (MB) (1,695 to 2,200 MHz), highband (HB) (2,300 to 2,690 MHz), 5G New Radio (5G-NR) band (3,300-4,990 MHz), and other frequency bands or ranges that my be used for wireless applications.

Figure 42:
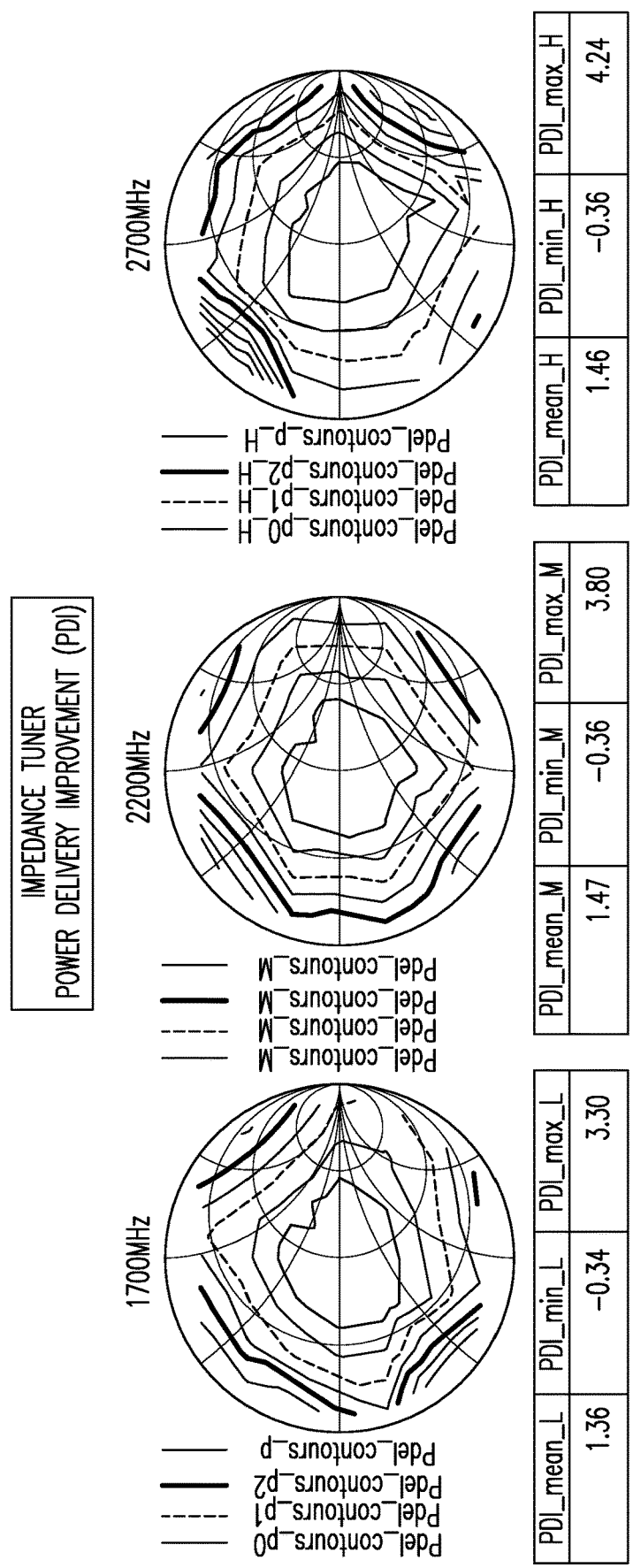
FIG. 42 shows examples of power delivery improvements provided by the antenna tuner circuit of FIG. 12 configured as a mid/highband (MHB) antenna tuner.

For example, FIG. 42 shows examples of power delivery contour plots on Smith charts that can be achieved by an impedance tuner circuit as described herein operated in a mid/highband (MHB). The left portion of FIG. 42 is for a lower portion (1,700 MHz) of the MHB, the center portion of FIG. 42 is for a middle portion (2,200 MHz) of the MHB, and the right portion of FIG. 42 is for a higher portion (2,700 MHz) of the MHB. Below each Smith chart is a summary of insertion loss values (mean value, worst value, best value) resulting from use of the impedance tuner circuit. The worst insertion loss of about 0.36 dB occurs at the middle and higher frequencies, which is lower than a desired insertion loss condition of, for example, less than 0.4 dB.

Figure 43:
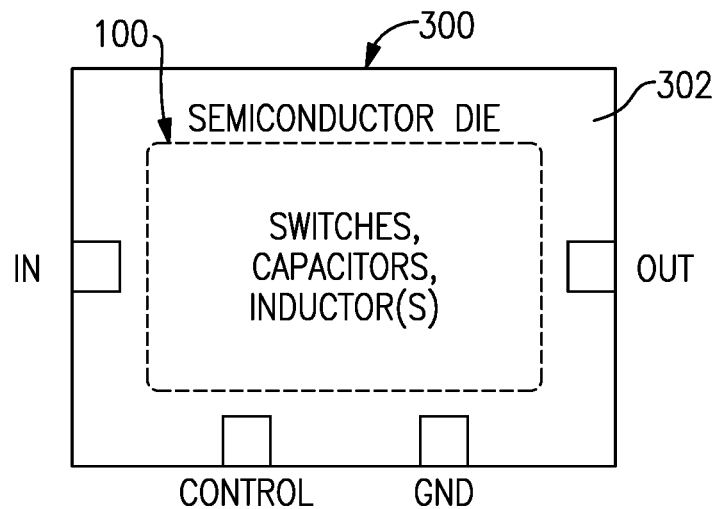
FIG. 43 shows that in some embodiments, an antenna tuner circuit having one or more features as described herein can be implemented on a semiconductor die.

In some implementations, the present disclosure relates to various devices that includes one or more impedance tuner circuits. For example, FIG. 43 shows that in some embodiments, an impedance tuner circuit 100 having one or more features as described herein can be implemented on a semiconductor die 300. In such a device, substantially all of the impedance tuner circuit 100, including switches (e.g., FETs), capacitors (e.g., MIM capacitors), and inductor(s) (e.g., on-chip inductor trace(s)) can be implemented on and/or within a substrate 302 of the semiconductor die 300. In some embodiments, such a semiconductor die can be, for example, a silicon-on-insulator (SOI) die.

FIG. 43 also shows that the semiconductor die 300 can further include a plurality of electrical contacts such as an input node (IN), an output node (OUT), one or more control nodes (Control), and a ground node (GND). Such electrical contacts can be implemented as, for example, wirebond pads on the upper side of the substrate 302, a grid array on the underside of the substrate 302, or some combination thereof.

In some embodiments, an impedance tuner circuit having one or more features as described herein can be implemented on a packaged module. For example, a packaged module can include a semiconductor die, such as the die 300 of FIG. 43, having substantially all of an impedance tuner circuit. Such a die can be mounted on a packaging substrate of the module, along with one or more other components.

Figure 44:
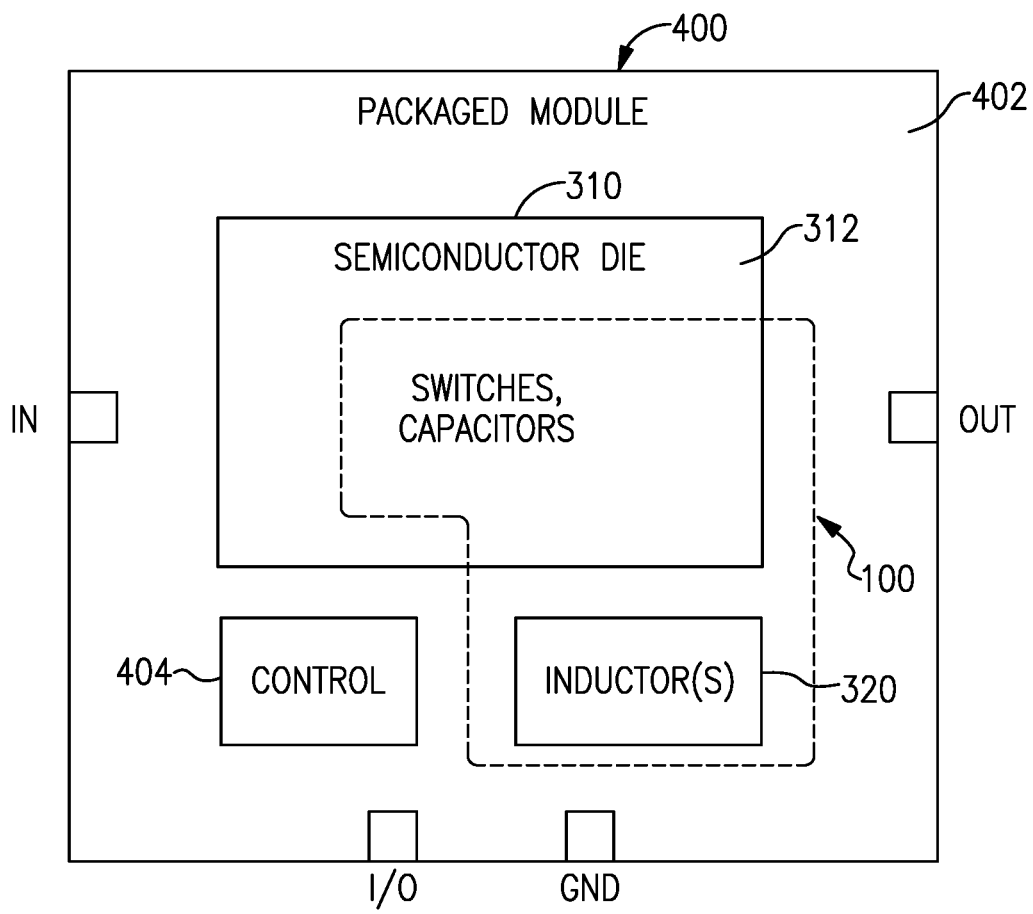
FIG. 44 shows an example where an antenna tuner circuit having one or more features as described herein can be implemented on a packaged module.

In another example, FIG. 44 shows that an impedance tuner circuit 100 having one or more features as described herein can be implemented so that some of the impedance tuner circuit 100 is on a semiconductor die 310, and the remainder is implemented off of the die 310. For example, a packaged module 400 can include a packaging substrate 402 configured to receive and support a plurality of components. Such components can include the semiconductor die 310 (e.g., an SOI die) having a substrate 312, and switches (e.g., FETs) and capacitors (e.g., MIM capacitors) associated with the impedance tuner circuit 100 can be implemented on such a substrate (312).

In the example of FIG. 44, one or more inductors 320 (e.g., discrete component inductor(s)) can be mounted on the packaging substrate 402 and be electrically connected to the semiconductor die 310 so as to be part of the impedance tuner circuit 100. In some embodiments, the packaged module 400 can further include a control component 404 configured to control, or facilitate control of, the impedance tuner circuit 100. Such a control component can be based on, for example, MIPI standards.

FIG. 44 also shows that the packaged module 400 can further include a plurality of electrical contacts such as an input node (IN), an output node (OUT), one or more I/O nodes (e.g., control and/or power), and a ground node (GND). Such electrical contacts can be implemented as, for example, wirebond pads on the upper side of the packaging substrate 402, solder pads or a grid array on the underside of the packaging substrate 402, or some combination thereof.

Figure 45:
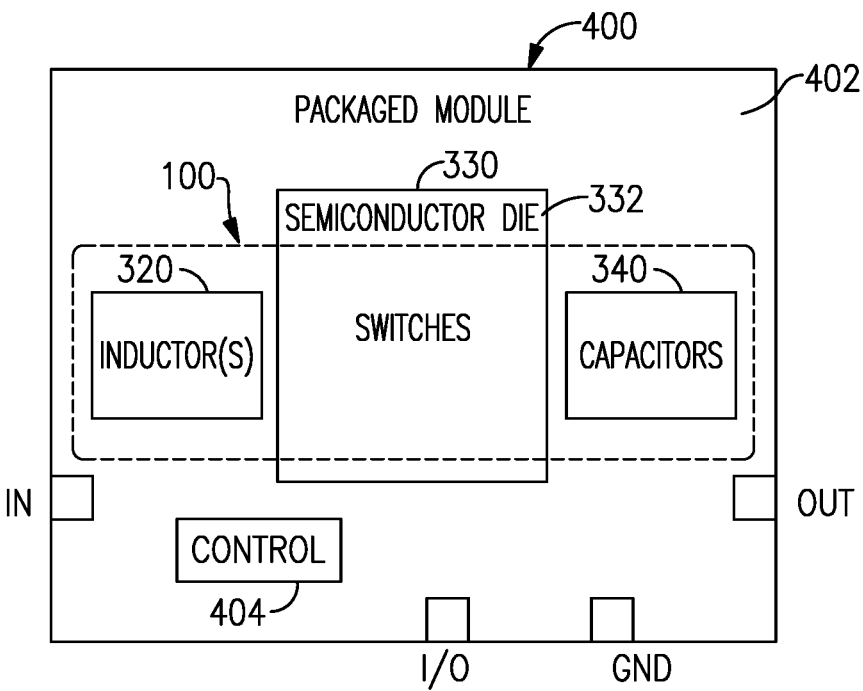
FIG. 45 shows another example where an antenna tuner circuit having one or more features as described herein can be implemented on a packaged module.

In yet another example, FIG. 45 shows that an impedance tuner circuit 100 having one or more features as described herein can be implemented so that some of the impedance tuner circuit 100 is on a semiconductor die 330, and the remainder is implemented off of the die 330. For example, a packaged module 400 can include a packaging substrate 402 configured to receive and support a plurality of components. Such components can include the semiconductor die 330 (e.g., an SOI die) having a substrate 332, and switches (e.g., FETs) associated with the impedance tuner circuit 100 can be implemented on such a substrate (332).

In the example of FIG. 45, one or more inductors 320 (e.g., discrete component inductor(s)) and a plurality of capacitors 340 (e.g., discrete component capacitors) can be mounted on the packaging substrate 402 and be electrically connected to the semiconductor die 330 so as to be part of the impedance tuner circuit 100. In some embodiments, the packaged module 400 can further include a control component 404 configured to control, or facilitate control of, the impedance tuner circuit 100. Such a control component can be based on, for example, MIPI standards.

FIG. 45 also shows that the packaged module 400 can further include a plurality of electrical contacts such as an input node (IN), an output node (OUT), one or more I/O nodes (e.g., control and/or power), and a ground node (GND). Such electrical contacts can be implemented as, for example, wirebond pads on the upper side of the packaging substrate 402, solder pads or a grid array on the underside of the packaging substrate 402, or some combination thereof.

Figure 46:
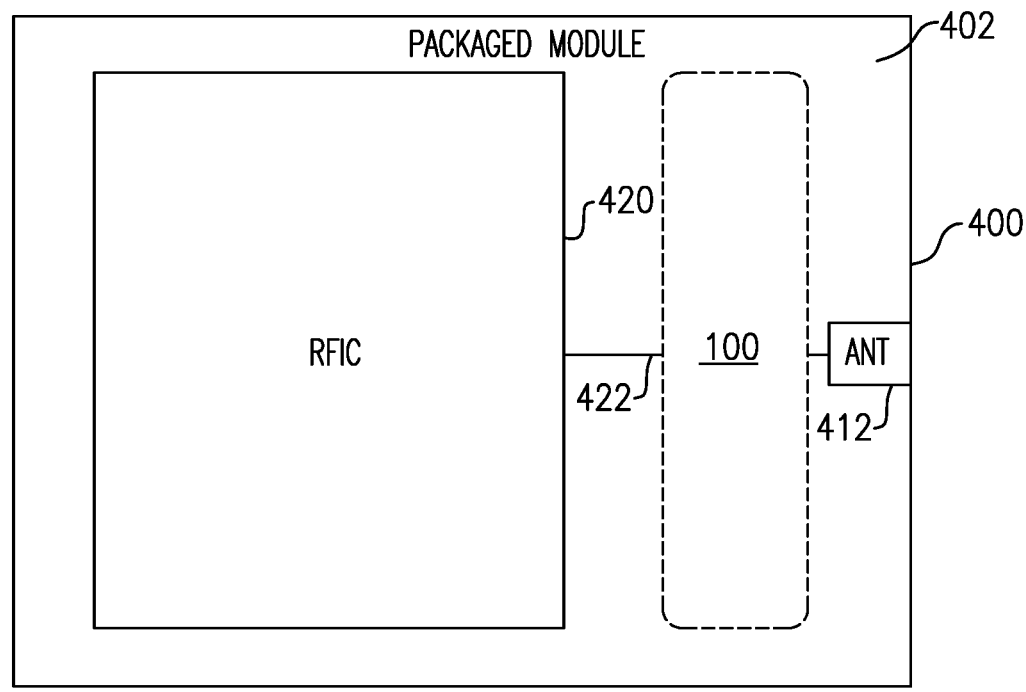
FIG. 46 shows yet another example where an antenna tuner circuit having one or more features as described herein can be implemented on a packaged module.

In yet another example, FIG. 46 shows that in some embodiments, a packaged module 400 can include a radio-frequency integrated circuit (RFIC) 420 such as a front-end system configured to operate with an antenna through an antenna node (ANT) 412. At least some of the RFIC 420 can be implemented on one or more semiconductor die, and such die can be mounted on a packaging substrate 402 of the packaged module 400.

In the example of FIG. 46, an impedance tuner circuit 100 having one or more features as described herein can be implemented along a signal path 422 between the RFIC 420 and the antenna node 412. It will be understood that the antenna node 412 can be coupled to a transmit antenna (in which case the RFIC 420 may include a transmit functionality), a receive antenna (in which case the RFIC 420 may include a receive functionality), or a transmit/receive antenna (in which case the RFIC 420 may include transmit and receive functionalities).

Figure 47:
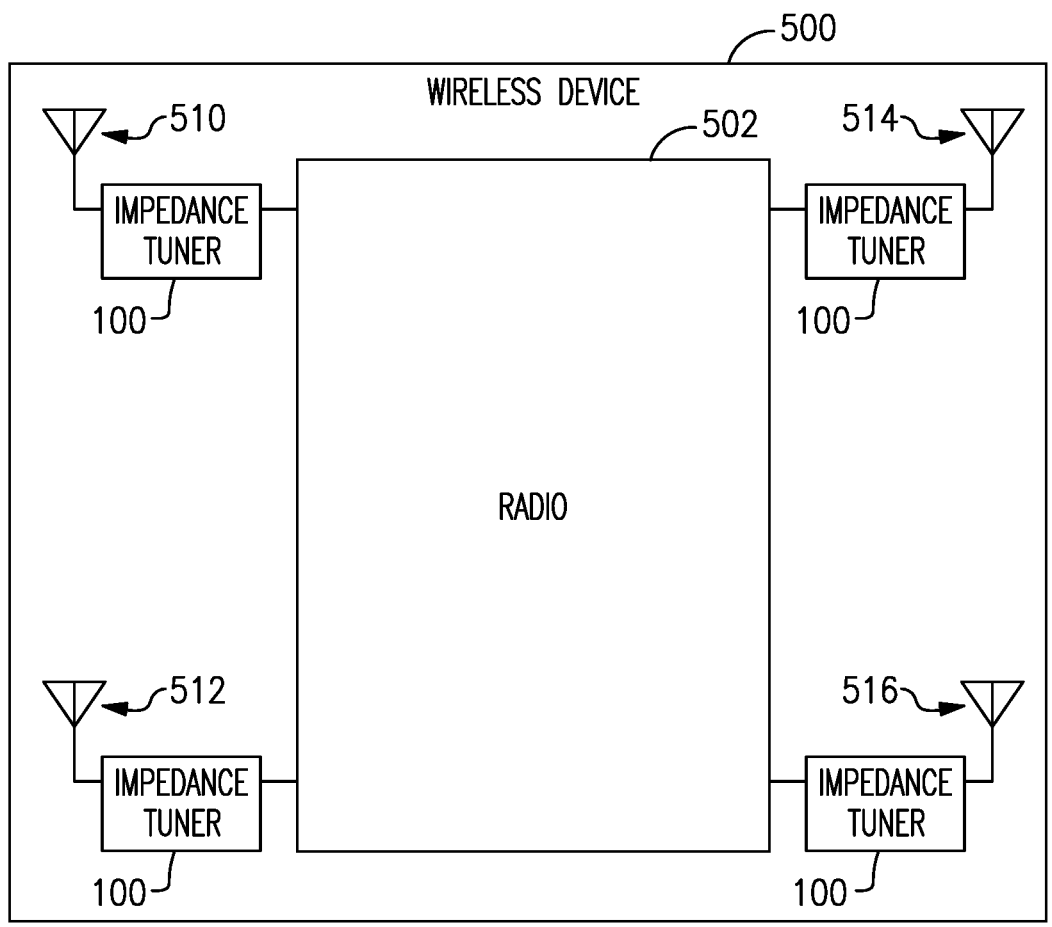
FIG. 47 shows an example wireless device having one or more antenna tuner circuits.

FIG. 47 shows that in some embodiments, a wireless device 500 can include one or more impedance tuners 100 having one or more features as described herein. Such a wireless device can include a radio 502 configured to provide transmit and/or receive functionalities. Such a radio can be coupled to one or more antennas, and some or all of such antenna(s) can be provided with an impedance tuner 100.

For example, in FIG. 47, the wireless device 500 is depicted as having four antenna 510, 512, 514, 516. Each of such antennas can be provided with a respective impedance tuner 100 having one or more features as described herein.

It will be understood that a wireless device can have more or less numbers of antennas. It will also be understood that in a wireless device having a plurality of antennas, not all of such antennas necessarily need to have associated impedance tuners.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An impedance tuner comprising:
   first and second nodes implemented to be between a radio circuit and an antenna;
   one or more switchable capacitance paths each implemented between the first node and the second node;
   a switchable shunt circuit configured to provide one or more capacitance values between the second node and ground; and
   a switchable inductance circuit including an inductance and a first switch in series between the first node and the second node, the switchable inductance circuit further including a second switch implemented between the ground and a node between the inductance and the first switch.

2. The impedance tuner of claim 1 wherein the inductance circuit is capable of providing a series inductance path between the first and second nodes or a shunt inductance path between the first node and the ground, by operation of the first and second switches.

3. The impedance tuner of claim 1 wherein the radio circuit includes a transmitter circuit, such that the first node is configured to be coupled to the transmitter circuit, and the second node is configured to be coupled to the antenna.

4. The impedance tuner of claim 3 wherein the inductance is connected to the first node, and the first switch is connected to the second node.

5. The impedance tuner of claim 3 wherein the inductance is implemented as an inductor.

6. The impedance tuner of claim 1 further including a switchable bypass path implemented between the first node and the second node.

7. The impedance tuner of claim 6 wherein the impedance tuner is capable of being operated with the inductance not being utilized as a series inductance or a shunt inductance, by opening each of the first and second switches of the switchable inductance circuit.

8. The impedance tuner of claim 6 wherein the impedance tuner is capable of being operated with the inductance being utilized as a series inductance, by closing the first switch of the switchable inductance circuit and opening the second switch of the switchable inductance circuit.

9. The impedance tuner of claim 6 wherein the impedance tuner is capable of being operated with the inductance being utilized as a shunt inductance, by opening the first switch of the switchable inductance circuit and closing the second switch of the switchable inductance circuit.

10. The impedance tuner of claim 1 wherein the switchable shunt circuit includes a plurality of switchable shunt paths each including a switch and a capacitance in series between the second node and the ground.

11. A method for impedance tuning, the method comprising:
    providing an inductance between first and second nodes between a radio circuit and an antenna; and
    operating first and second switches relative to the inductance to provide an impedance tuning state associated with the inductance not being utilized, the inductance being utilized as a series inductance, or the inductance being utilized as a shunt inductance.

12. The method of claim 11 wherein the operating of the first and second switches includes operating the first switch implemented between the inductance and the second node, and the second switch implemented between ground and a node between the inductance and the first switch.

13. The method of claim 12 wherein the operating of the first and second switches includes opening each of the first and second switches to provide the impedance tuning state where the inductance is not being utilized.

14. The method of claim 12 wherein the operating of the first and second switches includes closing the first switch and opening the second switch to provide the impedance tuning state where the inductance is being utilized as the series inductance.

15. The method of claim 12 wherein the operating of the first and second switches includes opening the first switch and closing the second switch to provide the impedance tuning state where the inductance is being utilized as the shunt inductance.

16. The method of claim 11 further comprising operating one or more capacitance paths between the first node and the second node to provide a capacitance value for some or all of the impedance tuning states associated with the inductance.

17. The method of claim 11 further comprising switchably connecting the first node and the second node to provide a bypass path for at least some of the impedance tuning states associated with the inductance.

18. Wireless device comprising:
    a radio circuit;
    an antenna; and
    an impedance tuner including first and second nodes implemented between the radio circuit and the antenna, one or more switchable capacitance paths each implemented between the first node and the second node, and a switchable shunt circuit configured to provide one or more capacitance values between the second node and ground, the impedance tuner further including a switchable inductance circuit including an inductance and a first switch in series between the first node and the second node, the switchable inductance circuit further including a second switch implemented between the ground and a node between the inductance and the first switch.

19. The wireless device of claim 18 wherein the radio circuit includes a transmitter circuit, such that the first node is coupled to the transmitter circuit, and the second node is coupled to the antenna.

20. The wireless device of claim 18 wherein the wireless device is configured to support either or both of a lowband frequency range and a 5 GHz WLAN frequency range.

* * * * *